US012660468B2

(12) United States Patent
Luo et al.

(10) Patent No.: US 12,660,468 B2
(45) Date of Patent: Jun. 16, 2026

(54) DISPLAY PANEL AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Chang Luo, Beijing (CN); Yuanqi Zhang, Beijing (CN); Yi Zhang, Beijing (CN); Yang Zeng, Beijing (CN); Shun Zhang, Beijing (CN); Ping Wen, Beijing (CN); Wei Wang, Beijing (CN); Yu Wang, Beijing (CN); Tianci Chen, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 163 days.

(21) Appl. No.: 18/689,978

(22) PCT Filed: May 31, 2022

(86) PCT No.: PCT/CN2022/096392
§ 371 (c)(1),
(2) Date: Mar. 7, 2024

(87) PCT Pub. No.: WO2023/230893
PCT Pub. Date: Dec. 7, 2023

(65) Prior Publication Data
US 2024/0268184 A1 Aug. 8, 2024

(51) Int. Cl.
*H10K 59/40* (2023.01)
*G06F 3/041* (2006.01)
*G06F 3/044* (2006.01)

(52) U.S. Cl.
CPC ............. *H10K 59/40* (2023.02); *G06F 3/041* (2013.01); *G06F 3/0412* (2013.01);
(Continued)

(58) Field of Classification Search
CPC ...... G06F 3/041; G06F 3/0412; G06F 3/0443; G06F 3/9445; G06F 3/0446;
(Continued)

(56) References Cited

U.S. PATENT DOCUMENTS

2019/0369787 A1* 12/2019 Park ...................... G06F 1/1684
2020/0173949 A1 6/2020 Lee et al.
(Continued)

FOREIGN PATENT DOCUMENTS

| CN | 109545085 A | 3/2019 |
| CN | 110007804 A | 7/2019 |

(Continued)

OTHER PUBLICATIONS

Extended European Search Report of EP application No. 22944230.6 dated Jan. 24, 2025.
(Continued)

*Primary Examiner* — Cory A Almeida
(74) *Attorney, Agent, or Firm* — Calfee, Halter & Griswold LLP

(57) ABSTRACT

A display panel, including a base substrate, a display layer, and a touch-control layer that are sequentially stacked; where a display region of the display panel is provided with a light-transmitting region; the touch-control layer is provided with a touch-control channel, the touch-control channel comprises a first signal channel extending along a first direction and a second signal channel extending along second direction, and the second direction is intersected with the first direction; where, the touch-control channel adjacent to the light-transmitting region is a heterogeneous touch- (Continued)

control channel, and at least one heterogeneous touch-control channel comprises a plurality of heterogeneous touch-control sub-channels adjacent to the light-transmitting region; and among the plurality of heterogeneous touch-control sub-channels of the heterogeneous touch-control channel, at least one of the heterogeneous touch-control sub-channels is kept continuous.

17 Claims, 25 Drawing Sheets

(52) U.S. Cl.
CPC .......... *G06F 3/0443* (2019.05); *G06F 3/0445* (2019.05); *G06F 3/0446* (2019.05); *G06F 2203/04111* (2013.01); *G06F 2203/04112* (2013.01)

(58) Field of Classification Search
CPC . G06F 2203/04111; G06F 2203/04112; H10K 59/40
See application file for complete search history.

(56) References Cited

U.S. PATENT DOCUMENTS

| | | |
|---|---|---|
| 2020/0381486 A1 | 12/2020 | Jeong et al. |
| 2021/0200364 A1 | 7/2021 | Won et al. |

FOREIGN PATENT DOCUMENTS

| | | |
|---|---|---|
| CN | 111984153 A | 11/2020 |
| CN | 215117062 U | 12/2021 |
| CN | 114201066 A | 3/2022 |
| WO | 2021184294 A1 | 9/2021 |

OTHER PUBLICATIONS

International Search Report of PCT application No. PCT/CN2022/096392 dated Jan. 3, 2023.
Written opinion of PCT application No. PCT/CN2022/096392 dated Jan. 3, 2023.

* cited by examiner

PNL

TSA    P1    DH

Tx    Tx    Tx    Tx    Tx

Rx

Rx

Rx

Rx

Rx

Rx

Rx

TxP/TxPA

TxPA ⎱
          ⎰ TxP
TxPB ⎱

Tx ⎱
      ⎰ TS
Rx ⎱

DV

TxPA ⎱
          ⎰ TxP
TxPB ⎱
RxP/RxPB
TxP/TxPB

P2

RxP/RxPA    RxPA    RxPB    RxB    RxPA    RxPB

RxP    RxP

TxPA  RxB  TxP  RxB  TxPA  TxPB  RxB  TxP  RxB  TxP  RxB  TxP  RxB  TxP  RxB  TxPB

TMB
TT ⎰ TMI
TMA
EE

TxB    TxB    TxB    TxB    TxB    TxB    TxB

DISPLAY PANEL AND DISPLAY APPARATUS

CROSS REFERENCE TO RELATED APPLICATIONS

The present disclosure is based upon International Application No. PCT/CN2022/096392, filed on May 31, 2022, and the entire contents of which are incorporated herein by reference.

TECHNICAL FIELD

The present disclosure relates to the field of display technology, and in particular, to a display panel and a display apparatus.

BACKGROUND

The display panel may implement touch control by using FMLOC (Flexible Multi-Layer On Cell) technology. However, when a dot screen technology or an under display camera technology are used in the display panel, the touch-control performance near the light-transmitting region is poor.

It should be noted that the information disclosed in the above background portion is only used to enhance the understanding of the background of the present disclosure, and therefore may include information that does not constitute related art known to those of ordinary skill in the art.

SUMMARY

The objective of the present disclosure is to overcome the defects in the related art, and provide a display panel and a display apparatus, to improve the touch-control performance of the light-transmitting region.

According to an aspect of the present disclosure, there is provided a display panel, including a base substrate, a display layer and a touch-control layer that are sequentially stacked, where a display region of the display panel is provided with a light-transmitting region;

the touch-control layer is provided with a touch-control channel, the touch-control channel includes a first signal channel extending along a first direction and a second signal channel extending along second direction, and the second direction is intersected with the first direction;

where, the touch-control channel adjacent to the light-transmitting region is a heterogeneous touch-control channel, and at least one heterogeneous touch-control channel includes a plurality of heterogeneous touch-control sub-channels adjacent to the light-transmitting region;

among the plurality of heterogeneous touch-control sub-channels of the heterogeneous touch-control channel, at least one of the heterogeneous touch-control sub-channels is kept continuous.

According to some embodiments of the present disclosure, the touch-control layer includes a first touch-control metal layer, a touch-control insulating layer and a second touch-control metal layer that are sequentially stacked on a side of the display layer away from the base substrate;

the first signal channel is provided with a plurality of first signal electrodes sequentially arranged along the first direction on the second touch-control metal layer; and two adjacent first signal electrodes are electrically connected to each other through a conductive structure located on the first touch-control metal layer or the second touch-control metal layer; and the second signal channel is provided with a plurality of second signal electrodes sequentially arranged along the second direction on the second touch-control metal layer; and two adjacent second signal electrodes are electrically connected to each other through a conductive structure located on the first touch-control metal layer or the second touch-control metal layer.

According to some embodiments of the present disclosure, various first signal channels and various second signal channels define more than one touch-control positioning region distributed in an array; a mutual capacitive capacitor is formed between the first signal channel and the second signal channel passing though the touch-control positioning region; and in a same touch-control positioning region, the display panel includes a first portion of a first signal electrode and a second portion of a first signal electrode respectively belonging to two adjacent first signal electrodes, and a first portion of a second signal electrode and a second portion of a second signal electrode respectively belonging to two adjacent second signal electrodes; the first portion of the first signal electrode and the second portion of the first signal electrode are electrically connected to each other, and the first portion of the second signal electrode and the second portion of the second signal electrode are electrically connected to each other.

According to some embodiments of the present disclosure, the touch-control positioning region intersected with the light-transmitting region is a heterogeneous touch-control positioning region;

in at least one heterogeneous touch-control positioning region, the first touch-control metal layer is provided with a bridging portion, the first portion of the first signal electrode includes at least two sub-electrodes, and at least one sub-electrode of the first portion of the first signal electrode is electrically connected to the second portion of the first signal electrode through the bridging portion;

and/or, in at least one heterogeneous touch-control positioning region, the first touch-control metal layer is provided with a bridging portion, the second portion of the first signal electrode includes at least two sub-electrodes, and at least one sub-electrode of the second portion of the first signal electrode is electrically connected to the first portion of the first signal electrode through the bridging portion.

According to some embodiments of the present disclosure, in at least one heterogeneous touch-control positioning region, the second touch-control metal layer is provided with a connecting portion and a third portion of a second signal electrode; along the second direction, the third portion of the second signal electrode is sandwiched between two adjacent sub-electrodes of the first portion of the first signal electrode or between two adjacent sub-electrodes of the second portion of the first signal electrode; and one of the first portion of the second signal electrode and the second portion of the second signal electrode is electrically connected to an adjacent third portion of the second signal electrode through the connecting portion; the other one of the first portion of the second signal electrode and the second portion of the second signal electrode is electrically connected to an adjacent third portion of the second signal electrode through a conductive structure located on the first touch-control metal layer or the second touch-control metal layer.

According to some embodiments of the present disclosure, the touch-control positioning region intersected with the light-transmitting region is a heterogeneous touch-control positioning region;

in at least one heterogeneous touch-control positioning region, the second touch-control metal layer is provided with a connecting portion, the first portion of the second signal electrode includes at least two sub-electrodes, and at least one sub-electrode of the first portion of the second signal electrode is electrically connected to the second portion of the second signal electrode through the connecting portion;

and/or, in at least one heterogeneous touch-control positioning region, the second touch-control metal layer is provided with a connecting portion, the second portion of the second signal electrode includes at least two sub-electrodes, and at least one sub-electrode of the second portion of the second signal electrode is electrically connected to the first portion of the second signal electrode through the connecting portion.

According to some embodiments of the present disclosure, in at least one heterogeneous touch-control positioning region, the second touch-control metal layer is further provided with a third portion of a first signal electrode, and the first touch-control metal layer is provided with a bridging portion; along the first direction, the third portion of the first signal electrode is sandwiched between two adjacent sub-electrodes of the first portion of the second signal electrode or between two adjacent sub-electrodes of the second portion of the second signal electrode;

one of the second portion and the first portion of the first signal electrode is electrically connected to an adjacent third portion of the first signal electrode through the bridging portion; the other one of the second portion and the first portion of the first signal electrode is electrically connected to an adjacent third portion of the second signal electrode through a conductive structure located on the first touch-control metal layer or the second touch-control metal layer.

According to some embodiments of the present disclosure, the touch-control positioning region intersected with the light-transmitting region is a heterogeneous touch-control positioning region;

in at least one heterogeneous touch-control positioning region, the first portion of the second signal electrode includes a plurality of sub-electrodes, or the second portion of the second signal electrode includes a plurality of sub-electrodes; the first portion of the first signal electrode includes a plurality of sub-electrodes, or the second portion of the first signal electrode includes a plurality of sub-electrodes; the second touch-control metal layer is provided with a third portion of a second signal electrode and a third portion of a first signal electrode, and the first touch-control metal layer is provided with a plurality of bridging portions;

the third portion of the first signal electrode is connected to the first portion of the first signal electrode and the second portion of the first signal electrode through different bridging portions; and the second portion of the second signal electrode and the first portion of the second signal electrode are connected to each other through the third portion of the second signal electrode.

According to some embodiments of the present disclosure, the touch-control positioning region intersected with the light-transmitting region is a heterogeneous touch-control positioning region;

in at least one heterogeneous touch-control positioning region, the first portion of the second signal electrode includes a plurality of sub-electrodes, or the second portion of the second signal electrode includes a plurality of sub-electrodes; the first portion of the first signal electrode includes a plurality of sub-electrodes, or the second portion of the first signal electrode includes a plurality of sub-electrodes; and the second touch-control metal layer is provided with a third portion of a second signal electrode, a third portion of a first signal electrode and a plurality of connecting portions;

the third portion of the second signal electrode is connected to the first portion of the second signal electrode and the second portion of the second signal electrode through different connecting portions; and the first portion of the first signal electrode and the second portion of the first signal electrode are connected to each other through the third portion of the first signal electrode.

According to some embodiments of the present disclosure, the touch-control positioning region intersected with the light-transmitting region is a heterogeneous touch-control positioning region;

at least one first signal channel includes a first signal sub-channel located in two heterogeneous touch-control positioning regions adjacent along the first direction; the first signal sub-channel includes a bridging portion located on the first touch-control metal layer, and a relative position of the bridging portion in respectively located heterogeneous touch-control positioning region is different.

According to some embodiments of the present disclosure, a distribution trajectory of various bridging portions of at least one first signal sub-channel is not parallel to the first direction.

According to some embodiments of the present disclosure, the touch-control positioning region intersected with the light-transmitting region is a heterogeneous touch-control positioning region;

at least one second signal channel includes a second signal sub-channel located in two heterogeneous touch-control positioning regions adjacent along the second direction; and the second signal sub-channel includes a connecting portion located on the second touch-control metal layer, and a relative position of the connecting portion in respectively located heterogeneous touch-control positioning region is different.

According to some embodiments of the present disclosure, a distribution trajectory of various connecting portions of at least one second signal sub-channel is not parallel to the second direction.

According to some embodiments of the present disclosure, the touch-control positioning region intersected with the light-transmitting region is a heterogeneous touch-control positioning region;

in at least one heterogeneous touch-control positioning region, the first signal channel includes a plurality of first signal sub-channels; and along the first direction, there is a second signal channel spaced apart between the light-transmitting region and an end portion of at least one of the first signal sub-channels close to the light-transmitting region.

According to some embodiments of the present disclosure, the touch-control positioning region not intersected with the light transmitting region is a normal touch-control positioning region;

in the normal touch-control positioning region, the first touch-control metal layer is provided with a bridging portion, and the first portion of the first signal electrode and the second portion of the first signal electrode are electrically connected to each other through the bridging portion;

in the normal touch-control positioning region, the second touch-control metal layer is provided with a connecting portion, and the first portion of the second signal electrode and the second portion of the second signal electrode are electrically connected to each other through the connecting portion.

According to some embodiments of the present disclosure, in the normal touch-control positioning region, a number of the first portion of the first signal electrode, a number of the second portion of the first signal electrode, and a number of the bridging portions are one; and a number of the first portion of the second signal electrode, a number of the second portion of the second signal electrode, and a number of the connecting portion are one.

According to some embodiments of the present disclosure, in at least part of the normal touch-control positioning region, a number of the bridging portion is more than one, the first portion of the first signal electrode includes sub-electrodes in one-to-one correspondence with more than one bridging portion, and the second portion of the first signal electrode includes sub-electrodes in one-to-one correspondence with more than one bridging portion; and the bridging portion is electrically connected to a corresponding sub-electrode of the first portion of the first signal electrode and a corresponding sub-electrode of the second portion of the first signal electrode;

in at least part of the normal touch-control positioning region, the second touch-control metal layer further includes a third portion of a second signal electrode; and along the second direction, the third portion of the second signal electrode is located between adjacent sub-electrodes of the first portion of the first signal electrode, the third portion of the second signal electrode is connected to the first portion of the second signal electrode and the second portion of the second signal electrode through different connecting portions.

According to some embodiments of the present disclosure, in at least part of the normal touch-control positioning region, a number of the connecting portion is more than one, the first portion of the second signal electrode includes sub-electrodes in one-to-one correspondence with more than one connecting portion, and the second portion of the second signal electrode includes sub-electrodes in one-to-one correspondence with more than one connecting portion; the connecting portion is electrically connected to a corresponding sub-electrode of the first portion of the second signal electrode and a corresponding sub-electrode of the second portion of the second signal electrode;

in at least part of the normal touch-control positioning region, the second touch-control metal layer further includes a third portion of a first signal electrode; along the second direction, the third portion of the first signal electrode is located between adjacent sub-electrodes of the first portion of the second signal electrode, and the third portion of the first signal electrode is connected to the first portion of the first signal electrode and the second portion of the first signal electrode through different bridging portions.

According to some embodiments of the present disclosure, the light-transmitting region is intersected with four touch-control positioning regions, and the four touch-control positioning regions are distributed in two rows and two columns.

According to another aspect of the present disclosure, there is a display apparatus, including the above display panel.

It should be understood that the above general description and the following detailed description are merely exemplary and explanatory, and cannot limit the present disclosure.

BRIEF DESCRIPTION OF THE DRAWINGS

The accompanying drawings, which are incorporated in and constitute a part of the description, illustrate embodiments consistent with the present disclosure and together with the description serve to explain the principles of the present disclosure. Obviously, the drawings in the following description are some embodiments of the present disclosure, and for those of ordinary skill in the art, other drawings can also be obtained from these drawings without creative efforts.

FIG. 12-1 is a schematic diagram of influence of a light-transmitting region on a touch-control layer in the related art.

FIG. 12-2 is a schematic diagram of a local structure of a portion of a touch-control layer adjacent to a light-transmitting region in the related art.

FIG. 14-1 is a schematic diagram of a design principle of a local structure of a touch-control layer in some embodiments of the present disclosure.

FIG. 14-2 is a schematic diagram of a local structure of a touch-control layer according to some embodiments of the present disclosure.

FIG. 15-1 is a schematic diagram of a design principle of a local structure of a touch-control layer according to some embodiments of the present disclosure.

FIG. 15-2 is a schematic diagram of a local structure of a touch-control layer according to some embodiments of the present disclosure.

FIG. 16-1 is a schematic diagram of a design principle of a local structure of a touch-control layer according to some embodiments of the present disclosure.

FIG. 16-2 is a schematic diagram of a local structure of a touch-control layer according to some embodiments of the present disclosure.

Figure 1:
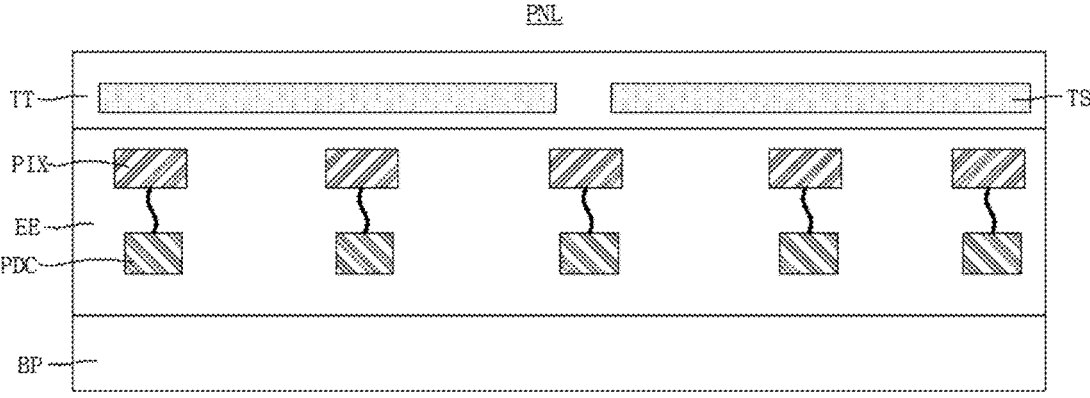
FIG. 1 is a schematic diagram of an overall structure of a display panel according to some embodiments of the present disclosure.

The meaning of at least part of the symbols used in the drawings is as follows:

AA, Display region. AA1, Light-transmitting region. AA2, Main display region. BB, Peripheral region. B1, Binding region. DH, Second direction. DV, First direction. BP, Base substrate. PNL, Display panel. TRW, Transfer wiring. PDC, Pixel driving circuit. EE, Display layer. TT, Touch layer. TMA, First touch-control metal layer. TMB, Second touch-control metal layer. TMI, Touch insulating layer. TS, touch-control channel. TSA, Touch positioning region. Tx, First signal channel. TxB, Bridging portion. TxP, First signal electrode. TxPA, First portion of a first signal electrode. TxPB, Second portion of a first signal electrode. TxPC, Third portion of a first signal electrode. SubTx, First signal sub-channel. SubTxPA, Sub-electrode of a first portion of a first signal electrode. SubTxPB, Sub-electrode of a second portion of a first signal electrode. Rx, Second signal channel. RxB, Connecting portion. RxP, Second signal electrode. RxPA, First portion of a second signal electrode. RxPB, Second portion of a second signal electrode. RxPC, Third portion of a second signal electrode. SubRx, Second signal sub-channel. SubRxPA, Sub-electrode of a first portion of a second signal electrode. SubRxPB, Sub-electrode of a second portion of a second signal electrode. MTS, Heterogeneous touch-control channel. NTS, Normal touch-control channel. SubMTS, Heterogeneous touch-control sub-channel. MTSA, Heterogeneous touch-control positioning region. NTSA, Normal touch-control positioning region.

DETAILED DESCRIPTION

Example embodiments will now be described more fully with reference to the accompanying drawings. Example embodiments, however, can be implemented in various forms and should not be construed as limited to the embodiments set forth here; by contrast, these embodiments are provided so that the present disclosure will be thorough and complete, and will fully convey the concept of example embodiments to those skilled in the art. The same reference numerals in the drawings denote the same or similar structures, and thus their detailed descriptions will be omitted. In addition, the drawings are merely schematic illustrations of the present disclosure, and are not necessarily drawn to scale.

Although relative terms such as "upper" and "lower" are used in the description to describe the relative relationship of a component to another component illustrated in the drawings, these terms are used in the description for convenience only, for example, according to the example direction described in the drawings. It will be appreciated that if the apparatus illustrated in the drawings is turned upside down, an "upper" component will become a "lower" component. When a structure is "on" another structure, it may refer to that a structure is integrally formed on another structure, or that a structure is "directly" provided on another structure, or that a structure is "indirectly" provided on another structure through other structures.

The terms "a", "an", "the", "said" and "at least one" are used to represent that there are one or more elements/components/etc. The terms "including" and "having" are used to represent open inclusive meaning, and refer to that additional elements/components/or the like may also be present in addition to the listed elements/components/etc. The terms "first", "second", "third", or the like are only used as markers, and are not limitation to the number of the object thereof.

Referring to FIG. 1, according to the present disclosure, there is provided a display panel PNL, including a base substrate BP, a display layer EE, and a touch-control layer TT that are sequentially stacked. Among them, the display layer EE is provided with sub-pixels PIX for display and pixel driving circuits PDC for driving the sub-pixel PIX; and the touch-control layer TT is provided with a touch-control channel TS for implementing touch control.

In some embodiments of the present disclosure, the base substrate BP may be a base substrate BP of an inorganic material, or may be a base substrate BP of an organic material. For example, in some embodiments of the present disclosure, the material of the base substrate BP may be a glass material such as soda-lime glass, quartz glass, and sapphire glass, or may be a metal material such as stainless steel, aluminum, nickel, etc. In another embodiment of the present disclosure, the material of the base substrate BP may be polymethyl methacrylate (PMMA), polyvinyl alcohol (PVA), polyvinyl phenol (PVP), polyether sulfone (PES), polyimide, polyamide, polyacetal, poly carbonate (PC), polyethylene terephthalate (PET), polyethylene naphthalate (PEN), or a combination of the foregoing. In another embodiment of the present disclosure, the base substrate BP may also be a flexible base substrate BP; for example, the material of the base substrate BP may be polyimide (PI). The base substrate BP may also be a composite of a plurality of layers of materials; for example, in some embodiments of the present disclosure, the base substrate BP may include a bottom film layer, a pressure-sensitive adhesive layer, a first polyimide layer, and a second polyimide layer that are sequentially stacked.

In the present disclosure, the sub-pixels of the display layer EE may be self-luminous sub-pixels, or may be optical switches for controlling light passing through.

For example, in some embodiments of the present disclosure, the display layer EE includes an array substrate and a color film substrate provided in a cell alignment manner, and includes a liquid crystal layer located between the array substrate and the color film substrate, where the base substrate BP may be reused as a portion of the array substrate. Among them, the array substrate is provided with pixel driving circuits PDC for driving the sub-pixels and pixel electrodes electrically connected to the pixel driving circuits PDC; the pixel electrode, the liquid crystal layer and the common electrode form an optical switch as a sub-pixel, and the common electrode may be provided on the array substrate or the color film substrate. In this way, the display panel PNL may be a liquid crystal display panel. The pixel driving circuit PDC can control the voltage on the pixel electrode, so that the electric field between the pixel electrode and the common electrode is controlled to change; and under the control of the electric field between the pixel electrode and the common electrode, the direction and degree of deflection or lodging of the liquid crystal can be changed, so that the polarization direction of light transmitting at the liquid crystal is controlled to change. In the display apparatus using the display panel PNL, by providing a polarizer matched with the display panel PNL, the change of the polarization direction of light is finally presented as the change of the light transmittance.

Figure 2:
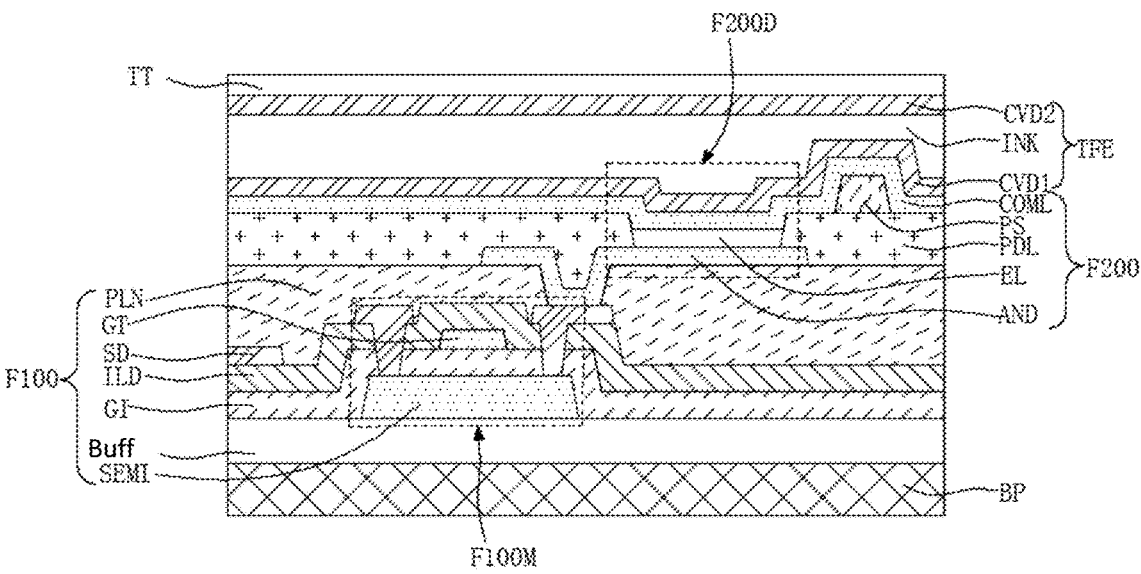
FIG. 2 is a schematic diagram of a local structure of a display panel according to some embodiments of the present disclosure.

For another example, in another embodiment, referring to FIG. 2, the display layer EE includes a driving circuit layer F100 and a pixel layer F200 sequentially stacked on a side of the base substrate BP. The pixel layer F200 is provided with self-luminous light-emitting elements as sub-pixels. The driving circuit layer F100 is provided with pixel driving circuits PDC for driving the sub-pixels.

The driving circuit layer F100 is provided with pixel driving circuits for driving the sub-pixels. In the driving circuit layer F100, any pixel driving circuit may include a transistor F100M and a storage capacitor. Furthermore, the transistor F100M may be a thin film transistor; the thin film transistor may be selected from a top gate type thin film transistor, a bottom gate type thin film transistor or a double-gate thin film transistor; the active layer of the thin film transistor may be of an amorphous silicon semiconductor material, a low temperature polysilicon semiconductor material, a metal oxide semiconductor material, an organic semiconductor material, or another type of semiconductor material; and the thin film transistor may be an N-type thin film transistor or a P-type thin film transistor.

It can be understood that types of any two transistors among various transistors in the pixel driving circuit may be the same or different. For example, in some embodiments, in a pixel driving circuit, some transistors may be N-type transistors, and some transistors may be P-type transistors. For another example, in another embodiment of the present disclosure, in a pixel driving circuit, the material of the active layer of some transistors may be a low-temperature polycrystalline silicon semiconductor material, and the material of the active layer of some transistors may be a metal oxide semiconductor material. In some embodiments of the present disclosure, a thin film transistor is a low-temperature polysilicon transistor. In some other embodiments of the present disclosure, some thin film transistors are low-temperature polysilicon transistors, and some thin film transistors are metal oxide transistors.

In some embodiments, the driving circuit layer F100 may include a semiconductor layer SEMI, a gate insulating layer GI, a gate layer GT, an interlayer dielectric layer ILD, a source-drain metal layer SD, and the like, which are stacked between the base substrate BP and the pixel layer F200. Each of the thin film transistor and the storage capacitor may be formed by a semiconductor layer SEMI, a gate insulating layer GI, a gate layer GT, an interlayer dielectric layer ILD, a source-drain metal layer SD, and other film layers. Among them, the position relationship of each film layer may be determined according to the film layer structure of the thin film transistor. Furthermore, the semiconductor layer SEMI may be used to form a channel region of the transistor; the gate layer may be used to form gate layer wirings such as a scanning wiring, a reset control wiring, and a light-emitting control wiring, or may be used to form a gate of the transistor, or may be used to form a part or all of the electrode plates of the storage capacitor; and the source-drain metal layer may be used to form source-drain metal layer wirings such as a data voltage wiring, a driving voltage wiring, and the like, or may be used to form a part of the electrode plates of the storage capacitor.

In an example, the driving circuit layer F100 may include a semiconductor layer SEMI, a gate insulating layer GI, a gate layer GT, an interlayer dielectric layer ILD, and a source-drain metal layer SD that are stacked in sequence. The thin film transistor formed in this way, is a top-gate type thin film transistor.

In another example, the driving circuit layer F100 may include a gate layer GT, a gate insulating layer GI, a semiconductor layer SEMI, an interlayer dielectric layer ILD, and a source-drain metal layer SD that are stacked in sequence. The thin film transistor formed in this way, is a bottom gate type thin film transistor.

In the display panel PNL according to the embodiments of the present disclosure, the gate layer may be provided as one layer, or may be provided as two or three layers according to requirements. In an example, the gate layer GT may include a first gate layer and a second gate layer; and the gate insulating layer GI may include a first gate insulating layer for isolating the semiconductor layer SEMI and the first gate layer, and include a second gate insulating layer for isolating the first gate layer and the second gate layer. For example, the driving circuit layer F100 may include a semiconductor layer SEMI, a first gate insulating layer, a first gate layer, a second gate insulating layer, a second gate layer, an interlayer dielectric layer ILD, and a source-drain metal layer SD that are sequentially stacked on a side of the base substrate BP. In an example, the gate layer GT may include a first gate layer and a second gate layer, and the semiconductor layer SEMI may be sandwiched between the first gate layer and the second gate layer; the gate insulating layer GI may include a first gate insulating layer for isolating the semiconductor layer SEMI and the first gate layer, and include a second gate insulating layer for isolating the second gate layer and the semiconductor layer SEMI. For example, the driving circuit layer F100 may include a first gate layer, a first gate insulating layer, a semiconductor layer SEMI, a second gate insulating layer, a second gate layer, an interlayer dielectric layer ILD, and a source-drain metal layer SD that are sequentially stacked on a side of the base substrate BP. In this way, a transistor with a dual gate structure may be formed. In an example, the semiconductor layer SEMI may include a low temperature polysilicon semiconductor layer and a metal oxide semiconductor layer; the gate layer includes a first gate layer and a second gate layer; and the gate insulating layer includes a first gate insulating layer and a second gate insulating layer. The driving circuit layer F100 may include a low-temperature polysilicon semiconductor layer, a first gate insulating layer, a first gate layer, a metal oxide semiconductor layer, a second gate insulating layer, a second gate layer, an interlayer dielectric layer ILD, and a source-drain metal layer SD that are sequentially stacked on a side of the base substrate BP; and an insulating layer may be provided between these film layers. In an example, the semiconductor layer SEMI may include a low temperature polysilicon semiconductor layer and a metal oxide semiconductor layer; the gate layer includes first to third gate layers, and the gate insulating layer includes first to third gate insulating layers. The driving circuit layer F100 may include a low-temperature polysilicon semiconductor layer, a first gate insulating layer, a first gate layer, an insulating buffer layer, a second gate layer, a second gate insulating layer, a metal oxide semiconductor layer, a third gate insulating layer, a third gate layer, an interlayer dielectric layer ILD, and a source-drain metal layer SD that are sequentially stacked on a side of the base substrate BP.

In the display panel PNL according to the embodiments of the present disclosure, the source-drain metal layer may be provided as one layer, or may be provided as two or three layers according to requirements. In an example, the source-drain metal layer may include a first source-drain metal layer and a second source-drain metal layer that are sequentially stacked on a side of the interlayer dielectric layer ILD away from the base substrate; and an insulating layer may be sandwiched between the first source-drain metal layer and the second source-drain metal layer, for example, a passivation layer and/or a planarization layer is sandwiched therebetween. In another example, the source-drain metal layer may include a first source-drain metal layer, a second source-drain metal layer, and a third source-drain metal layer that are sequentially stacked on a side of the interlayer dielectric layer ILD away from the base substrate; an insulating layer may be sandwiched between the first source-drain metal layer and the second source-drain metal layer, for example, a passivation layer and/or a resin layer is sandwiched therebetween; and an insulating layer may be sandwiched between the second source-drain metal layer and the third source-drain metal layer, for example, a passivation layer and/or a planarization layer may be sandwiched therebetween.

In some embodiments, the driving circuit layer F100 may further include a passivation layer, and the passivation layer may be provided on a surface of the source-drain metal layer SD away from the base substrate BP, so as to protect the source-drain metal layer SD.

In some embodiments, the driving circuit layer F100 may further include a buffer material layer Buff provided between the base substrate BP and the semiconductor layer SEMI; and the semiconductor layer SEMI, the gate layer GT, and the like are all located on the side of the buffer material layer away from the base substrate BP. The material of the buffer material layer may be an inorganic insulating material such as silicon oxide and silicon nitride. The buffer material layer may be an inorganic material layer of one layer, or may be an inorganic material layer of multiple layers stacked.

In some embodiments, the driving circuit layer F100 may further include a planarization layer PLN located between the source-drain metal layer SD and the pixel layer F200, and the planarization layer PLN may provide a planarization surface for the pixel electrodes. In some embodiments, the material of the planarization layer PLN may be an organic material.

The pixel layer F200 may be provided with light-emitting elements electrically connected to the pixel driving circuits correspondingly, and the light-emitting element may be used as a sub-pixel of the display panel. In this way, the pixel layer is provided with light-emitting elements distributed in an array, and each light-emitting element emits light under the control of the pixel driving circuit. In the present disclosure, the light-emitting element may be an organic light-emitting diode (OLED), a polymer organic light-emitting diode (PLED), a micro light-emitting diode (Micro LED), a quantum dot-organic light-emitting diode (QD-OLED), a quantum dot light-emitting diode (QLED), or other types of light-emitting elements. For example, the light-emitting element is an organic light-emitting diode (OLED), and the display panel is an OLED display panel. By taking that the light-emitting element is an organic light-emitting diode as an example, an example introduction of a feasible structure of the pixel layer is as follows.

In this example, the pixel layer F200 may be provided on a side of the driving circuit layer F200 away from the base substrate F100, and may include a pixel electrode layer AND, a pixel definition layer PDL, a supporting pillar layer PS, an organic light-emitting function layer EL, and a common electrode layer COML that are sequentially stacked. Among them, the pixel electrode layer AND is provided with a plurality of pixel electrodes on a display region of the display panel; the pixel definition layer PDL is provided in the display region with a plurality of through pixel openings in one-to-one correspondence with the plurality of pixel electrodes, and any one of the pixel openings exposes at least part of the region of the corresponding pixel electrode. The supporting pillar layer PS includes a plurality of supporting pillars in the display region, and the supporting pillars are located on a surface of the pixel definition layer PDL away from the base substrate F100, so as to support the fine metal mask (FMM) in the evaporation process. The organic light-emitting function layer EL at least covers the pixel electrode exposed by the pixel definition layer PDL. Among them, the organic light-emitting function layer EL may include an organic electroluminescence material layer, and may include one or more of a hole injection layer, a hole transport layer, an electron barrier layer, a hole barrier layer, an electron transport layer, and an electron injection layer. Each film layer of the organic light-emitting function layer EL may be prepared by means of an evaporation process, and the pattern of each film layer may be defined by using a fine metal mask or an open mask during evaporation. The common electrode layer COML may cover the organic light-emitting function layer EL in the display region. In this way, the pixel electrode, the common electrode layer COML, and the organic light-emitting function layer EL located between the pixel electrode and the common electrode layer COML form the organic light-emitting diode F200D, and any organic light-emitting diode may be used as a sub-pixel of the display panel.

In some embodiments, the pixel layer F200 may further include a light extraction layer located on the side of the common electrode layer COML away from the base substrate F100, so as to enhance the light-extraction efficiency of the organic light-emitting diode.

In some embodiments, the display layer EE may further include a thin film encapsulation layer TFE. The thin film encapsulation layer TFE is provided on a surface of the pixel layer F200 away from the base substrate F100, and may include an inorganic encapsulation layer and an organic encapsulation layer that are alternately stacked. A touch-control layer TT is provided on a side of the thin film encapsulation layer TFE away from the base substrate BP. Among them, the inorganic encapsulation layer can effectively separate external moisture and oxygen, so as to avoid material degradation caused by intrusion of water and oxygen into the organic light-emitting function layer EL. In some embodiments, an edge of the inorganic encapsulation layer may be located in a peripheral region. The organic encapsulation layer is located between two adjacent inorganic encapsulation layers, so as to achieve planarization and reduce the stress between the inorganic encapsulation layers. Among them, an edge of the organic encapsulation layer may be located between an edge of the display region and an edge of the inorganic encapsulation layer. For example, the thin film encapsulation layer TFE includes a first inorganic encapsulation layer CVD1, an organic encapsulation layer INK, and a second inorganic encapsulation layer CVD2 that are sequentially stacked on a side of the pixel layer F200 away from the base substrate F100.

Figure 3:
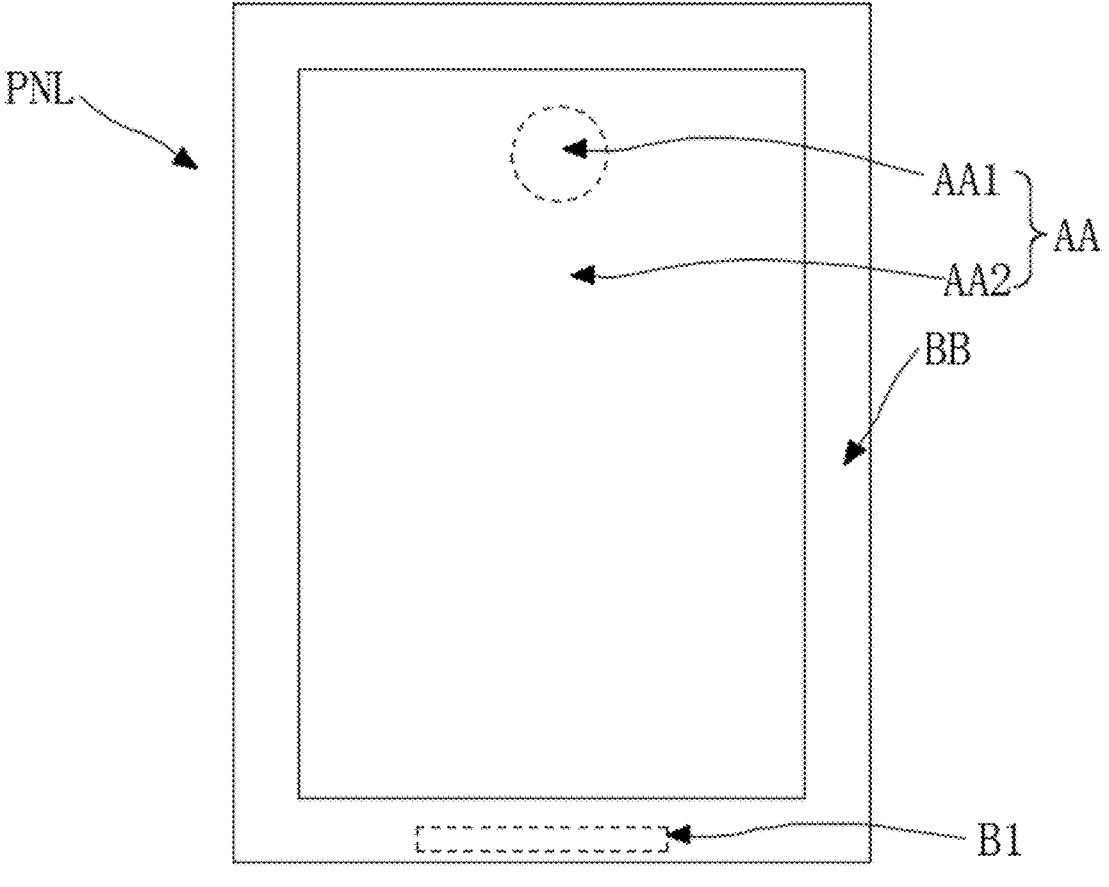
FIG. 3 is a schematic diagram of an overall structure of a display panel according to some embodiments of the present disclosure.

FIG. 3 is a top view structure diagram of a display panel PNL according to some embodiments of the present disclosure. Referring to FIG. 3, the display panel PNL may include a display region AA and a peripheral region BB surrounding the display region AA. Among them, the display region AA may include a main display region AA2 and at least one light-transmitting region AA1 on a side of the main display region AA2. The light transmittance of the light-transmitting region AA1 is greater than the light transmittance of the main display region AA2. For example, the main display region AA2 surrounds the light-transmitting region AA1.

Figure 4:
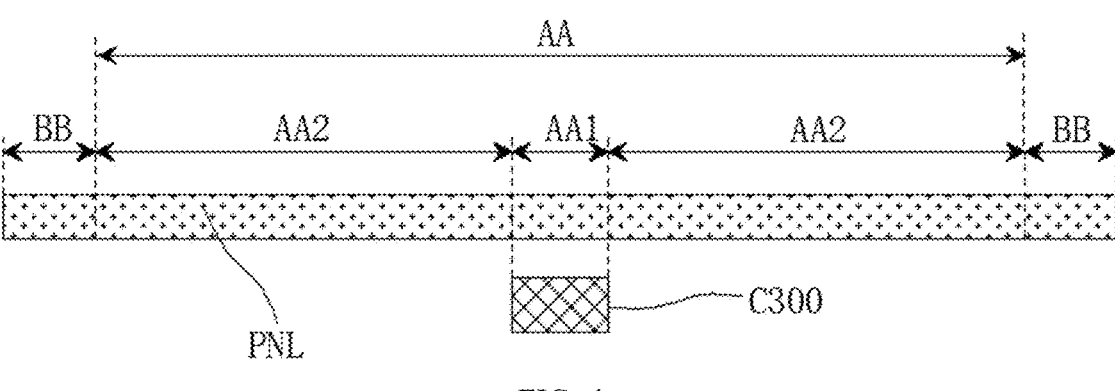
FIG. 4 is a schematic diagram of a structure of a display apparatus according to some embodiments of the present disclosure.
Figures 5, 6:
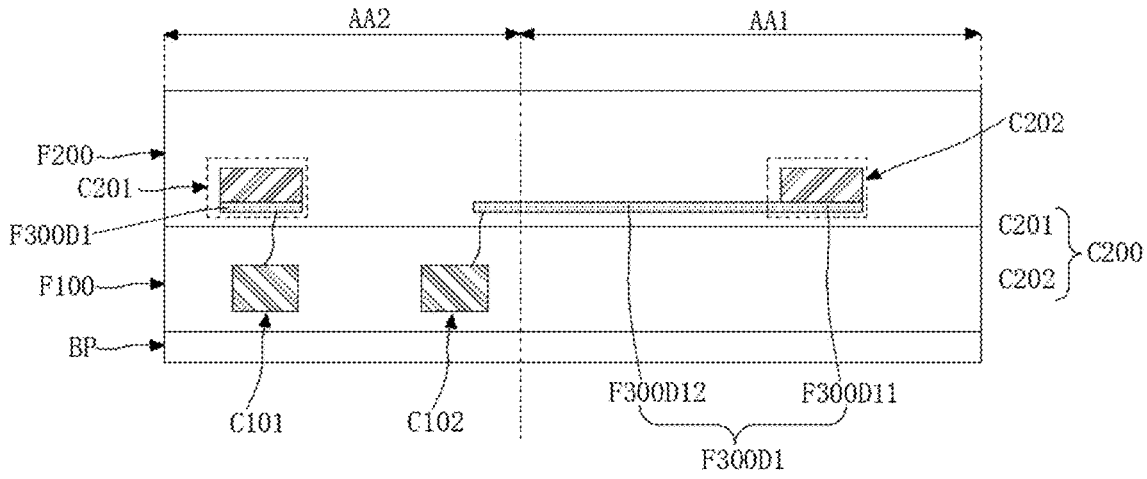
FIG. 5 is a schematic diagram of a local structure of a display panel according to some embodiments of the present disclosure.
FIG. 6 is a schematic diagram of a structure of a display apparatus according to some embodiments of the present disclosure.

Referring to FIG. 4 and FIG. 6, the display apparatus using the display panel PNL may include at least one light-sensitive component C300. Among them, the light-sensitive component C300 may be provided in one-to-one correspondence with the light-transmitting region AA1, and the light-sensitive component C300 may directly face the corresponding light-transmitting region AA1 so as to receive light transmitted from the light-transmitting region AA1. The light-sensitive component C300 may be provided with a light-sensitive region for sensing light, and an orthographic projection of the light-sensitive region on the base substrate BP may be located within the light-transmitting region AA1. The light-sensitive component C300 may be one or more light sensors, for example, may be a camera, an optical fingerprint recognition chip, a light intensity sensor, etc. In some embodiments, the light-sensitive component C300 may be a camera, for example, may be a charge coupled device (CCD) camera.

In some embodiments, referring to FIG. 3, the light-transmitting region AA1 may be embedded in the main display region AA2, that is, the main display region AA2 surrounds the light-transmitting region AA1. When the number of the light-transmitting regions AA1 is more than one, the light-transmitting regions AA1 may be provided dispersedly or may be provided adjacent to each other. Certainly, in other embodiments of the present disclosure, the light-transmitting region AA1 may also be located on a side of the main display region AA2; for example, the edge of the light-transmitting region AA1 may be partially overlapped with the inner edge of the peripheral region BB, so that the light-transmitting region AA1 is provided at the edge position of the display region AA.

In some embodiments, the shape of any one of the light-transmitting regions AA1 may be a circle, a rectangle with semicircles (in which a rectangle is in the middle with two semicircles at two ends), a square, a diamond, a regular hexagon, or other shapes. In some embodiments of the present disclosure, the shape of the light-transmitting region AA1 may be a circle, or a rectangle with semicircles.

The number of the light-transmitting region AA1 may be one, or may be more than one, as long as to satisfy the configuration of the light-sensitive component C300. In an example, the number of the light-transmitting region AA1 is one. In this way, the display apparatus may be provided with one light-sensitive component C300; for example, a camera or an optical fingerprint recognition chip may be provided. In another example, the number of the light-transmitting region AA1 is more than one. In this way, the display apparatus may be provided with a plurality of light-sensitive components C300, and any two light-sensitive components C300 may be the same or different. For example, the number of the light-transmitting region AA1 is three, and they are provided adjacent to each other. In this way, the display apparatus may be provided with different light-sensitive components C300 in one-to-one correspondence with the three light-transmitting regions AA1, for example, may be provided with three different light-sensitive components C300 of an imaging camera, a deep-view camera and an infrared camera.

In the embodiments of the present disclosure, different technologies may be used to ensure the light-transmitting performance of the light-transmitting region AA1; for example, a dot screen technology may be used, or an under display camera technology may be used.

For example, in some embodiments of the present disclosure, referring to FIG. 4 and FIG. 5, the pixel layer F200 may be provided with light-emitting elements C200 both in the main display region AA2 and the light-transmitting region AA1, so that picture display may be implemented both in the main display region AA2 and the light-transmitting region AA1. By providing with a camera at the light-transmitting region AA1, the display apparatus can implement under display camera shooting, and the screen-to-body ratio of the display apparatus is improved.

Referring to FIG. 5, in an example, the display panel PNL may not be provided with the pixel driving circuit C100 in the light-transmitting region AA1, so as to reduce the influence of the pixel driving circuit C100 on the light transmittance and improve the light transmittance of the light-transmitting region AA1. The pixel driving circuit C100 of each light-emitting element C200 located in the light-transmitting region AA1 may be provided within the main display region AA2. Furthermore, the pixel electrode F300D1 of each light-emitting element C200 located in the light-transmitting region AA1 includes an electrode body F300D11 and an electrode extension wiring F300D12 connected to each other. Among them, the electrode body F300D11 is located within the light-transmitting region AA1 and used as a cathode or an anode of the light-emitting element C200; and the electrode extension wiring F300D12 is provided in the main display region AA2 and the light-transmitting region AA1, one end of electrode extension wiring F300D12 is connected to the electrode body F300D11, and the other end of electrode extension wiring F300D12 is electrically connected to the pixel driving circuit C100 corresponding to the light-emitting element C200. Furthermore, the electrode extension wiring F300D12 may be made of a transparent conductive material, for example, a lens metal oxide (such as indium tin oxide). The material of the electrode extension wiring F300D12 may also be the same as the material of the electrode body F300D11, and the electrode extension wiring F300D12 may be provided in the same layer as the electrode body F300D11, so that the electrode extension wiring F300D12 and the electrode body F300D11 may be prepared in the same process.

In other words, in this example, the light-emitting element C200 in the display panel PNL according to the embodiment of the present disclosure may be classified as a first light-emitting element C201 located in the main display region AA2 or a second light-emitting element C202 located in the light-transmitting region AA1 according to the position where the light-emitting element C200 is located. The pixel driving circuit C100 in the display panel PNL of the present disclosure may be classified as a first pixel driving circuit C101 for driving the first light-emitting element C201 or a second pixel driving circuit C102 for driving the second light-emitting element C202 according to the light-emitting element C200 driven by the pixel driving circuit C100. Among them, the output end of the first pixel driving circuit C101 is electrically connected to the pixel electrode F300D1 of the first light-emitting element C201, and the output end of the second pixel driving circuit C102 is electrically connected to the electrode extension wiring F300D12 of the pixel electrode F300D1 of the second light-emitting element C202. In other words, two ends of the electrode extension wiring F300D12 are respectively connected to the electrode body F300D11 of the pixel electrode F300D1 of the second light-emitting element C202 and the output end of the second pixel driving circuit C102. In some embodiments, the main display region AA2 may include an auxiliary display region adjacent to the light-transmitting region AA1, and the second pixel driving circuit C102 may be provided in the auxiliary display region.

Certainly, in another example of the present disclosure, the second light-emitting element C202 and the second pixel driving circuit C102 may be both provided in the light-transmitting region AA1, and the light transmittance of the light-transmitting region AA1 may be improved by adjusting the gap between the second pixel driving circuits C102 and the layout area.

For another example, in some other embodiments of the present disclosure, referring to FIG. 6, the display panel PNL is provided with a light-transmitting hole at the light-transmitting region AA1. Furthermore, the display region AA is further provided with an encapsulation region surrounding the light-transmitting region AA1, so as to prevent water and oxygen from invading from the light-transmitting region AA1 to the main display region AA2, and block the crack from extending towards the main display region AA2, etc.

Figures 7, 8:
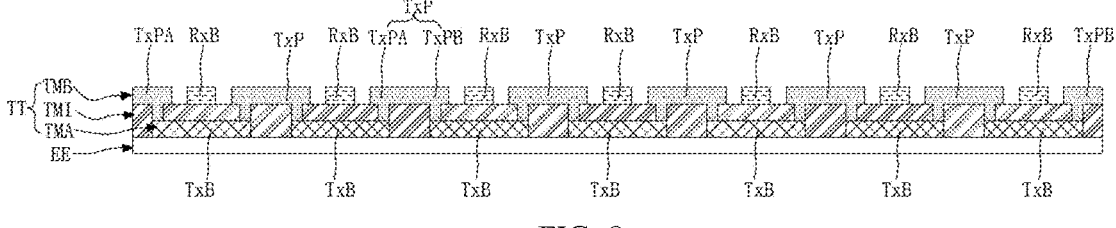
FIG. 7 is a schematic diagram of a local structure of a second touch-control metal layer according to some embodiments of the present disclosure.
FIG. 8 is a schematic diagram of a local structure of a touch-control layer according to some embodiments of the present disclosure.

FIG. 7 and FIG. 8 are schematic diagrams of a structure of a touch-control layer TT according to some embodiments of the present disclosure. Referring to FIG. 7, the touch-control layer TT is provided with a plurality of touch-control channels TS, and these touch-control channels TS include a plurality of second signal channels Rx extending along the second direction DH and a plurality of first signal channels Tx extending along the first direction DV; and the second direction DH is intersected with the first direction DV. In some embodiments, one of the second direction DH and the first direction DV is the row direction of the display panel PNL (that is the extending direction of the scanning wiring), and the other one of the second direction DH and the first direction DV is the column direction (that is the extending direction of the data voltage wiring). For example, the second direction DH is the row direction of the display panel PNL, and the first direction DV is the column direction of the display panel PNL.

Referring to FIG. 7, various first signal channels Tx and various second signal channels Rx define a plurality of touch-control positioning regions TSA distributed in an array. A touch-control capacitor is formed by mutual capacitive between the first signal channel Tx and the second signal channel Rx of the touch-control positioning region TSA. During touch, the capacitance value of the touch-control capacitor in the touch-control positioning region TSA changes in response to the touch-control object (for example, a finger), and the display apparatus determines the touch-control position by detecting the change of the touch-control capacitor in different touch-control positioning regions TSA.

Figure 9:
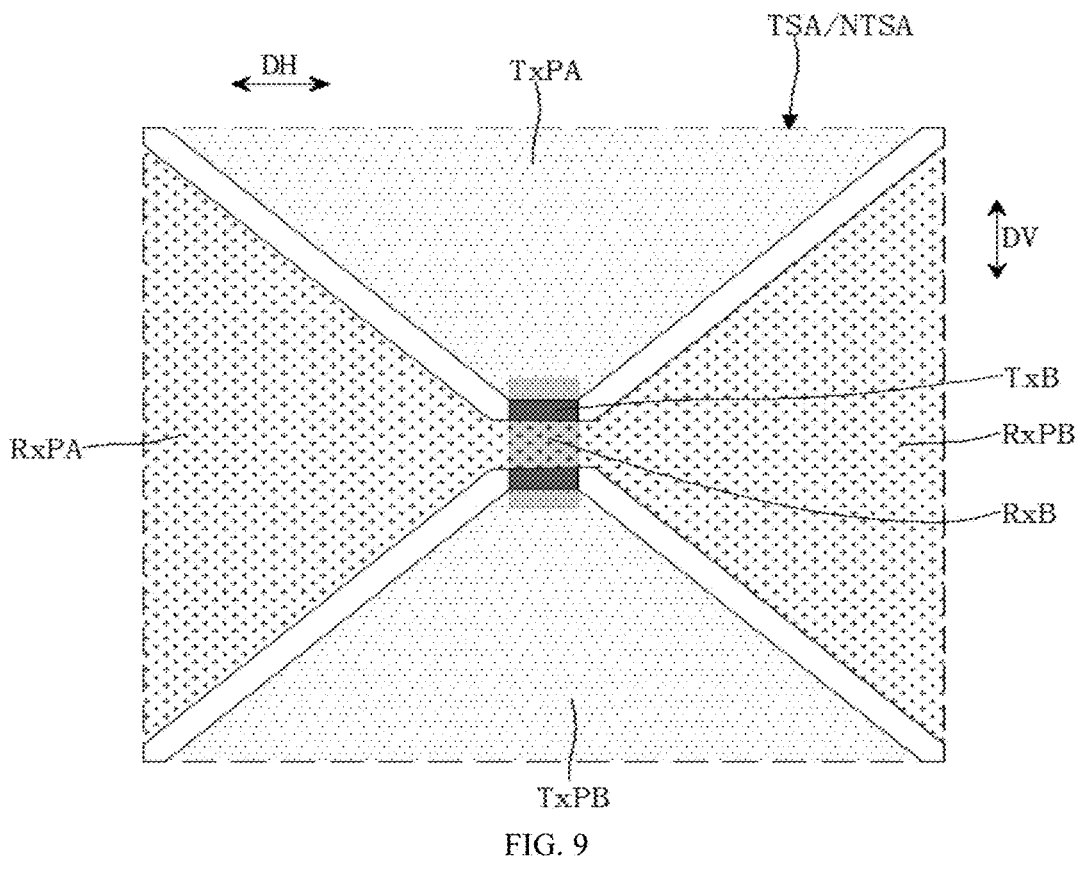
FIG. 9 is a schematic diagram of a local structure of a normal touch-control positioning region according to some embodiments of the present disclosure.

In some embodiments of the present disclosure, referring to FIG. 7 and FIG. 8, the touch-control layer TT includes a first touch-control metal layer TMA, a touch-control insulating layer TMI, and a second touch-control metal layer TMB that are sequentially stacked on a side of the display layer EE. The second signal channel Rx is provided, on the second touch-control metal layer TMB, with a plurality of second signal electrodes RxP that are sequentially arranged along the second direction DH; two adjacent second signal electrodes RxP are electrically connected to each other through a conductive structure located on the first touch-control metal layer TMA or the second touch-control metal layer TMB; the first signal channel Tx is provided, on the second touch-control metal layer TMB, with a plurality of first signal electrodes TxP that are sequentially arranged along the first direction Dv; two adjacent first signal electrodes TxP are electrically connected to each other through a conductive structure located on the first touch-control metal layer TMA or the second touch-control metal layer TMB. Referring to FIG. 9, in the touch-control positioning region TSA, a crossbar capacitor is formed between the edge of the second signal electrode RxP and the edge of the first signal electrode TxP, and the crossbar capacitor is used as a part of the touch-control capacitor within the touch-control positioning region TSA.

In an example, referring to FIG. 7 and FIG. 9, in the same touch-control positioning region TSA, the display panel PNL includes a first portion TxPA of a first signal electrode and a second portion TxPB of a first signal electrode, which belong to two adjacent first signal electrodes TxP respectively, and includes a first portion RxPA of a second signal electrode and a second portion RxPB of a second signal electrode, which belong to two adjacent second signal electrodes RxP respectively; the first portion TxPA of the first signal electrode and the second portion TxPB of the first signal electrode are electrically connected to each other through a conductive structure, and the first portion RxPA of the second signal electrode and the second portion RxPB of the second signal electrode are electrically connected to each other. In two touch-control positioning regions TSA adjacent along the second direction DH, the second portion RxPB of the second signal electrode in one touch-control positioning region TSA is adjacent to and connected to the first portion RxPA of the second signal electrode in the other touch-control positioning region TSA to jointly form a second signal electrode RxP. In this way, the second signal electrode RxP located at one end of the second signal channel Rx may only include the first portion RxPA of the second signal electrode, the second signal electrode RxP located at the other end of the second signal channel Rx may only include the second portion RxPB of the second signal electrode, and the second signal electrode RxP at the non-end portion may include the first portion RxPA of the second signal electrode and the second portion RxPB of the second signal electrode. The first portion RxPA of the second signal electrode and the second portion RxPB of the second signal electrode are respectively located in two adjacent touch-control position-ing region TSA. In two touch-control positioning regions TSA adjacent along the first direction DV, the second portion TxPB of the first signal electrode in one touch-control positioning region TSA is adjacent to and connected to the first portion TxPA of the first signal electrode in the other touch-control positioning region TSA to jointly form a first signal electrode TxP. In this way, the first signal electrode TxP located at one end of the first signal channel Tx may only include the first portion TxPA of the first signal elec-trode, the first signal electrode TxP located at the other end of the first signal channel Tx may only include the second portion TxPB of the first signal electrode, and the first signal electrode TxP at the non-end portion may include a first portion TxPA and a second portion TxPB. The first portion TxPA of the first signal electrode and the second portion TxPB of the first signal electrode are respectively located in two adjacent touch-control positioning region TSA.

Figure 10:
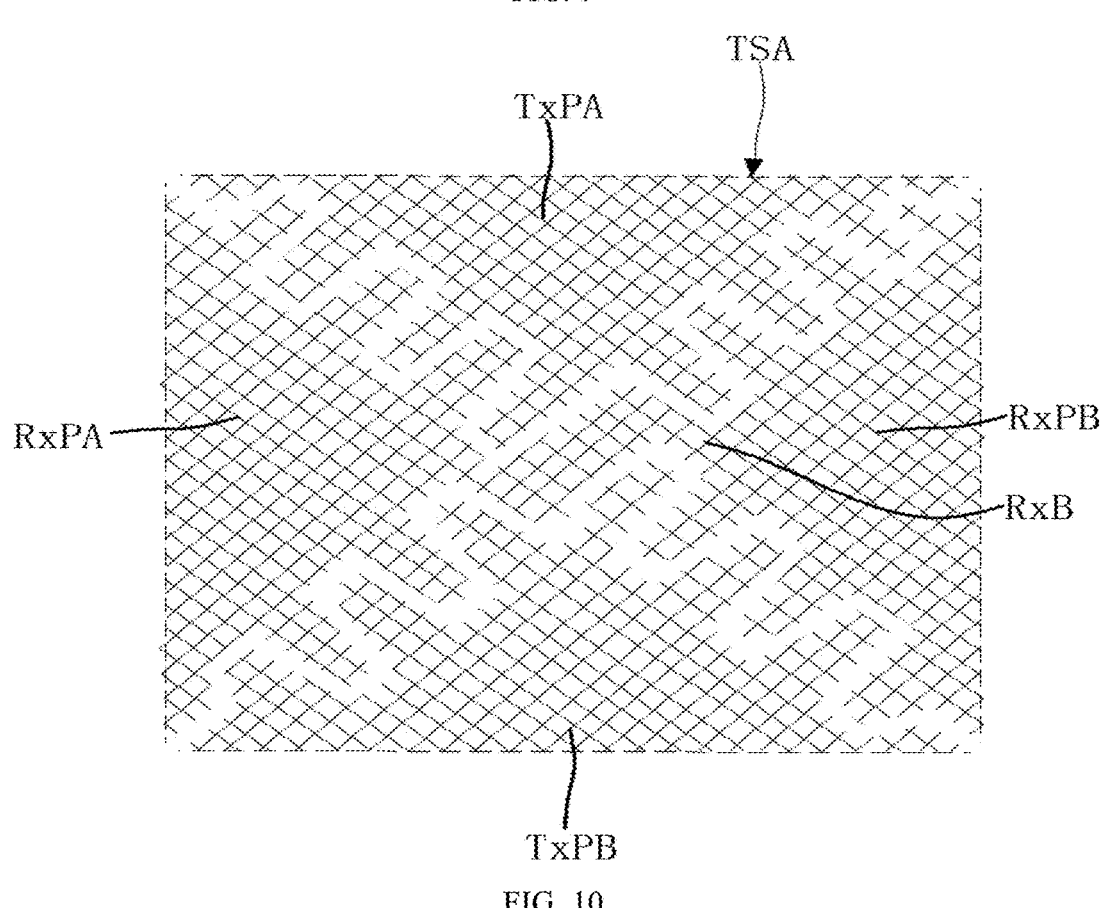
FIG. 10 is a schematic diagram of a local structure of a second touch-control metal layer within a normal touch-control positioning region according to some embodiments of the present disclosure.

Referring to FIG. 10, the first signal channel Tx and the second signal channel Rx may be designed in a hollowed-out manner, so as to reduce the influence on the light extraction of the display panel PNL and reduce the reflection of the ambient light. Furthermore, the gap between the first signal channel Tx and the second signal channel Rx may be in a bent shape rather than a straight line, that is, a first signal electrode TxP and a second signal electrode RxP adjacent to each other are plugged into each other. In this way, it is facilitated for eliminating the visibility degree of the bound-ary between the first signal electrode TxP and the second signal electrode RxP, thus improving the uniformity of the display panel PNL.

The touch-control layer TT may also be provided with touch-control wirings, and the touch-control wiring may be provided in the peripheral region BB and electrically con-nected to the touch-control channel TS, so as to transmit signals of the first signal channel Tx and the second signal channel Rx to the control component of the display appa-ratus; and the control component of the display apparatus may determine the touch-control position according to the signal transmitted by the touch-control wiring.

In some embodiments of the present disclosure, in the first portion TxPA and the second portion TxPB of the first signal electrode TxP, the first portion TxPA of the first signal electrode is close to the touch-control wiring connected to the first signal channel Tx. In other words, the first signal electrode TxP located at the end of the first signal channel Tx is connected to the touch-control wiring, and this first signal electrode TxP is the first portion TxPA of the first signal electrode. In the first portion RxPA and the second portion RxPB of the second signal electrode RxP, the first portion RxPA of the second signal electrode is close to the touch-control wiring connected to the second signal channel Rx. In other words, the second signal electrode RxP located at the end of the second signal channel Rx is connected to the touch-control wiring, and this second signal electrode RxP is the first portion RxPA of the second signal electrode.

Figure 11:
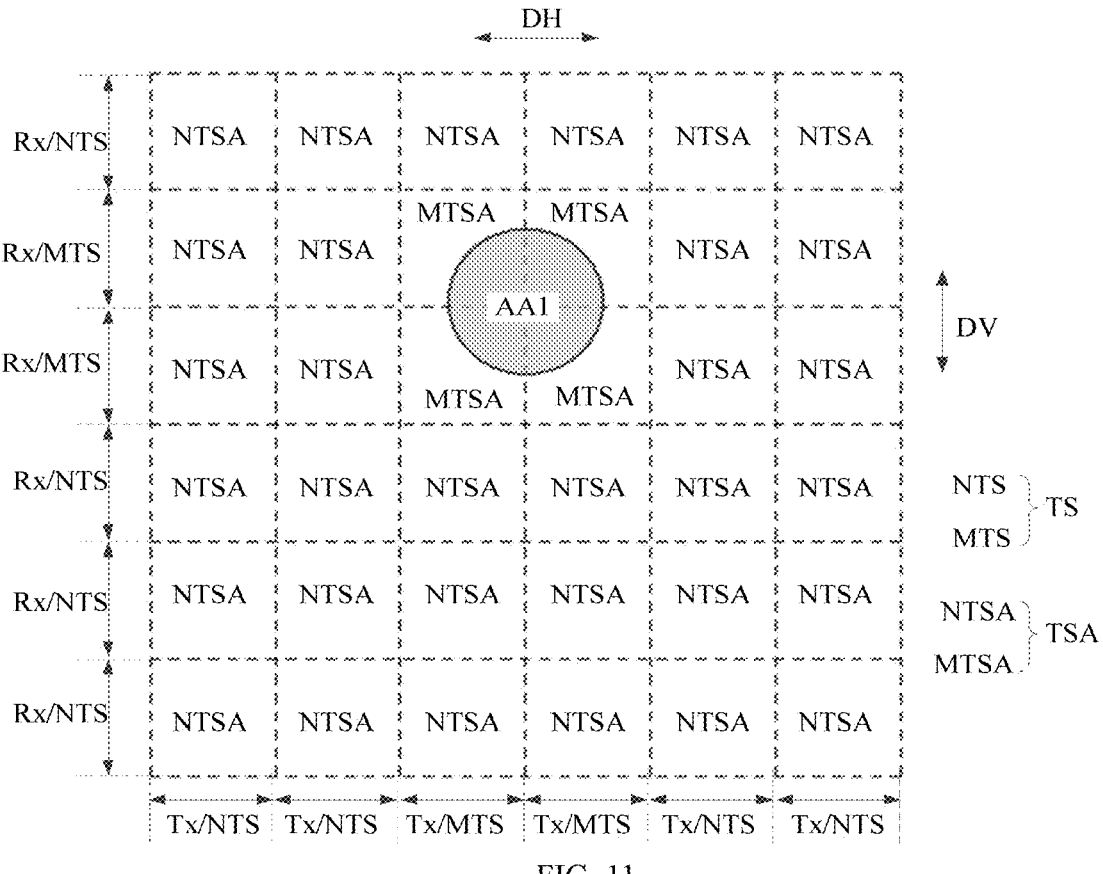
FIG. 11 is a schematic diagram of distribution of a touch-control positioning region according to some embodiments of the present disclosure.

In the embodiments of the present disclosure, referring to FIG. 11, according to a relative position relationship between the touch-control positioning region TSA and the light-transmitting region AA1, the touch-control positioning region TSA may be classified as a normal touch-control positioning region NTSA or a heterogeneous touch-control positioning region MTSA. Among them, the normal touch-control positioning region NTSA is not intersected with the light-transmitting region AA1, and the heterogeneous touch-control positioning region MTSA is intersected with the light-transmitting region AA1. In other words, structures such as the second signal electrode RxP and the first signal electrode TxP in the normal touch-control positioning region NTSA are not adjacent to the light-transmitting region AA1, and the structure of the normal touch-control positioning region NTSA can be kept intact. The second signal electrode RxP and the first signal electrode TxP in the heterogeneous touch-control positioning region MTSA are at least partially adjacent to the light-transmitting region AA1, and are pro-vided with notches for avoiding the light-transmitting region AA1. In some examples of the present disclosure, whether the second signal electrode RxP or the first signal electrode TxP is provided with an avoidance notch may be determined by means of whether the edge of the second signal electrode RxP or the edge of the first signal electrode TxP is directly adjacent to the light-transmitting region AA1; if the edge of a conductive structure is not directly adjacent to the light-transmitting region AA1, for example, there is another conductive structure spaced apart therebetween, it may be considered that the conductive structure is kept intact with-out being provided with an avoidance notch for avoiding the light-transmitting region AA1; and if the edge of a conduc-tive structure is directly adjacent to the light-transmitting region AA1, it may be considered that the conductive structure is provided with an avoidance notch for avoiding the light-transmitting region AA1.

In some embodiments of the present disclosure, referring to FIG. 9, in the normal touch-control positioning region NTSA, the first touch-control metal layer TMA is provided with a bridging portion TxB, and the first portion TxPA and the second portion TxPB of the first signal electrode are connected through the bridging portion TxB; the second touch-control metal layer TMB is provided with a connect-ing portion RxB, and the first portion RxPA and the second portion RxPB of the second signal electrode are connected through the connecting portion RxB. In this way, the con-necting portion RxB and the bridging portion TxB overlap with each other to form a mutual capacitive capacitor, and the mutual capacitive capacitor is also a part of the touch-control capacitor in the normal touch-control positioning region NTSA.

In some embodiments of the present disclosure, the touch-control layer TT may be implemented by using an FMLOC (Flexible Multi-Layer On Cell) technology; that is, the touch-control layer TT is prepared by using the display layer EE as the substrate instead of pasting the touch-control substrate to the display layer EE.

Figures 1, 12:
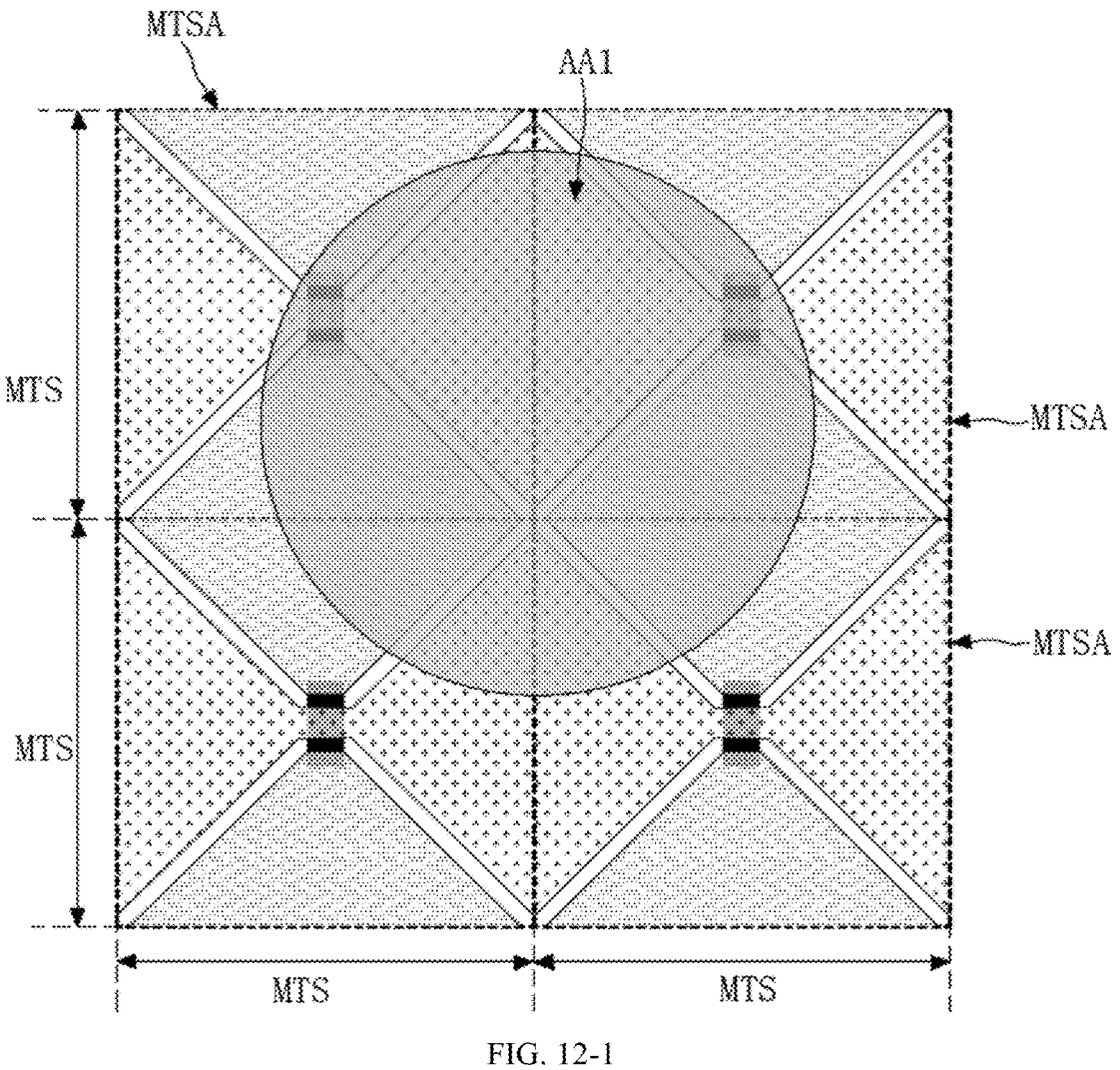
Figures 2, 12:
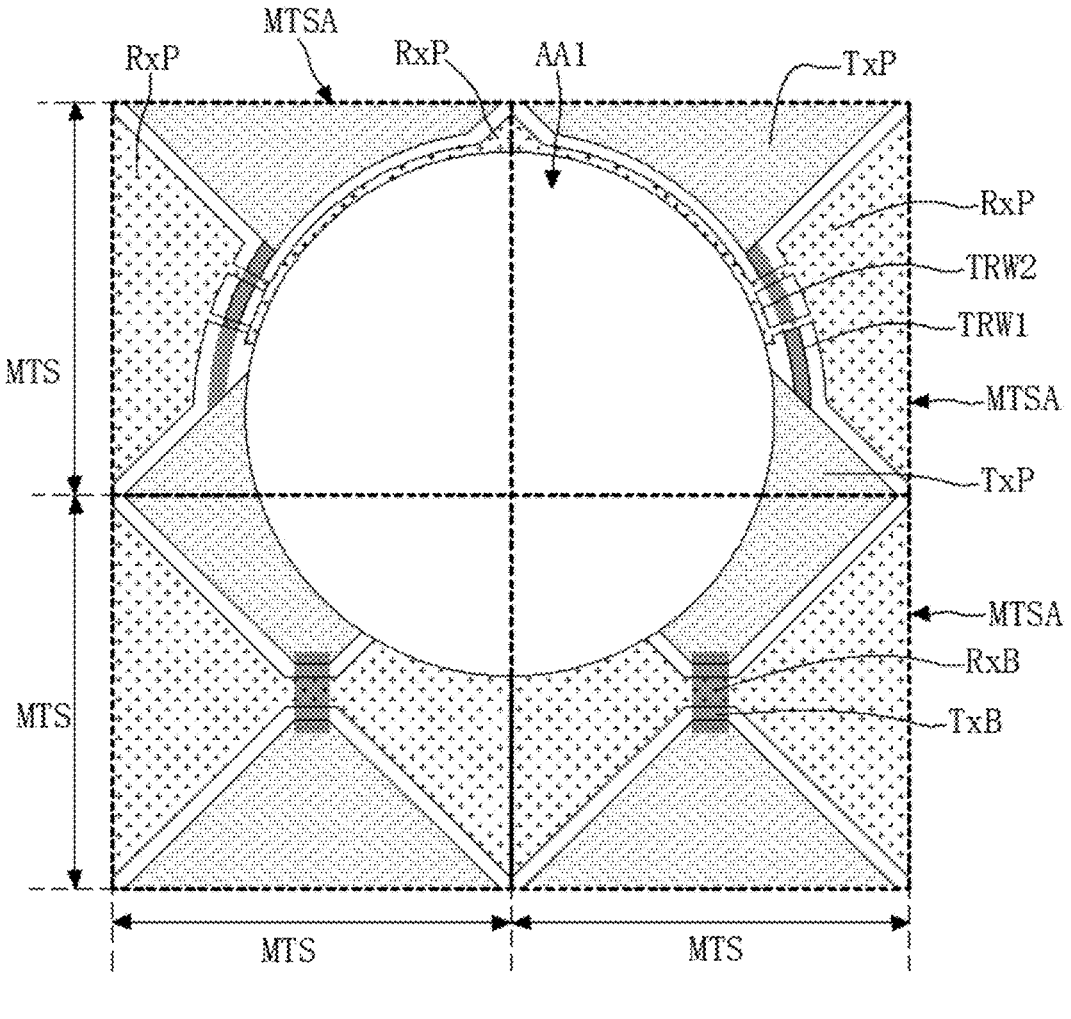

FIG. 12-1 is a schematic diagram of a local principle of a touch-control layer TT avoiding a light-transmitting hole AA1 in the related art. FIG. 12-2 is a schematic diagram of a local structure of the touch-control layer TT after avoiding the light-transmitting hole AA1 in the related art. Referring to FIG. 12-1, the touch-control channel TS of the touch-control layer TT needs to avoid the light-transmitting region AA1, resulting in that at least one touch-control channel TS to be separated by the light-transmitting region AA1.

In the related art, referring to FIG. 12-2, when a dot screen technology is used in the display panel PNL, the touch-control layer TT may be provided with transfer wirings (for example, the transfer wiring TRW1 and the transfer wiring TRW2 in FIG. 12-2) surrounding the light transmissive region AA1 so that the separated touch-control channel TS is reconnected. However, in the position surrounding the light-transmitting region AA1, the display panel PNL does not have enough flatness due to encapsulation, which makes the touch-control layer TT easily have defects of short circuit or open circuit due to the arrangement of the transfer wirings across the film layer. Moreover, the transfer wiring occupies a relatively larger layout space, which affects the pattern of the first signal electrode TxP or the second signal electrode RxP around the light-transmitting region AA1, thus affecting the touch-control performance. A plate capacitor may be formed between different transfer wirings. For example, the transfer wiring TRW1 and the transfer wiring TRW2 need to be respectively provided on the first touch-control metal layer TMA and the second touch-control metal layer TMB, and a plate capacitor is formed in the overlapping position, which results in that the touch-control capacitance in the heterogeneous touch-control positioning region MTSA to be increased (however, the change amount of the capacitor is substantially unchanged when responding to the touch-control action), thus affecting the touch-control performance. When an under display camera technology is used in the display panel PNL, it is difficult to provide a double-layer of transfer wirings due to the fact that the light-transmitting region AA1 has no frame. In these cases, when the FMLOC technology is used in the display panel PNL with a light-transmitting region AA1, it is resulted in that the touch-control performance of the touch-control layer TT is difficult to keep stable and reliable.

Figure 13:
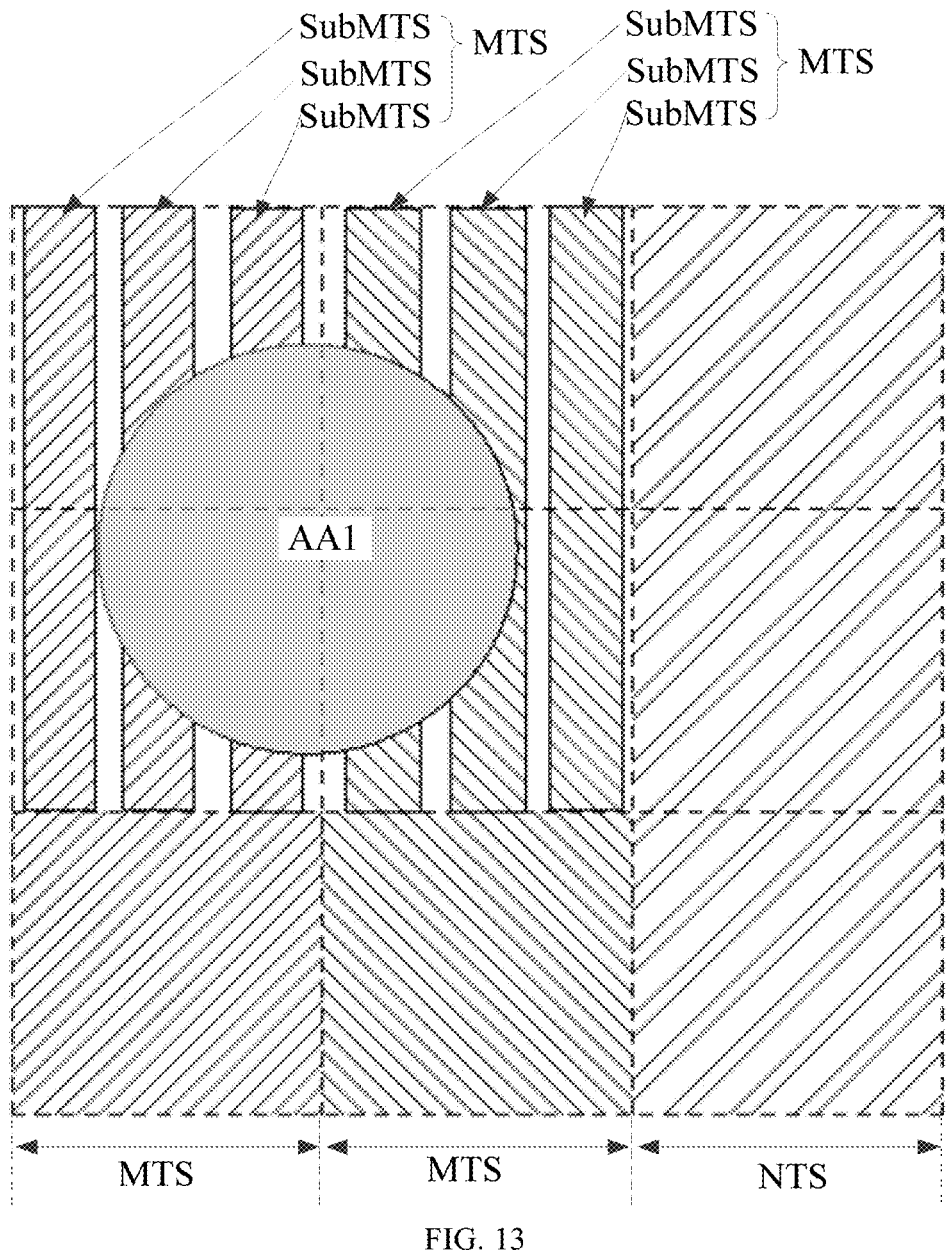
FIG. 13 is a schematic diagram of a principle of maintaining at least on touch-control channel continuous by setting a heterogeneous touch-control sub-channel according to some embodiments of the present disclosure.

In the display panel PNL provided according to the embodiments of the present disclosure, referring to FIG. 11, it may be may be classified as a normal touch-control channel (NTS) or a heterogeneous touch-control channel (MTS) according to the relative position relationship between the touch-control channel TS and the light-transmitting region AA1. Among them, a touch-control channel TS that is not adjacent to the light-transmitting region AA1 is defined as a normal touch-control channel NTS, and a touch-control channel TS that is adjacent to the light-transmitting region AA1 is defined as a heterogeneous touch-control channel (MTS). In the embodiments of the present disclosure, referring to FIG. 13, at least one heterogeneous touch-control channel (MTS) includes a plurality of heterogeneous touch-control sub-channels (SubMTS) adjacent to the display region AA. In a plurality of heterogeneous touch-control sub-channels SubMTS of the heterogeneous touch-control channel MTS, at least one heterogeneous touch-control sub-channel SubMTS is kept continuous. In this way, in the heterogeneous touch-control channel MTS, the heterogeneous touch-control sub-channel SubMTS can be provided within the heterogeneous touch-control positioning region MTSA to flexibly avoid the light-transmitting region AA1, thus avoiding the arrangement of the transfer wirings or reducing the number of the transfer wirings, and particularly avoiding forming a plate capacitor due to arrangement of a double-layer of transfer wirings, further reducing or avoiding the influence of the arranged transfer wirings on the touch-control sensor. In the present disclosure, the heterogeneous touch-control sub-channel SubMTS being kept continuous, means that two adjacent conductive structures of the heterogeneous touch-control sub-channel SubMTS located on the second touch-control metal layer TMB are connected through a conductive connecting portion located between these two conductive structures (the conductive connecting portion being provided on the first touch-control metal layer TMA or the second touch-control metal layer TMB), rather than through transfer wirings provided along the arc of the edge of the light-transmitting region AA1.

As an example, the first signal channel Tx may be provided with a plurality of first signal sub-channels SubTx in a heterogeneous touch-control positioning region (MTSA). If the sub-electrodes of a first signal sub-channel SubTx are connected through a bridging portion TxB located on the first touch-control metal layer TMA, it is considered that the first signal sub-channel SubTx is kept continuous. If at least two sub-electrodes of a first signal sub-channel SubTx are connected through transfer wirings arranged along an arc of the edge of the light-transmitting region AA1, it is considered that the first signal sub-channel SubTx is not kept continuous. It can be understood that, in some cases, the heterogeneous touch-control sub-channel SubMTS that are not kept continuous, may also be kept electrically connected (i.e. may normally transmit touch-control signals) through the transfer wirings.

In the display panel PNL according to embodiments of the present disclosure, two heterogeneous touch-control channels (MTS) (i.e. a first signal channel Tx and a second signal channel Rx) intersected with each other are provided in the same heterogeneous touch-control positioning region (MTSA). In an example, one heterogeneous touch-control channel (MTS) in the same heterogeneous touch-control positioning region (MTSA) is provided with a plurality of heterogeneous touch-control sub-channels (SubMTS), and the other heterogeneous touch-control channel (MTS) is not provided with heterogeneous touch-control sub-channels (SubMTS) (i.e. the number of the heterogeneous touch-control sub-channel SubMTS is 1). In another example, in the same heterogeneous touch-control positioning region (MTSA), two heterogeneous touch-control channels (MTS) are both provided with a plurality of heterogeneous touch-control sub-channels (SubMTS), and the respective number of the heterogeneous touch-control sub-channels SuMTS of the two heterogeneous touch-control channels (MTS) may be the same or different, for example, may both be two. In an example, in the same heterogeneous touch-control positioning region (MTSA), one heterogeneous touch-control channel (MTS) may be kept continuous and the other heterogeneous touch-control channel (MTS) may be kept with continuity of electrical signals through transfer wirings surrounding the light-transmitting region AA1. In another example, in the same heterogeneous touch-control positioning region (MTSA), two heterogeneous touch-control channels (MTS) may both be kept continuous.

In some embodiments of the present disclosure, in the heterogeneous touch-control positioning region MTSA, an electrode may be divided into a plurality of sub-electrodes, and then different heterogeneous touch-control sub-channels SubMTS may be formed by different sub-electrodes.

In some embodiments of the present disclosure, the number of the heterogeneous touch-control positioning region MTSA may be more than one, for example, may be 2 to 6. For example, the number of the heterogeneous touch-control positioning region MTSA is four, and the four heterogeneous touch-control positioning regions MTSA are arranged in two adjacent rows and two adjacent columns.

Figures 1, 14:
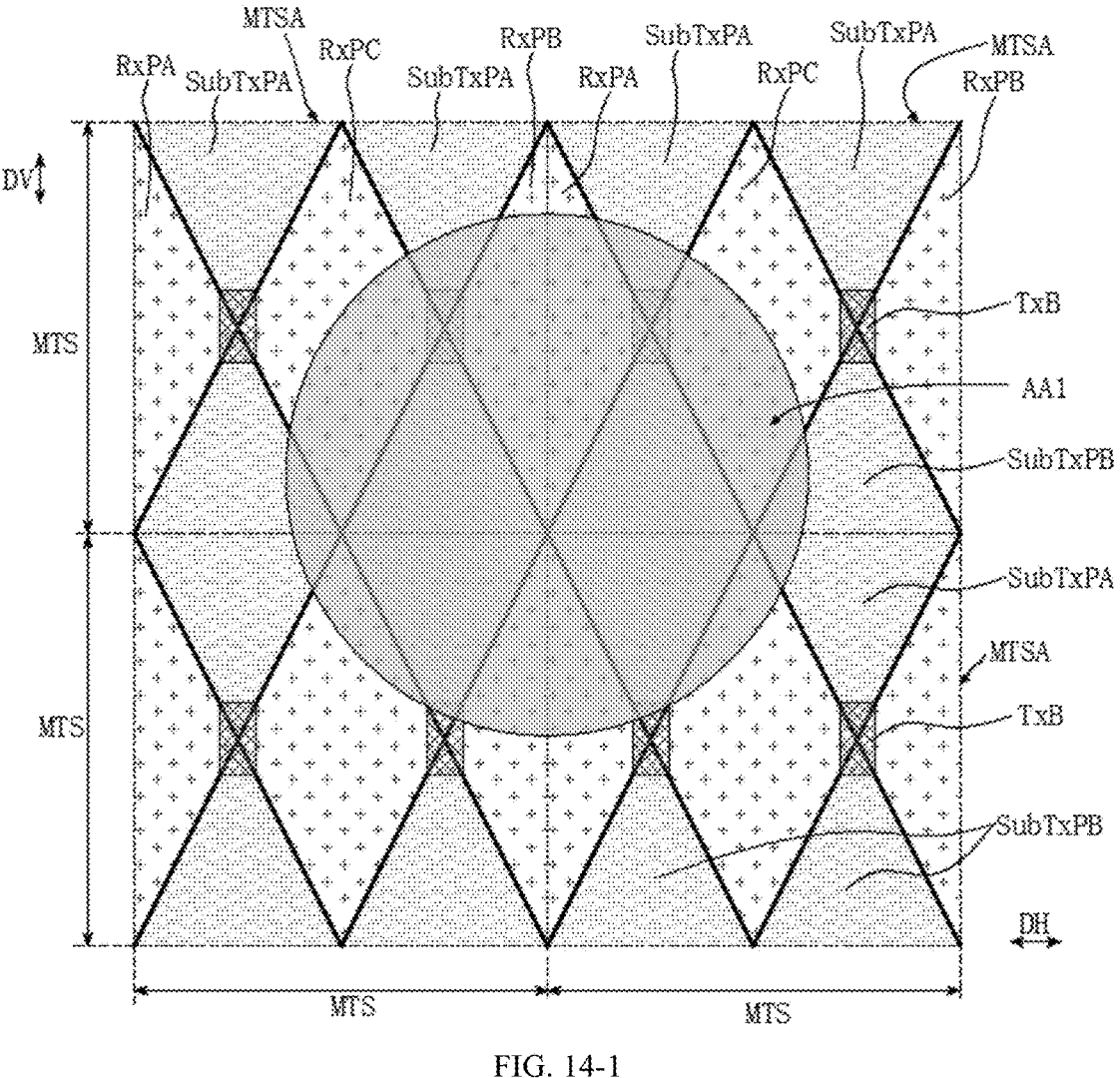
Figures 2, 14:
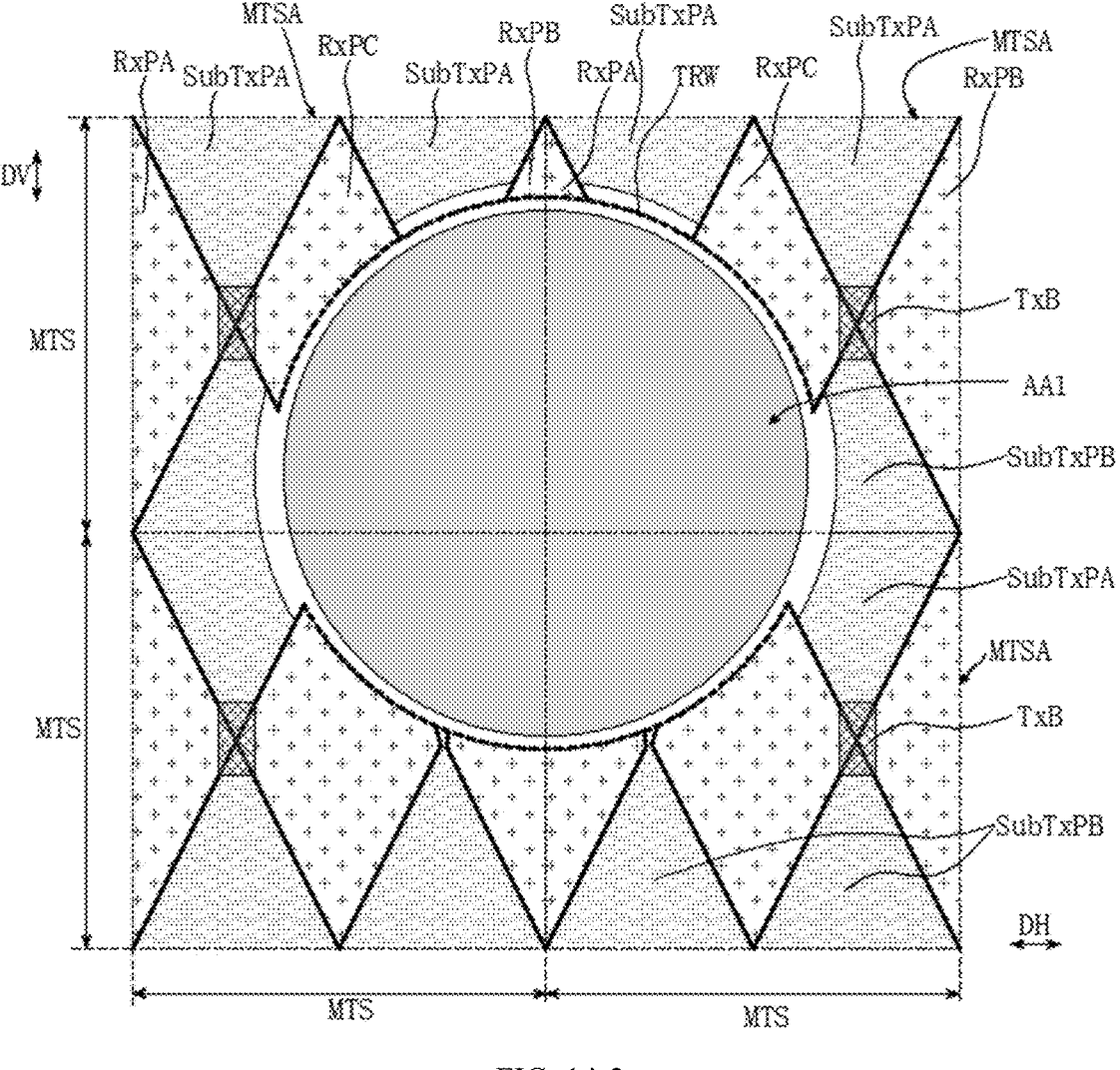

FIG. 14-1 illustrates a design principle of a local structure of a touch-control layer TT in some embodiments of the present disclosure; and FIG. 14-2 illustrates a schematic diagram of a local structure of a touch-control layer TT in some embodiments of the present disclosure.

Referring to FIG. 14-2, in some embodiments of the present disclosure, in at least one heterogeneous touch-control positioning region MTSA, the first touch-control metal layer TMA is provided with a bridging portion TxB, the first portion TxPA of the first signal electrode includes at least two sub-electrodes SubTxPA, and at least one sub-electrode SubTxPA of the first portion of the first signal electrode is electrically connected to the second portion TxPB of the first signal electrode through the bridging portion TxB.

In an example, the sub-electrode SubTxPA of the first portion of the first signal electrode farthest away from the light-transmitting region AA1 may not be provided with a notch for avoiding the light-transmitting region AA1 and is connected to the second portion TxPB of the first signal electrode through the bridging portion TxB.

In some embodiments, in the at least one heterogeneous touch-control positioning region MTSA, the second touch-control metal layer TMB is provided with a connecting portion RxB and a third portion RxPC the second signal electrode, and the connecting portion RxB is overlapped with the bridging portion TxB. Along the second direction DH, the third portion RxPC of the second signal electrode is sandwiched between two adjacent sub-electrodes SubTxPA of the first portion of the first signal electrode. One of the first portion RxPA and the second portion RxPB of the second signal electrode is electrically connected to the adjacent third portion RxPC of the second signal electrode through the connecting portion RxB; and the other one of the first portion RxPA and the second portion RxPB of the second signal electrode is electrically connected to the adjacent third portion RxPC of the second signal electrode through the transfer wirings TRW located on the first touch-control metal layer TMA or the second touch-control metal layer TMB, or is connected through the connecting portion RxB.

In an example, the transfer wiring TRW is provided on the second touch-control metal layer TMB, and there is a gap between the transfer wiring TRW and the first signal channel Tx.

In an example, the transfer wiring TRW is provided along an edge of the light-transmitting region AA1.

Referring to the design principle of the local structure of the touch-control layer TT shown in FIG. 14-1, under the condition that the auxiliary design state (the state in the design process instead of the final layout) of the light-transmitting region AA1 is not considered, the first portion TxPA of the first signal electrode in at least one heterogeneous touch-control positioning region MTSA is divided into a plurality of sub-electrodes SubTxPA (for example, two) of the first portion of the first signal electrodes, and the second portion TxPB of the first signal electrode is divided into a plurality of sub-electrodes SubTxPB (for example, two) of the second portion of the first signal electrode in one-to-one correspondence with the plurality of sub-electrodes SubTxPA of the first portion of the first signal electrode, and the number of the bridging portion TxB in the heterogeneous touch-control positioning region MTSA is the same as the number of the sub-electrode SubTxPA of the first portion of the first signal electrode; and the sub-electrode SubTxPA of the first portion of the first signal electrode and the sub-electrode SubTxPB of the second portion of the first signal electrode are connected through the corresponding bridging portion TxB. The third portion RxPC of the second signal electrode in the heterogeneous touch-control positioning region MTSA is connected to the first portion RxPA of the second signal electrode and the second portion RxPB of the second signal electrode through different connecting portions RxB. In the prepared display panel PNL (i.e. in the final layout of the touch-control layer TT, referring to FIG. 14-2), the portions of the sub-electrode SubTxPA of the first portion of the first signal electrode, the sub-electrode SubTxPB of the second portion of the first signal electrode, and the bridging portion TxB that are located the light-transmitting region AA1, are removed, so that the remaining portion of the first portion TxPA of the first signal electrode and the remaining portion of the second portion TxPB of the first signal electrode are connected to each other through at least one bridging portion TxB. Meanwhile, the portions of the first portion RxPA of the second signal electrode, the second portion RxPB of the second signal electrode, the third portion RxPC of the second signal electrode, and the connecting portion RxB that are located in the light-transmitting region AA1, are also removed. When the second signal channel Rx formed by connection of the first portion RxPA of the second signal electrode, the third portion RxPC of the second signal electrode, and the second portion RxPB of the second signal electrode in sequence is separated by the light-transmitting region AA1, the transfer wirings TRW may be provided so that the second signal channel Rx is kept unblocked, and the sub-electrode SubTxPA of the first portion of the first signal electrode also needs to avoid the transfer wirings TRW to avoid forming a plate capacitor.

In the present disclosure, for ease of representation, the heterogeneous touch-control positioning region MTSA located at the upper left corner in FIG. 14-2 can be named as the first heterogeneous touch-control positioning region MTSA. As an example, referring to FIG. 14-2, in the first heterogeneous touch-control positioning region MTSA, the first portion TxPA of the first signal electrode includes two sub-electrodes SubTxPA of two first portions of the first signal electrodes arranged along the second direction DH, where at least one sub-electrode SubTxPA of the first portion of the first signal electrode is not affected by the light-transmitting region AA1 and is connected to the second portion TxPB of the first signal electrode through the bridging portion TxB, thus ensuring that the signal in the first signal channel Tx in the first heterogeneous touch-control positioning region MTSA is unblocked. The other sub-electrode SubTxPA of the first portion of the first signal electrode is provided with a notch for avoiding the light-transmitting region AA1. In the first heterogeneous touch-control positioning region MTSA, if the first signal channel Tx does not avoid the light-transmitting region AA1, the first signal channel Tx should be provided with two heterogeneous touch-control sub-channels SubMTS, and each heterogeneous touch-control sub-channel SubMTS includes a sub-electrode SubTxPA of the first portion of the first signal electrode, a bridging portion TxB, and a sub-electrode SubTxPB of the second portion of the first signal electrode connected in sequence. In order to avoid the light-transmitting region AA1, the heterogeneous touch-control sub-channel SubMTS close to the light-transmitting region AA1 is separated, and the heterogeneous touch-control sub-channel SubMTS away from the light-transmitting region AA1 is kept continuous. Referring to FIG. 14-2, in the first heterogeneous touch-control positioning region MTSA, the second signal channel Rx includes a first portion RxPA of a second signal electrode located on the second touch-control metal layer TMB, a second portion RxPB of the second signal electrode, a third portion RxPC of the second signal electrode, and a connecting portion RxB, and includes a transfer wiring TRW, where the bridging portion TxB is overlapped with the connecting portion RxB. Along the second direction DH, the first portion RxPA of the second signal electrode is located on the side of the sub-electrode SubTxPA of the first portion of the first signal electrode away from the light-transmitting region AA1, and thus there is no need to set a notch for avoiding the light-transmitting region AA1. Along the second direction DH, the third portion RxPC of the second signal electrode is located between two adjacent sub-electrodes SubTxPA of the first portion of the first signal electrode, and is provided with a notch for avoiding the light-transmitting region AA1. The first portion RxPA of the second signal electrode and the third portion RxPC of the second signal electrode are connected through the connecting portion RxB. The second portion RxPB of the second signal electrode is provided with a notch for avoiding the light-transmitting region AA1, and the connection between the second portion RxPB and the third portion RxPC of the second signal electrode is separated by the light-transmitting region AA1. Therefore, the third portion RxPC and the second portion RxPB of the second signal electrode are connected to each other through a transfer wiring TRW provided along the edge of the light-transmitting region AA1, and the transfer wiring TRW may be provided on the first touch-control metal layer TMA or the second touch-control metal layer TMB. Among them, a wiring gap is reserved between the first signal electrode and the light-transmitting region AA1, and the transfer wiring TRW is provided in the wiring gap, which can avoid the excessive increase of the capacitance value of the touch-control capacitor in the first heterogeneous touch-control positioning region MTSA due to the fact that a plate capacitor is formed between the transfer wiring TRW and the first signal channel Tx, thus ensuring the touch-control performance under the condition that the signals in the second signal channel Rx and the first signal channel Tx are kept unblocked.

Referring to FIG. 14-2, in some embodiments of the present disclosure, in at least one heterogeneous touch-control positioning region MTSA, the first touch-control metal layer TMA is provided with a bridging portion TxB, the second portion TxPB of the first signal electrode includes at least two sub-electrodes SubTxPB, and at least one sub-electrode SubTxPB of the second portion of the first signal electrode is electrically connected to the first portion TxPA of the first signal electrode through the bridging portion TxB. Furthermore, the sub-electrode SubTxPB of the second portion of the first signal electrode farthest away from the light-transmitting region AA1 may not be provided with a notch for avoiding the light-transmitting region AA1, and may be connected to the first portion TxPA of the first signal electrode through the bridging portion TxB.

Furthermore, in at least one heterogeneous touch-control positioning region MTSA, the second touch-control metal layer TMB is provided with a third portion RxPC of the second signal electrode and a connecting portion RxB, and the connecting portion RxB is overlapped with the bridging portion TxB. Along the second direction DH, the third portion RxPC of the second signal electrode is sandwiched between two adjacent sub-electrodes SubTxPB of the second portion of the first signal electrode. One of the first portion RxPA and the second portion RxPB of the second signal electrode is electrically connected to an adjacent third portion RxPC of the second signal electrode through the connecting portion RxB; and the other one of the first portion RxPA and the second portion RxPB of the second signal electrode is electrically connected to an adjacent third portion RxPC of the second signal electrode through the transfer wiring TRW located on the first touch-control metal layer TMA or the second touch-control metal layer TMB, or is connected through the connecting portion RxB.

Referring to FIG. 14-1, in an auxiliary design state in which the light-transmitting region AA1 is not considered, the first portion TxPA of the first signal electrode in at least one heterogeneous touch-control positioning region MTSA is also divided into a plurality of sub-electrodes SubTxPA (for example, two) of the first portion of the first signal electrode in one-to-one correspondence with the plurality of sub-electrodes SubTxPB of the second portion of the first signal electrode, and the number of the bridging portion TxB in the heterogeneous touch-control positioning region MTSA is the same as the number of the sub-electrodes SubTxPB of the second portion of the first signal electrode; the sub-electrode SubTxPB of the second portion of the first signal electrode and the sub-electrode SubTxPA of the first portion of the first signal electrode are connected to each other through the corresponding bridging portion TxB. The third portion RxPC of the second signal electrode in the heterogeneous touch-control positioning region MTSA is connected to the first portion RxPA of the second signal electrode and the second portion RxPB of the second signal electrode through different connecting portions RxB. In the prepared display panel PNL, the portions of the sub-electrode Sub TxPB of the second portion of the first signal electrode, the sub-electrode SubTxPA of the first portion of the first signal electrode and the bridging portion TxB that are located in the light-transmitting region AA1 are removed, so that the remaining portion of the second portion TxPB of the first signal electrode and the remaining portion of the first portion TxPA of the first signal electrode are connected to each other through at least one bridging portion TxB. Meanwhile, the portions of the first portion RxPA of the second signal electrode, the second portion RxPB of the second signal electrode, the third portion RxPC of the second signal electrode, and the connecting portion RxB that are located in the light-transmitting region AA1 are also removed. When the second signal channel Rx formed by connection of the first portion RxPA of the second signal electrode, the third portion RxPC of the second signal electrode, and the second portion RxPB of the second signal electrode in sequence is separated by the light-transmitting region AA1, the transfer wiring TRW is provided so that the second signal channel Rx is kept unblocked, and the sub-electrode SubTxPB of the second portion of the first signal electrode also needs to avoid the transfer wiring TRW to avoid forming a plate capacitor.

In an example of the present disclosure, for ease of representation, the heterogeneous touch-control positioning region MTSA located at the lower left corner in FIG. 14-2 can be named as the second heterogeneous touch-control positioning region MTSA. As an example, in the second heterogeneous touch-control positioning region MTSA, the second portion TxPB of the first signal electrode includes two sub-electrodes SubTxPB of two second portions of the first signal electrodes arranged along the second direction DH, where at least one sub-electrode SubTxPB of the second portion of the first signal electrode is not affected by the light-transmitting region AA1 and is connected to the first portion TxPA of the first signal electrode through the bridging portion TxB, thus ensuring that the signal in the first signal channel Tx in the second heterogeneous touch-control positioning region MTSA is unblocked. The heterogeneous touch-control sub-channel SubMTS involved by the other sub-electrode SubTxPB of the second portion of the first signal electrode is separated by the light-transmitting region AA1. For example, the sub-electrode SubTxPA of the first portion of the first signal electrode connected to the sub-electrode SubTxPB of the second portion of the first signal electrode is separated by the light-transmitting region AA1. Of course, the sub-electrode SubTxPB of the second portion of the first signal electrode close to the light-transmitting region AA1 may also be separated by the light-transmitting region AA1 in other examples, and may be provided with a notch.

Referring to FIG. 14-1 and FIG. 14-2, in the second heterogeneous touch-control positioning region MTSA, the second signal channel Rx includes a first portion RxPA of the second signal electrode, a second portion RxPB of the second signal electrode, a third portion RxPC of the second signal electrode and a connecting portion RxB that are located at the second touch-control metal layer TMB, and includes a transfer wiring TRW, where the bridging portion TxB is overlapped with the connecting portion RxB. Along the second direction DH, the first portion RxPA of the second signal electrode is located on the side of the sub-electrode SubTxPB of the second portion of the first signal electrode away from the light-transmitting region AA1, and thus there is no need to be provided with a notch for avoiding the light-transmitting region AA1. Along the second direction DH, the third portion RxPC of the second signal electrode is located between two adjacent sub-electrodes SubTxPB of the second portion of the first signal electrode, and is provided with a notch for avoiding the light-transmitting region AA1. The first portion RxPA of the second signal electrode and the third portion RxPC of the second signal electrode are connected to each other through the connecting portion RxB. The second portion RxPB of the second signal electrode is provided with a notch for avoiding the light-transmitting region AA1. If the connection between the second portion RxPB and the third portion RxPC of the second signal electrode is separated by the light-transmitting region AA1 (as shown in FIG. 14-2), the third portion RxPC and the second portion RxPB of the second signal electrode are connected to each other through the transfer wiring TRW provided along the edge of the light-transmitting region AA1, and the transfer wiring TRW may be provided on the first touch-control metal layer TMA or the second touch-control metal layer TMB. Among them, a wiring gap is reserved between the light-transmitting region AA1 and the sub-electrode SubTxPB of the second portion of the first signal electrode between the second portion RxPB and the third portion RxPC of the second signal electrode, and the transfer wiring TRW is provided in the wiring gap, which can avoid the excessive increase of the capacitance value of the touch-control capacitor in the second heterogeneous touch-control positioning region MTSA due to the fact that a plate capacitor is formed between the transfer wiring TRW and the first signal channel Tx, thus ensuring the touch-control performance under the condition that the signals in the second signal channel Rx and the first signal channel Tx are kept unblocked.

Figures 1, 15:
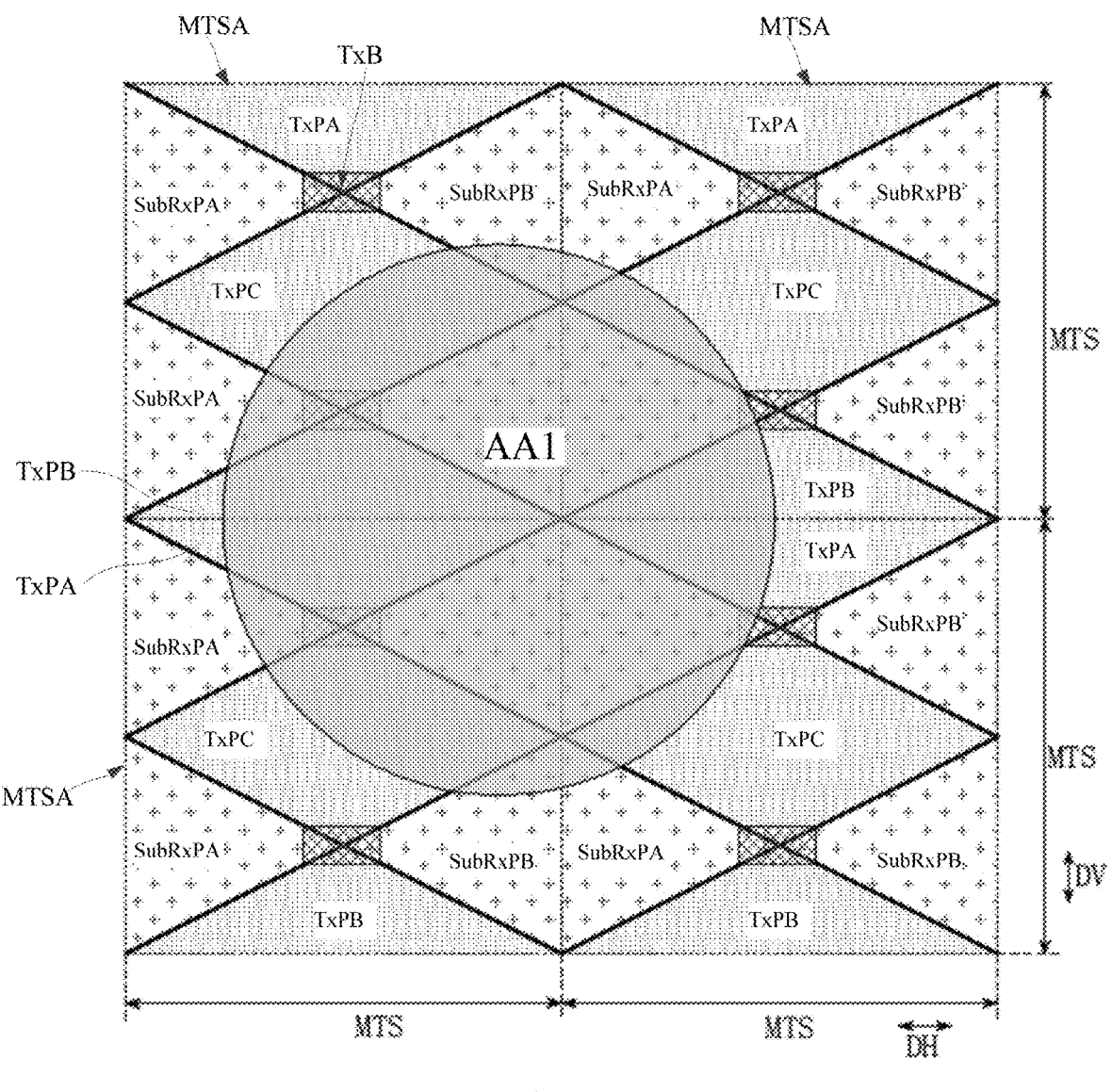
Figures 2, 15:
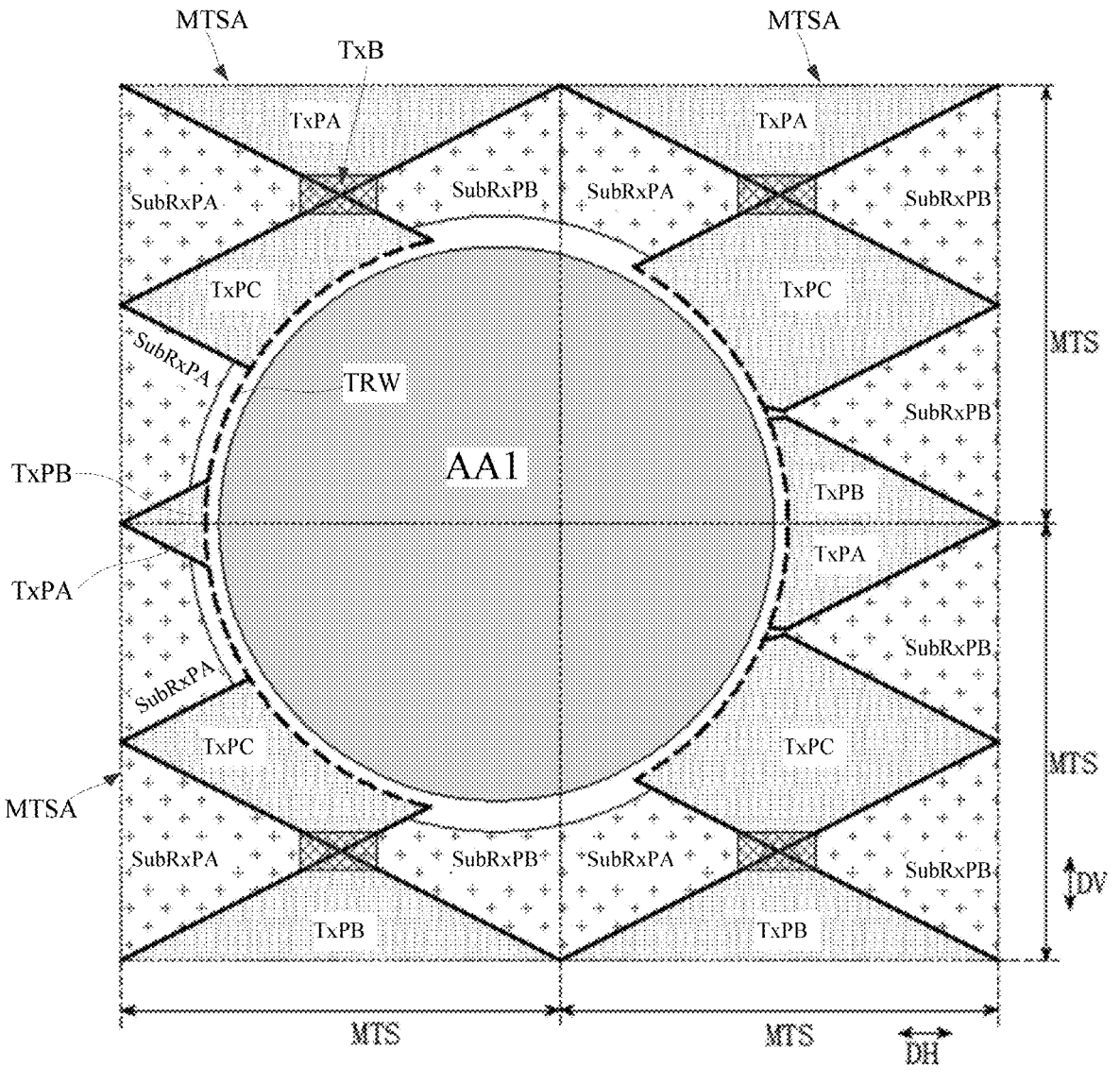

FIG. 14-1 and FIG. 14-2 illustrate a solution and a principle that a first signal channel Tx in at least one heterogeneous touch-control positioning region MTSA is provided with a plurality of heterogeneous touch-control sub-channels SubMTS to avoid being completely separated by the light-transmitting region AA1. The above design concept and principle can also be applied in other examples of the present disclosure; for example, a second signal channel Rx in at least one heterogeneous touch-control positioning region MTSA is provided with a plurality of heterogeneous touch-control sub-channels SubMTS to avoid being completely separated by the light-transmitting region AA1. FIG. 15-1 illustrates a design principle schematic diagram of a local design in which a second signal channel Rx in at least one heterogeneous touch-control positioning region (MTSA) is provided with a plurality of heterogeneous touch-control sub-channels (SubMTS) to avoid being completely separated by the light-transmitting region AA1; and FIG. 15-2 illustrates a schematic diagram of a local structure in which a second signal channel Rx in at least one heterogeneous touch-control positioning region (MTSA) is provided with a plurality of heterogeneous touch-control sub-channels SubMTS to avoid being completely separated by the light-transmitting region AA1.

Referring to FIG. 15 and FIG. 2, in some embodiments of the present disclosure, in at least one heterogeneous touch-control positioning region (MTSA), a second touch-control metal layer TMB is provided with a connecting portion RxB, a first portion RxPA of the second signal electrode includes at least two sub-electrodes subRxPA of a first portion of a second signal electrode, and at least one sub-electrode subRxPA of the first portion of the second signal electrode is electrically connected to a second portion RxPB of the second signal electrode through a connecting portion RxB. Furthermore, the sub-electrode SubRxPA of the first portion of the second signal electrode farthest away from the light-transmitting region AA1 may not be provided with a notch for avoiding the light-transmitting region AA1 and is connected to the second portion RxPB of the second signal electrode through the connecting portion RxB. At least part of the remaining sub-electrodes SubRxPA of the first portion of the second signal electrodes may be provided with an avoidance gap for avoiding the light-transmitting region AA1, of course, or may be provided with no avoidance gap.

Furthermore, in the at least one heterogeneous touch-control positioning region MTSA, the second touch-control metal layer TMB is provided with a third portion TxPC of the first signal electrode, the first touch-control metal layer TMA is provided with a bridging portion TxB, and the bridging portion TxB is overlapped with the connecting portion RxB. Along the first direction DV, the third portion TxPC of the first signal electrode is sandwiched between two adjacent sub-electrodes SubRxPA of the first portion of the second signal electrode. One of the second portion TxPB and the first portion TxPA of the first signal electrode is electrically connected to an adjacent third portion TxPC of the first signal electrode through the bridging portion TxB; the other one of the first portion TxPA of the first signal electrode and the second portion TxPB of the first signal electrode is electrically connected to an adjacent third portion TxPC of the first signal electrode through the transfer wiring TRW located on the first touch-control metal layer TMA or the second touch-control metal layer TMB, of course, in some cases, the connection may also be achieved through the bridging portion TxB.

Furthermore, referring to FIG. 15-1, in an auxiliary design state in which the light-transmitting region AA1 is not considered, the second portion RxPB of the second signal electrode in the heterogeneous touch-control positioning region MTSA is also divided into a plurality of sub-electrodes SubRxPB (for example, two) of the second portion of the second signal electrode in one-to-one correspondence with two sub-electrodes SubRxPA of the first portion of the second signal electrode, and the number of the connecting portion RxB in the heterogeneous touch-control positioning region MTSA is the same as the number of the sub-electrodes SubRxPA of the first portion of the second signal electrode. The sub-electrode SubRxPA of the first portion of the second signal electrode and the sub-electrode SubRxPB of the second portion of the second signal electrode are connected to each other through the corresponding connecting portion RxB. The third portion TxPC of the first signal electrode in the heterogeneous touch-control positioning region MTSA is connected to the first portion TxPA of the first signal electrode and the second portion TxPB of the first signal electrode through different bridging portions TxB. In the prepared display panel PNL, the portions of the sub-electrode SubRxPA of the first portion of the second signal electrode, the sub-electrode SubRxPB of the second portion of the second signal electrode, and the connecting portion RxB that are located in the light-transmitting region AA1 are removed, so that the remaining portion of the first portion RxPA of the second signal electrode and the remaining portion of the second portion RxPB of the second signal electrode are connected to each other through at least one connecting portion RxB. Meanwhile, the portions of the first portion TxPA of the first signal electrode, the second portion TxPB of the first signal electrode, the third portion TxPC of the first signal electrode, and the bridging portion TxB that are located in the light-transmitting region AA1 are also removed. When the first signal channel Tx formed by connection of the first portion TxPA of the first signal electrode, the third portion TxPC of the first signal electrode and the second portion TxPB of the first signal electrode in sequence is separated by the light-transmitting region AA1, the transfer wiring TRW is provided so that the first signal channel Tx is kept unblocked, and the sub-electrode SubRxPA of the first portion of the second signal electrode also needs to avoid the transfer wiring TRW to avoid forming a plate capacitor.

As an example, for ease of expression, the heterogeneous touch-control positioning region MTSA at the upper left corner of FIG. 15-2 is referred to as a third heterogeneous touch-control positioning region MTSA. In the third heterogeneous touch-control positioning region MTSA, the first portion RxPA of the second signal electrode includes two sub-electrodes SubRxPA of two first portions of the second signal electrodes arranged along the first direction DV, where at least one sub-electrode SubRxPA of the first portion of second signal electrode is not affected by the light-transmitting region AA1 and is connected to the second portion RxPB of the second signal electrode through the connecting portion RxB, thus ensuring that the signal in the second signal channel Rx in the heterogeneous touch-control positioning region MTSA1 is kept unblocked. The other sub-electrode SubRxPA of the first portion of the second signal electrode is provided with a notch for avoiding the light-transmitting region AA1.

In the third heterogeneous touch-control positioning region MTSA, the first signal channel Tx includes a first portion TxPA of a first signal electrode, a second portion TxPB of the first signal electrode, a third portion TxPC of the first signal electrode that are located on the second touch-control metal layer TMB, and includes a bridging portion TxB located on the first touch-control metal layer TMA, and includes a transfer wiring TRW. Among them, the connecting portion RxB is overlapped with the bridging portion TxB. Along the first direction DV, the first portion TxPA of the first signal electrode is located on the side of the sub-electrode SubRxPA of the first portion of the second signal electrode away from the light-transmitting region AA1, thus there is no need to be provided with a notch for avoiding the light-transmitting region AA1. Along the first direction DV, the third portion TxPC of the first signal electrode is located between two adjacent sub-electrodes SubRxPA of the first portion of the second signal electrode, and is provided with a notch for avoiding the light-transmitting region AA1. The first portion TxPA of the first signal electrode and the third portion TxPC of the first signal electrode are connected to each other through the bridging portion TxB. The second portion TxPB of the first signal electrode is provided with a notch for avoiding the light-transmitting region AA1, and the connection between the third portion TxPC of the first signal electrode and the second portion TxPB of the first signal electrode is separated by the light-transmitting region AA1. Therefore, the second portion TxPB of the first signal electrode is connected to the third portion TxPC of the first signal electrode through the transfer wiring TRW provided along the edge of the light transmitting region AA1, and the transfer wiring TRW may be provided on the first touch-control metal layer TMA or the second touch-control metal layer TMB. Among them, a wiring gap is reserved between the light-transmitting region AA1 and the sub-electrode SuRxPA of the first portion of the second signal electrode between the third portion TxPC of the first signal electrode and the second portion TxPB of the first signal electrode, and the transfer wiring TRW is arranged in the wiring gap, which can avoid excessive increase of the capacitance value of the touch-control capacitor in the third heterogeneous touch-control positioning region MTSA due to the fact that a plate capacitor is formed between the transfer wiring TRW and the second signal channel Rx, thus ensuring the touch-control performance under the condition that the signals in the first signal channel Tx and the second signal channel Rx are kept unblocked.

Referring to FIG. 15-2, in some embodiments of the present disclosure, in at least one heterogeneous touch-control positioning region MTSA, the second touch-control metal layer TMB is provided with a connecting portion RxB, the second portion RxPB of the second signal electrode includes at least two sub-electrode SubRxPB of the second portion of the second signal electrode, and at least one sub-electrode SubRxPB of the second portion of the second signal electrode is electrically connected to the first portion RxPA of the second signal electrode through the connecting portion RxB. Furthermore, the sub-electrode SubRxPB of the second portion of the second signal electrode farthest away from the light-transmitting region AA1 may not be provided with a notch for avoiding the light-transmitting region AA1 and is connected to the first portion RxPA of the second signal electrode through the connecting portion RxB. At least part of the remaining sub-electrode SubRxPB of the second portion of the second signal electrode may be provided with a notch for avoiding the light-transmitting region AA1, of course, may not be provided with a notch for avoiding the light-transmitting region AA1.

Furthermore, in at least one heterogeneous touch-control positioning region MTSA, the second touch-control metal layer TMB is provided with a third portion TxPC of the first signal electrode, the first touch-control metal layer TMA is provided with a bridging portion TxB, and the bridging portion TxB is overlapped with the connecting portion RxB. Along the first direction DV, the third portion TxPC of the first signal electrode is sandwiched between two adjacent sub-electrodes SubRxPB of the second portion of the second signal electrode. One of the second portion TxPB and the first portion TxPA and of the first signal electrode is electrically connected to an adjacent third portion TxPC of the first signal electrode through the bridging portion TxB; the other one of the first portion TxPA of the first signal electrode and the second portion TxPB of the first signal electrode is electrically connected to an adjacent third portion TxPC of the first signal electrode through the transfer wiring TRW located on the first touch-control metal layer TMA or the second touch-control metal layer TMB; of course, in some cases, the connection may also be achieved through the bridging portion TxB.

Furthermore, referring to FIG. 15-1, in an auxiliary design state in which the light-transmitting region AA1 is not considered, the first portion RxPA of the second signal electrode in the heterogeneous touch-control positioning region MTSA is also divided into a plurality of sub-electrodes SubRxPA (for example, two) of the first portion of the second signal electrode in one-to-one correspondence with the plurality of sub-electrodes SubRxPB of the second portion of the of second signal electrode, and the number of the connecting portion RxB in the heterogeneous touch-control positioning region MTSA is the same as the number of the sub-electrode SubRxPB of the second portion of the second signal electrode. The sub-electrode SubRxPB of the second portion of the second signal electrode and the sub-electrode SubRxPA of the first portion of the second signal electrode are connected to each other through the corresponding connecting portion RxB. The third portion TxPC of the first signal electrode in the heterogeneous touch-control positioning region MTSA is connected to the first portion TxPA of the first signal electrode and the second portion TxPB of the first signal electrode through different bridging portions TxB. In the prepared display panel PNL, the portions of the sub-electrode SubRxPB of the second portion of the second signal electrode, the sub-electrode SuRxPA of the first portion of the second signal electrode and the connecting portion RxB that are located in the light-transmitting region AA1 are removed, so that the remaining portion of the second portion RxPB of the second signal electrode and the remaining portion of the first portion RxPA of the second signal electrode are connected to each other through at least one connecting portion RxB. Meanwhile, the portions of the first portion TxPA of the first signal electrode, the second portion TxPB of the first signal electrode, the third portion TxPC of the first signal electrode and the bridging portion TxB that are located in the light-transmitting region AA1 are also removed. When the first signal channel Tx formed by connection of the first portion TxPA of the first signal electrode, the third portion TxPC of the first signal electrode and the second portion TxPB of the first signal electrode in sequence is separated by the light-transmitting region AA1, the transfer wiring TRW is provided so that the first signal channel Tx is kept unblocked, and the sub-electrode SubRxPB of the second portion of the second signal electrode also needs to avoid the transfer wiring TRW to avoid forming a plate capacitor.

As an example, for ease of expression, the heterogeneous touch-control positioning region MTSA at the upper right corner of FIG. 15-2 is referred to as a fourth heterogeneous touch-control positioning region MTSA. In the fourth heterogeneous touch-control positioning region MTSA, the second portion RxPB of the second signal electrode includes two sub-electrodes SubRxPB of two second portions of the second signal electrodes arranged along the first direction DV, where at least one sub-electrode SubRxPB of the second portion of the second signal electrode is not affected by the light-transmitting region AA1 and is connected to the first portion RxPA of the second signal electrode through the connecting portion RxB, thus ensuring that the signal in the second signal channel Rx in fourth heterogeneous touch-control positioning region MTSA is unblocked. The other sub-electrode SubRxPA of the first portion of the second signal electrode connected to the sub-electrode SubRxPB of the second portion of the second signal electrode is separated by the light-transmitting region AA1.

Referring to FIG. 15-2, in the fourth heterogeneous touch-control positioning region (MTSA), the first signal channel Tx includes a first portion TxPA of a first signal electrode, a second portion TxPB of the first signal electrode, a third portion TxPC of the first signal electrode that are located on the second touch-control metal layer TMB, and includes a transfer wiring TRW and a bridging portion TxB, where the connecting portion RxB is overlapped with the bridging portion TxB. Along the first direction DV, the first portion TxPA of the first signal electrode is located on the side of the sub-electrode SubRxPB of the second portion of the second signal electrode away from the light-transmitting region AA1, thus there is no need to be provided with a notch for avoiding the light-transmitting region AA1. Along the first direction DV, the third portion TxPC of the first signal electrode is located between two adjacent sub-electrodes SubRxPB of the second portion of the second signal electrode, and is provided with a notch for avoiding the light-transmitting region AA1. The first portion TxPA of the first signal electrode and the third portion TxPC of the first signal electrode are connected to each other through the bridging portion TxB. The second portion TxPB of the first signal electrode is provided with a notch for avoiding the light-transmitting region AA1, and the connection between the third portion TxPC of the first signal electrode and the second portion TxPB of the first signal electrode is separated by the light-transmitting region AA1. Therefore, the second portion TxPB of the first signal electrode is connected to the third portion TxPC of the first signal electrode through the transfer wiring TRW provided along the edge of the light transmitting region AA1, and the transfer wiring TRW may be provided on the first touch-control metal layer TMA or the second touch-control metal layer TMB. Among them, a wiring gap is reserved between the light-transmitting region AA1 and the sub-electrode SubRxPB of the second portion of the second signal electrode between the third portion TxPC of the first signal electrode and the second portion TxPB of the first signal electrode, and the transfer wiring TRW is provided in the wiring gap, which can avoid excessive increase of the capacitance value of the touch-control capacitor in the fourth heterogeneous touch-control positioning region MTSA due to the fact that a plate capacitor is formed between the transfer wiring TRW and the second signal channel Rx, thus ensuring the touch-control performance under the condition that the signals in the first signal channel Tx and the second signal channel Rx are kept unblocked.

Figures 1, 16:
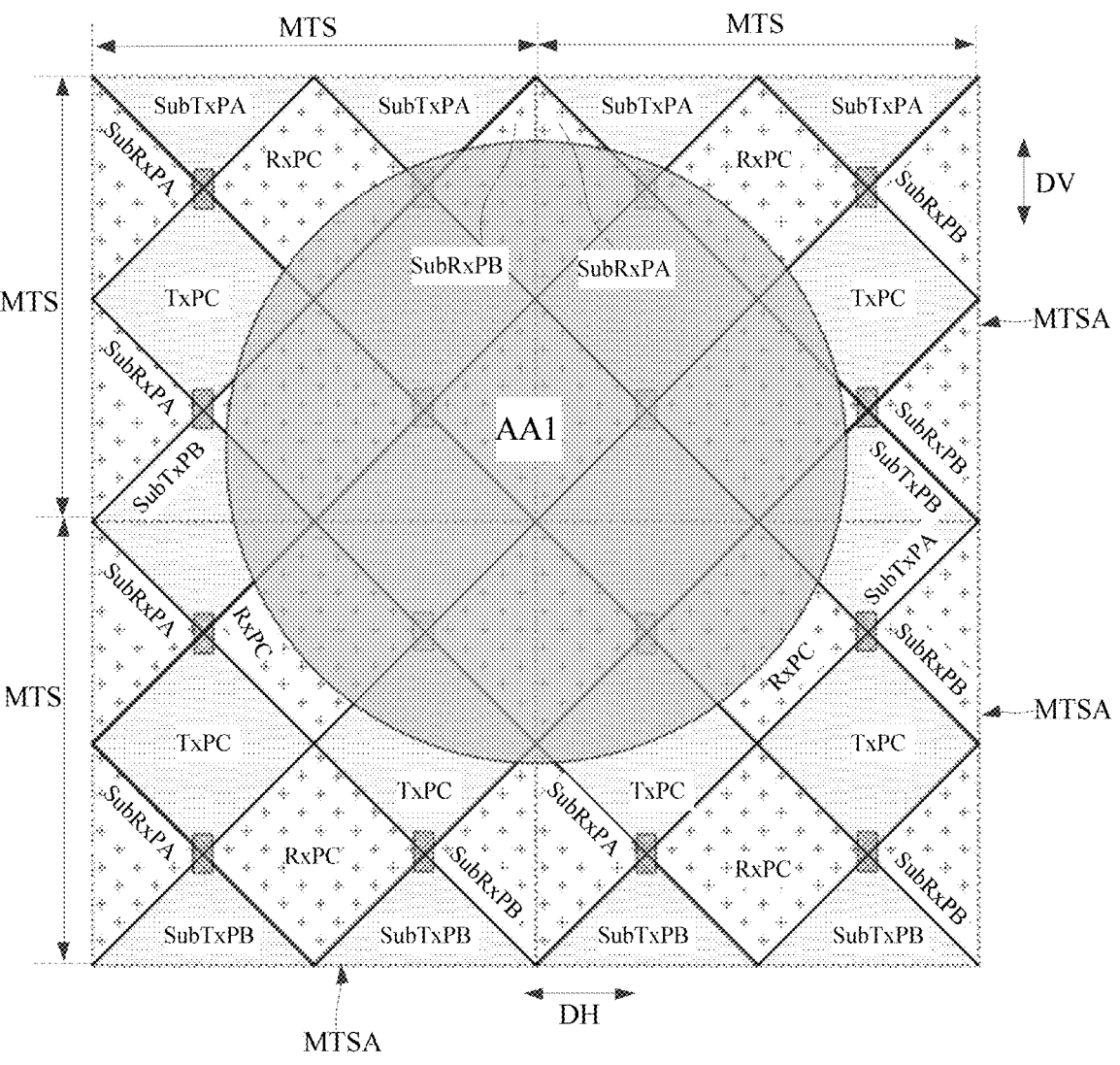
Figures 2, 16:
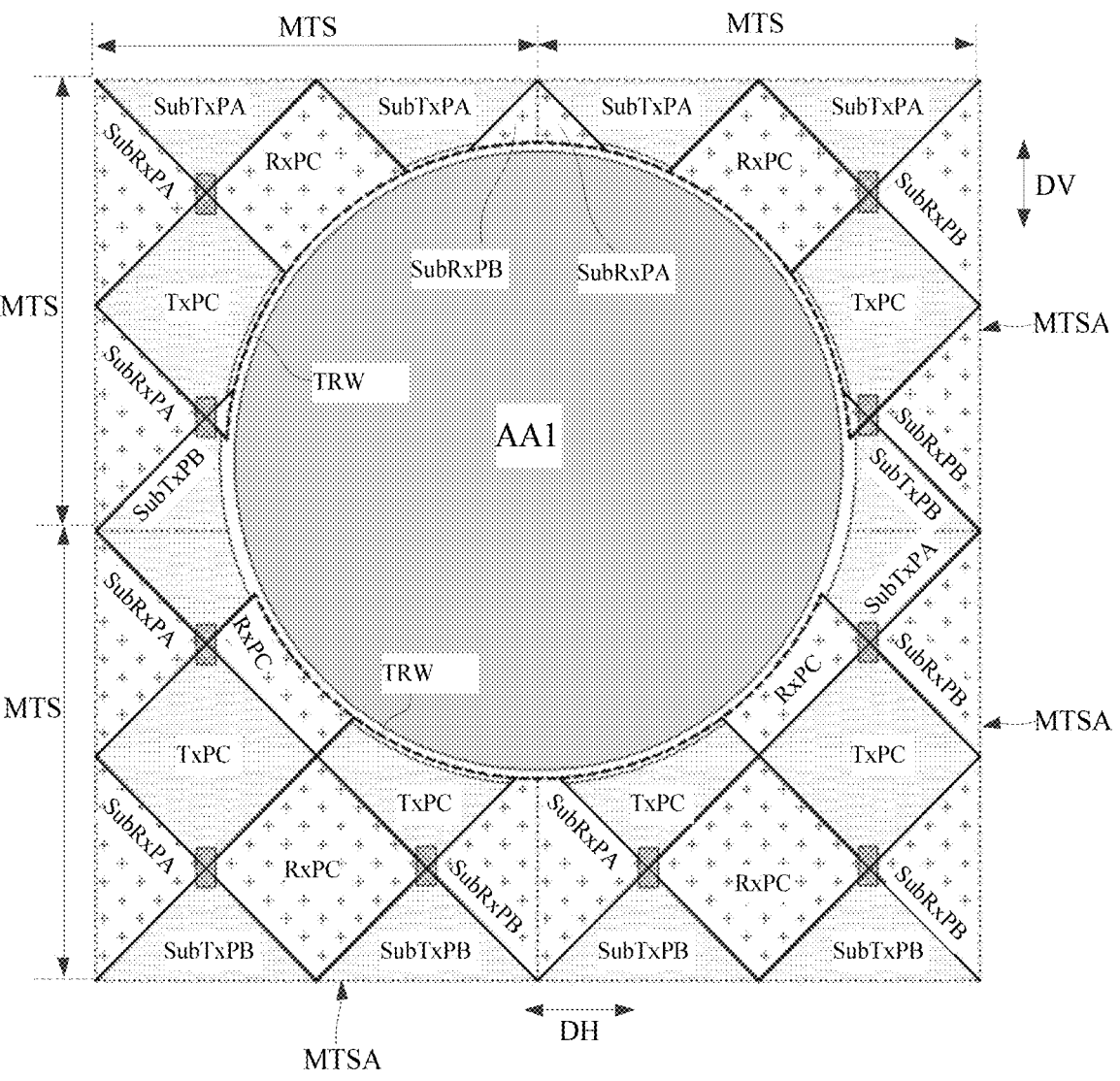

FIG. 16-1 illustrates a design principle schematic diagram of a local design in which a second signal channel Rx and a first signal channel Tx in at least one heterogeneous touch-control positioning region MTSA are both provided with a plurality of heterogeneous touch-control sub-channels SubMTS to avoid being completely separated by the light-transmitting region AA1. FIG. 16-2 illustrates a schematic diagram of a local structure in which a second signal channel Rx and a first signal channel Tx in at least one heterogeneous touch-control positioning region MTSA are both provided with a plurality of heterogeneous touch-control sub-channels SubMTS to avoid being completely separated by the light-transmitting region AA1.

Referring to FIG. 16-2, in some embodiments of the present disclosure, in at least one heterogeneous touch-control positioning region MTSA, a first portion of RxPA of a second signal electrode includes a plurality of sub-electrodes SuRxPA, or a second portion of RxPB of a second signal electrode includes a plurality of sub-electrodes SubRxPB; a first portion TxPA of the first signal electrode includes a plurality of sub-electrodes SubTxPA, or a second portion TxPB of the first signal electrode includes a plurality of sub-electrodes SubTxPB; the second touch-control metal layer TMB is provided with a third portion RxPC of a second signal electrode and a third portion TxPC of a first signal electrode, and the first touch-control metal layer TMA is provided with a plurality of bridging portions TxB. The third portion TxPC of the first signal electrode is connected to the first portion TxPA and the second portion TxPB through different bridging portions TxB; and the first portion RxPA and the second portion RxPB of the second signal electrode are connected to each other through the third portion RxPC. In other words, in the at least one heterogeneous touch-control positioning region MTSA, the first signal channel Tx includes a plurality of first signal sub-channels SubTx, where at least one first signal sub-channel SubTx includes a sub-electrode SubTxPA of the first portion of the first signal electrode, a bridging portion TxB, a third portion TxPC of the first signal electrode, a bridging portion TxB, and a sub-electrode SubTxPB of the second portion of the first signal electrode connected in sequence, thus the first signal sub-channel SubTx is kept continuous. The second signal channel Rx also includes a plurality of second signal sub-channels SubRx, where at least one second signal sub-channel SubRx includes a sub-electrode SubRxPA of a first portion of the second signal electrode, a third portion RxPc of the second signal electrode, and a sub-electrode SubRxPB of a second portion of the second signal electrode, as well as a conductive structures connected to the three sub-electrodes; any one of these conductive structures may be a connecting portion RxB provided on the second touch-control metal layer TMB, or may be a transfer wiring TRW provided on the first touch-control metal layer TMA or the second touch-control metal layer TMB, as long as the second signal sub-channel SubRx is kept in electrical communication.

Referring to FIG. 16-2, in another embodiment of the present disclosure, in at least one heterogeneous touch-control positioning region MTSA, a first portion of RxPA of a second signal electrode includes a plurality of sub-electrodes SuRxPA, or a second portion of RxPB of the second signal electrode includes a plurality of sub-electrodes SubRxPB; a first portion TxPA of a first signal electrode includes a plurality of sub-electrodes SubTxPA, or a second portion TxPB of the first signal electrode includes a plurality of sub-electrodes SubTxPB; and the second touch-control metal layer TMB is provided with a third portion RxPC of the second signal electrode, a third portion TxPC of the first signal electrode and a plurality of connecting portions RxB. The third portion RxPC of the second signal electrode is connected to the first portion RxPA and the second portion RxPB through different connecting portions RxB; and the first portion TxPA and the second portion TxPB of the first signal electrode are connected to each other through the third portion TxPC. In other words, in at least one heterogeneous touch-control positioning region MTSA, the second signal channel Rx includes a plurality of second signal sub-channels SubRx, where at least one second signal sub-channel SubRx includes a sub-electrode SubRxPA of a first portion of a second signal electrode, a connecting portion RxB, a third portion RxPC of a second signal electrode, a connecting portion RxB and a sub-electrode SubRxPB of a second portion of a second signal electrode that are connected in sequence, so that the second signal sub-channel SubRx is kept continuous. The first signal channel Tx also includes a plurality of first signal sub-channels SubTx, where at least one first signal sub-channel SubTx includes a sub-electrode SubTxPA of a first portion of a first signal electrode, a third portion TxPC of the first signal electrode, a sub-electrode SubTxPB of a second portion of the first signal electrode, and conductive structures connected to the three sub-electrodes; any one of these conductive structures may be a bring portion TxB provided on the first touch-control metal layer TMA, or may be a transfer wiring TRW provided on the first touch-control metal layer TMA or the second touch-control metal layer TMB, as long as the first signal sub-channel SubTx is kept in electrical communication.

As an example, the heterogeneous touch-control positioning region MTSA at the upper left corner in FIG. 16-1 and FIG. 16-2 is referred to as the fifth heterogeneous touch-control positioning region MTSA, and the heterogeneous touch-control positioning region MTSA at the lower left corner is referred to as the sixth heterogeneous touch-control positioning region MTSA, and the heterogeneous touch-control positioning region MTSA at the upper right corner is referred to as the seventh heterogeneous touch-control positioning region MTSA, and the heterogeneous touch-control positioning region MTSA at the lower right corner is referred to as the eighth heterogeneous touch-control positioning region MTSA. The light-transmitting region AA1 is intersected with the fifth heterogeneous touch-control positioning region MTSA, the sixth heterogeneous touch-control positioning region MTSA, the seventh heterogeneous touch-control positioning region MTSA, and the eighth heterogeneous touch-control positioning region MTSA. In an auxiliary design state in which the light-transmitting region AA1 is not considered, as shown in FIG. 16-1, each first signal channel Tx in the heterogeneous touch-control positioning region MTSA includes two first signal sub-channels SubTx, and each second signal channel Rx includes two second signal sub-channels SuRx. Specifically, in the auxiliary design state, a first portion TxPA of a first signal electrode in the heterogeneous touch-control positioning region MTSA includes sub-electrodes SubTxPA of the first portions of the first signal electrodes respectively belonging to two first signal sub-channels subTx, and a second portion TxPB of a first signal electrode includes two sub-electrodes SubTxPB of the second portions of the first signal electrodes respectively belonging to two first signal sub-channels SubTx. The heterogeneous touch-control positioning region MTSA further includes two third portions TxPC of the first signal electrodes respectively belonging to two first signal sub-channels SubTx, and includes four bridging portions TxB respectively belonging to two first signal sub-channels SubTx. Among them, any first signal sub-channel SubTx includes a sub-electrode SubTxPA of a first portion of a first signal electrode, a bridging portion TxB, a third portion TxPC of a first signal electrode, a bridging portion TxB, and a sub-electrode SubTxPB of a second portion of a first signal electrode connected in sequence. In the auxiliary design state, a first portion RxPA of a second signal electrode in the heterogeneous touch-control positioning region MTSA includes sub-electrodes SubRxPA of the first portions of the second signal electrodes respectively belonging to two second signal sub-channels SubRx, the second portion RxPB of the second signal electrode includes two sub-electrodes SubRxPB of the second portions of the second signal electrodes respectively belonging to two second signal sub-channels SubRx. The heterogeneous touch-control positioning region MTSA further includes two third portions RxPC of the second signal electrodes respectively belonging to two second signal sub-channels SubRx, and includes four connecting portions RxB respectively belonging to two second signal sub-channels SubRx. Among them, any second signal sub-channel SubRx includes a sub-electrode SubRxPA of a first portion of a second signal electrode, a connecting portion RxB, a third portion RxPC of a second signal electrode, a connecting portion RxB, and a sub-electrode SubRxPB of a second portion of a second signal electrode connected in sequence. In the display panel PNL according to the embodiments of the present disclosure, referring to FIG. 16-2, the portions of the first signal channel Tx and the second signal channel Rx located in the light-transmitting region AA1 are removed, and when necessary, the transfer wiring TRW is added to ensure that at least one second signal sub-channel SubRx and at least one first signal sub-channel SubTx in the heterogeneous touch-control positioning region MTSA are kept in electrical communication. Among them, in the heterogeneous touch-control positioning region MTSA, at least one second signal sub-channel SuRx or at least one first signal sub-channel SubTx is kept continuous instead of being transferred through the transfer wiring TRW to achieve electrical communication, thus reducing the number of the transfer wiring TRW. FIG. 16-2 shows a pattern of a first signal channel Tx and a second signal channel Rx in the fifth heterogeneous touch-control positioning region MTSA to the eighth heterogeneous touch-control positioning region MTSA of the display panel PNL in this example.

Referring to FIG. 16-2, in the fifth heterogeneous touch-control positioning region MTSA, one first signal sub-channel SubTx is kept continuous, and one second signal sub-channel SubRx is kept in electrical communication through a transfer wiring TRW. Specifically, the first signal sub-channel SubTx close to a sub-electrode SubRxPA of a first portion of a second signal electrode is kept continuous; and a third portion RxPC of a second signal electrode is connected to a sub-electrode SubRxPA of a first portion of a second signal electrode through a connecting portion RxB, and is connected to a sub-electrode SubRxPB of a second portion of a second signal electrode through a transfer wiring TRW. In the sixth heterogeneous touch-control positioning region MTSA, one first signal sub-channel SubTx is kept continuous, and one second signal sub-channel SubRx is kept continuous. In the seventh heterogeneous touch-control positioning region MTSA, one first signal sub-channel SubTx is kept continuous, and one second signal sub-channel SubRx is kept in electrical communication through a transfer wiring TRW. Specifically, the first signal sub-channel SubTx close to a sub-electrode SubRxPB of a second portion of a second signal electrode is kept continuous; a third portion RxPC of a second signal electrode is connected to a sub-electrode SubRxPA of a first portion of a second signal electrode through a transfer wiring TRW, and is connected to a sub-electrode subRxPB of a second portion of a second signal electrode through a connecting portion RxB. In the eighth heterogeneous touch-control positioning region MTSA, one first signal sub-channel SubTx is kept continuous, and one second signal sub-channel SubRx is kept continuous.

Figure 19:
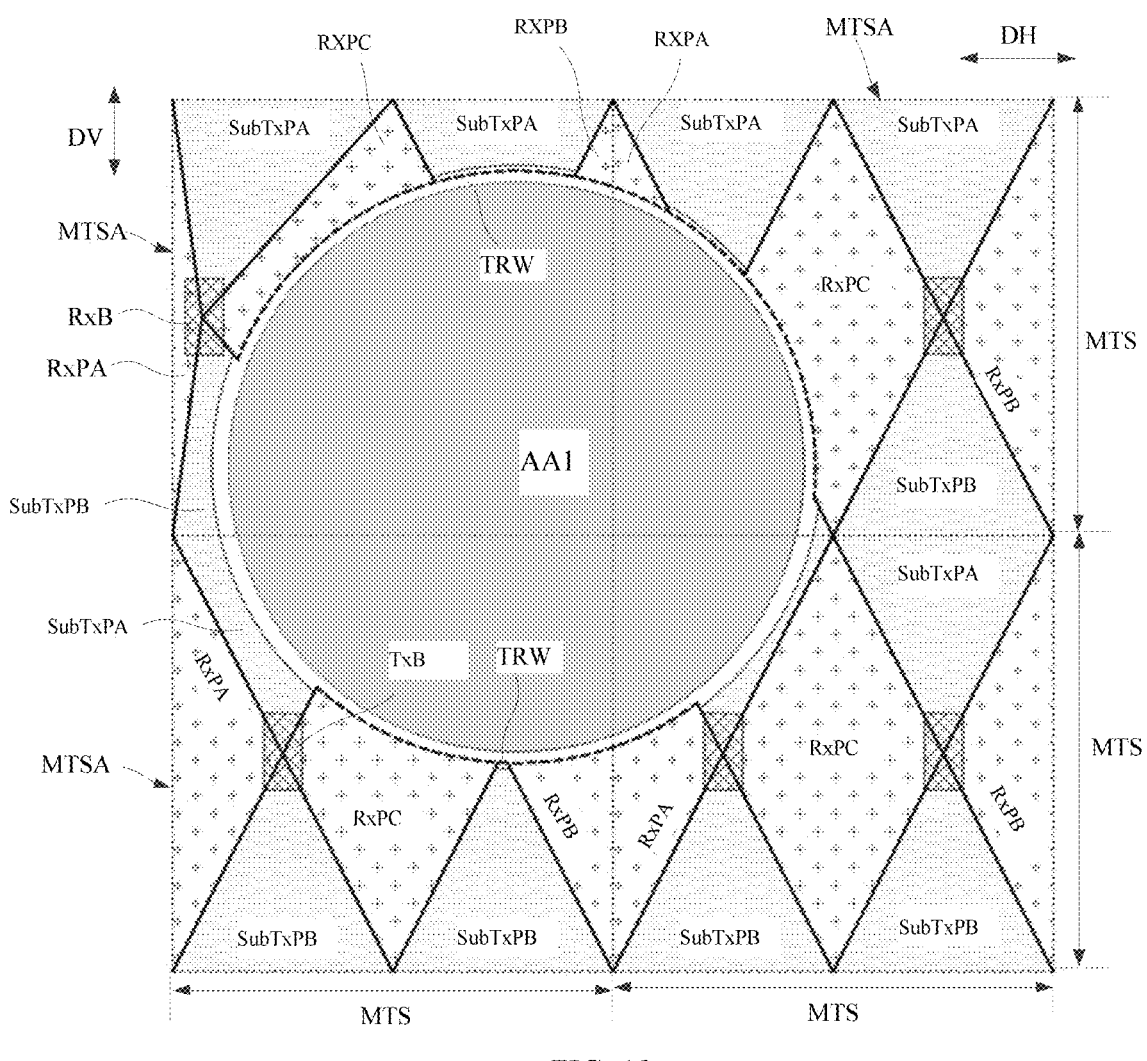
FIG. 19 is a schematic diagram of a local structure of a touch-control layer according to some embodiments of the present disclosure.
Figure 22:
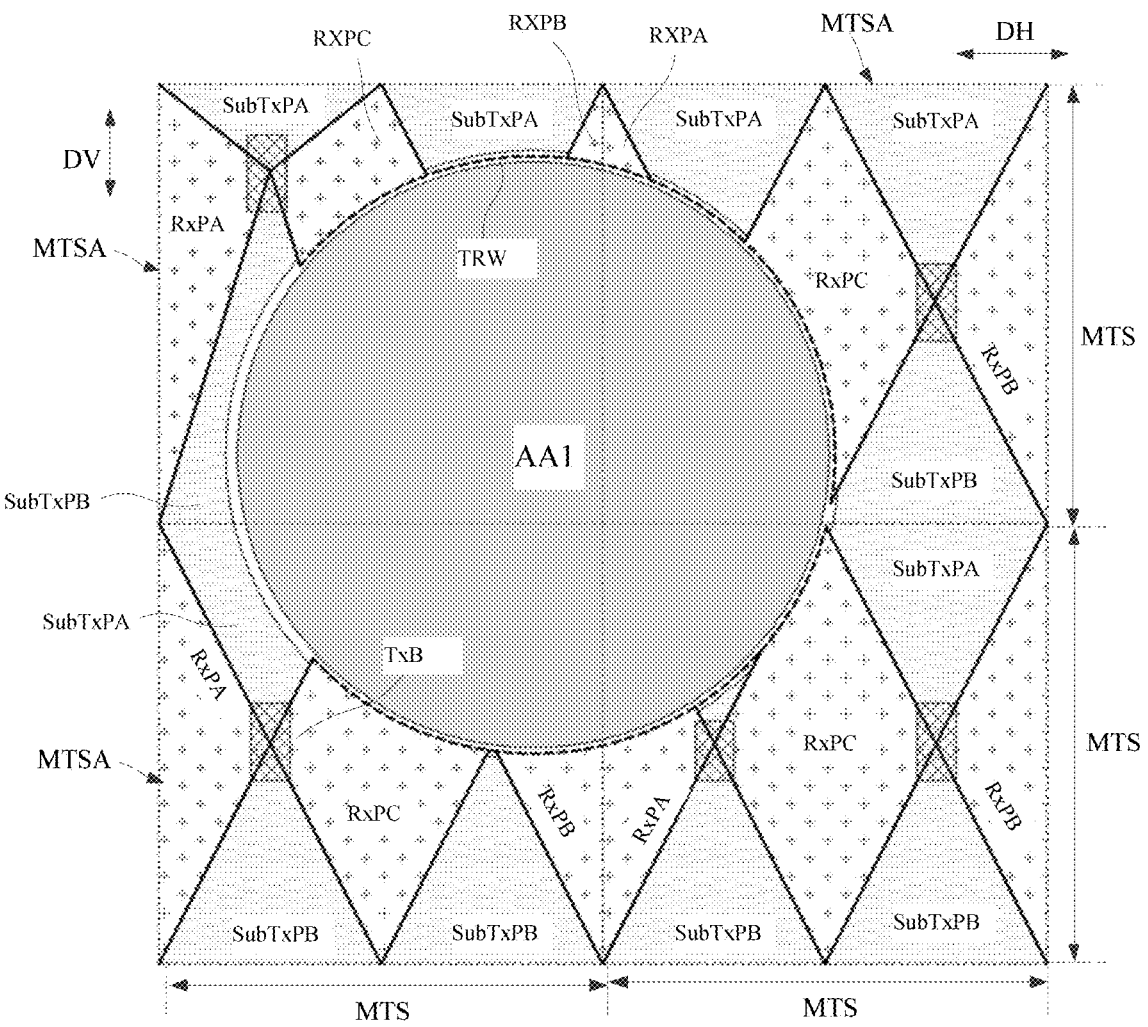
FIG. 22 is a schematic diagram of a local structure of a touch-control layer according to some embodiments of the present disclosure.

Referring to FIG. 19 and FIG. 22, in some embodiments of the present disclosure, the bridging portion TxB or the connecting portion RxB in the heterogeneous touch-control sub-channel SubMTS may also be offset to avoid the light-transmitting region AA1, so that at least one of a first signal sub-channel SubTx or a second signal sub-channel SubRx is kept continuous. In this way, at least one first signal sub-channel SubTx is provided with a plurality of bridging portions TxB, and the distribution trajectory of various bridging portions TxB (for example, a zigzag line line) is not parallel to the first direction DV; or at least one second signal sub-channel SubRX is provided with a plurality of connecting portions RxB, and the distribution trajectory of various connecting portions RxB (for example, a zigzag line line) is not parallel to the second direction DH.

Referring to FIG. 19 and FIG. 22, in some embodiments of the present disclosure, at least one first signal channel Tx is provided with at least one continuous first signal sub-channel SubTx in two heterogeneous touch-control positioning regions MTSA adjacent along the first direction DV; and the continuous first signal sub-channel SubTx includes electrodes located on the second touch-control metal layer TMB (for example, a sub-electrode SubTxPA of a first portion of the first signal electrode, a sub-electrode SubTxPB of a second portion of a first signal electrode) and bridging portions TxB connected to the electrodes and located on the first touch-control metal layer TMA. The relative position of each bridging portion TxB of the continuous first signal sub-channel SubTx in respectively located heterogeneous touch-control positioning region MTSA is different. In some embodiments of the present disclosure, the relative position of a bridging portion TxB in the heterogeneous touch-control positioning region MTSA may refer to a distance between the bridging portion TxB and each vertex or each edge of the heterogeneous touch-control positioning region MTSA. In an example, a position vector of a bridging portion TxB may be used to represent the relative position relationship of the bridging portion TxB in the heterogeneous touch-control positioning region MTSA. The position vector may include four distance parameters, and the four distance parameters respectively represent the distances between four vertexes of the heterogeneous touch-control positioning region MTSA and the center of the bridging portion TxB.

Figure 17:
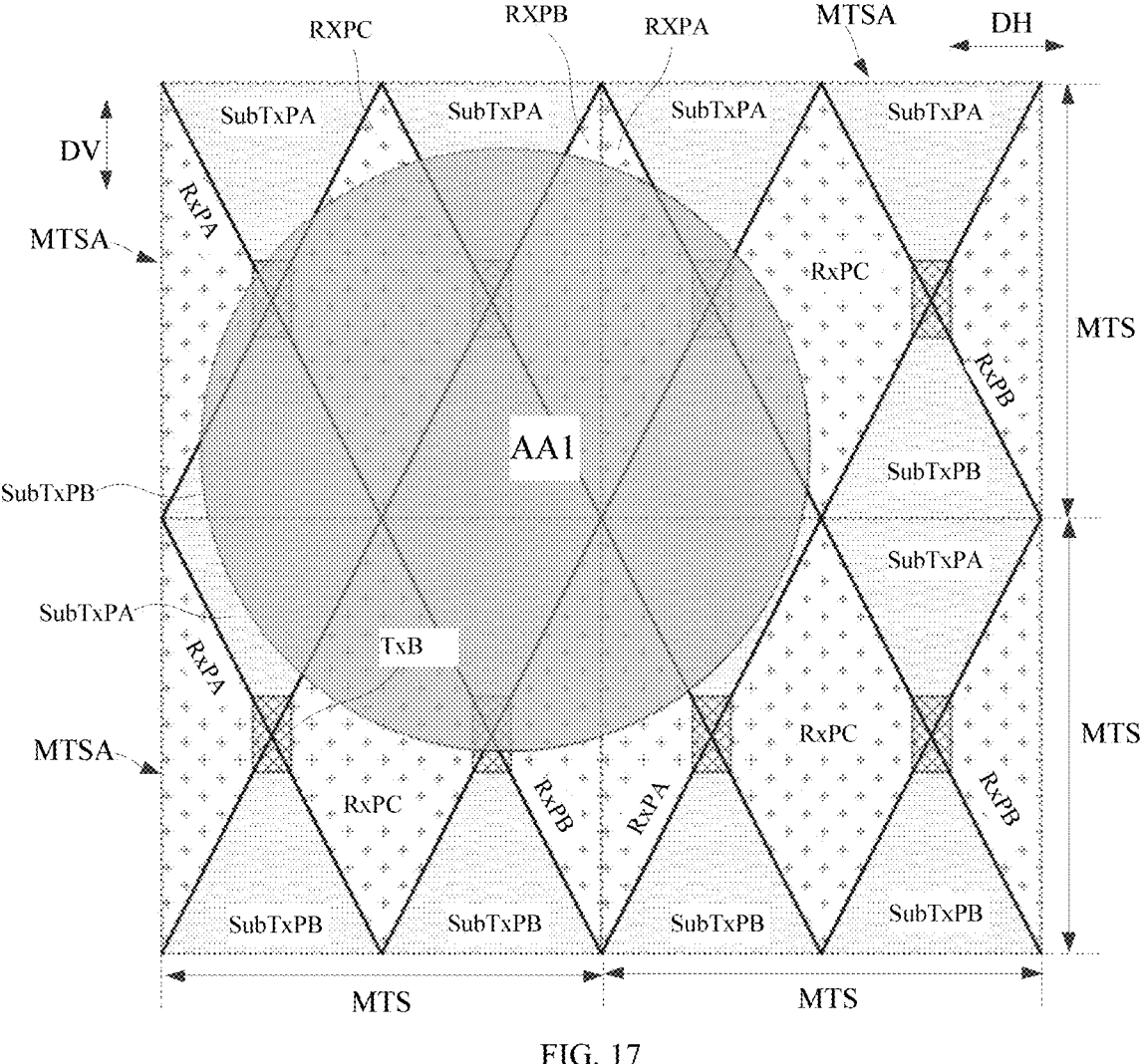
FIG. 17 is a schematic diagram that various heterogeneous touch-control sub-channels in at least one heterogeneous touch-control positioning region will be all separated by the light-transmitting region in the design stage according to some embodiments of the present disclosure.
Figure 18:
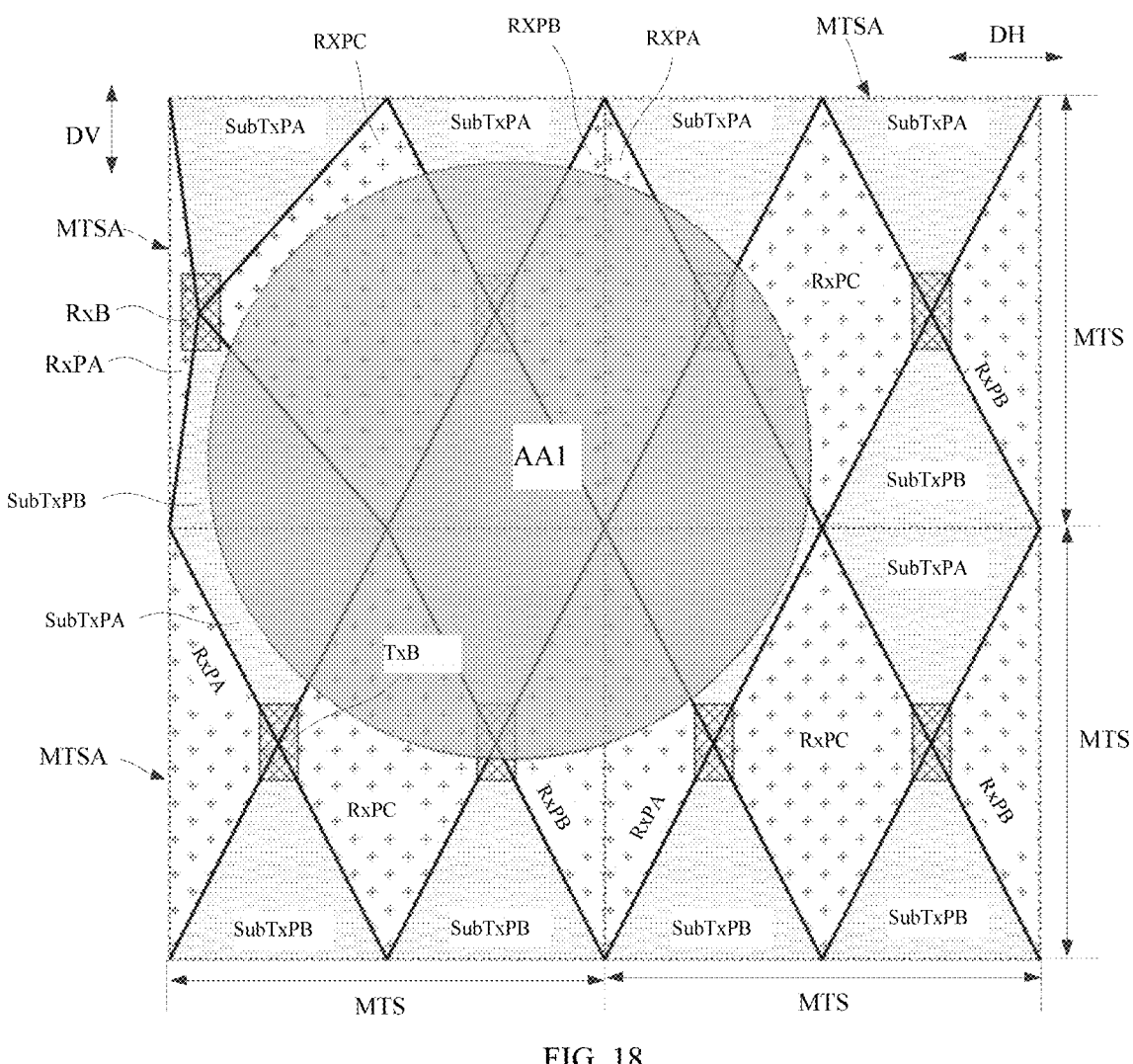
FIG. 18 is a schematic diagram of a principle of keeping at least one heterogeneous touch-control sub-channel continuous by moving a bridging portion in the design stage in at least one heterogeneous touch-control positioning region according to some embodiments of the present disclosure.
Figure 20:
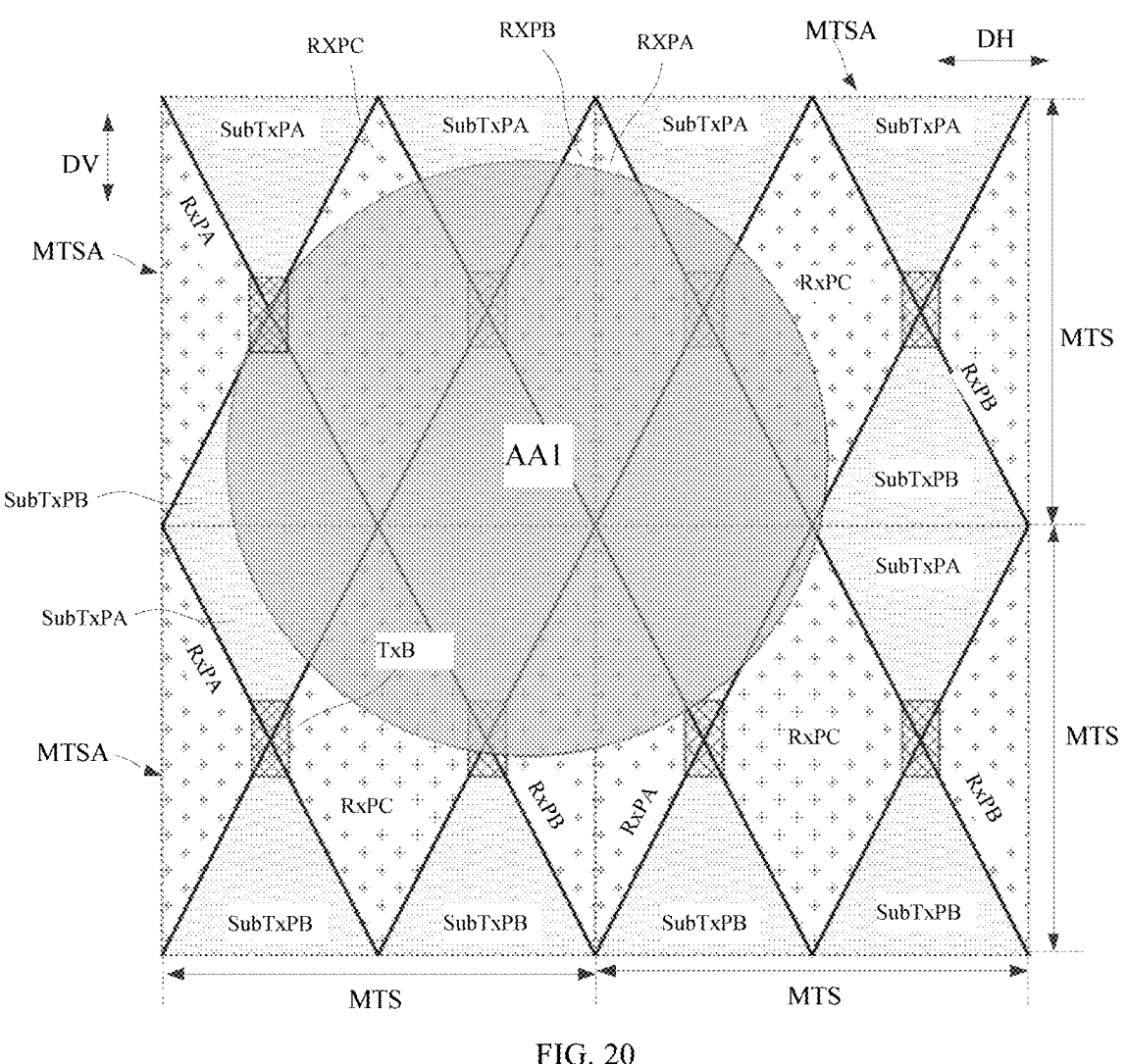
FIG. 20 is a schematic diagram that all heterogeneous touch-control sub-channels in at least one heterogeneous touch-control positioning region will be all blocked by the light-transmitting region in the design stage according to some embodiments of the present disclosure.
Figure 21:
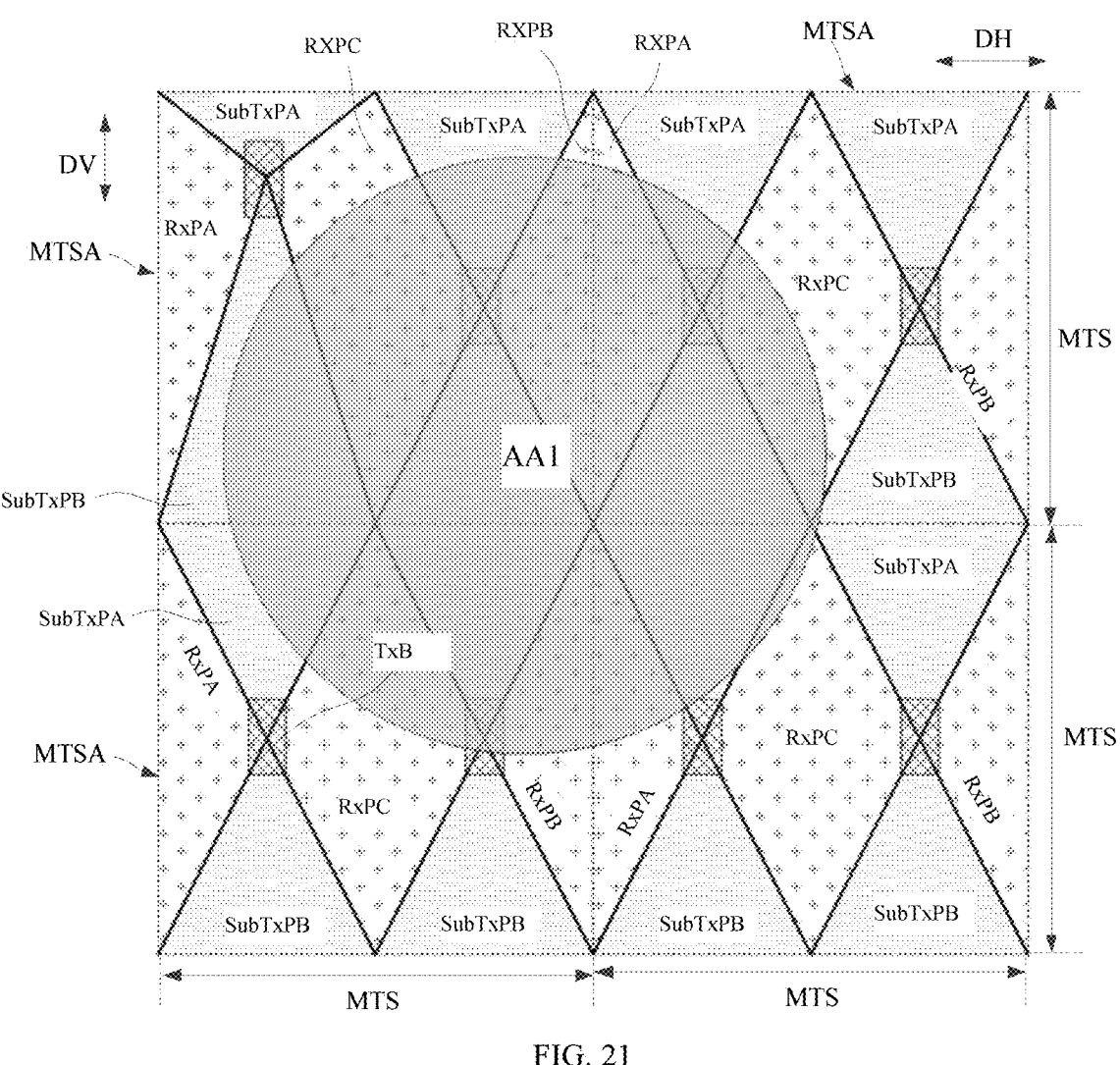
FIG. 21 is a schematic diagram of a principle of keeping at least one heterogeneous touch-control sub-channel continuous by moving a bridging portion in the design stage in at least one heterogeneous touch-control positioning region according to some embodiments of the present disclosure.

FIG. 17, FIG. 18, FIG. 20, and FIG. 21 are schematic diagrams of design principles of a local design of the embodiment of the present disclosure. In the design process of the display panel PNL according to the present embodiment, the first signal channel Tx and the second signal channel Rx in the heterogeneous touch-control positioning region MTSA may be designed without taking consideration of the light transmission region AA1 (as shown in FIG. 17 and FIG. 20), so as to determine the initial position of each bridging portion TxB; then, the factor of the light transmission region AA1 is taken into consideration, and one of the first signal sub-channels SubTx is kept continuous (as shown in FIG. 18 and FIG. 21). In this process, as shown in FIG.

18 and FIG. 21, if the first signal sub-channel SubTx expected to be kept continuous is separated by the light-transmitting region AA1, the position of the bridging portion TxB on the first signal sub-channel SubTx may be changed, and the shape of each sub-electrode of the first signal sub-channel SubTx may be adaptively changed, so that each bridging portion TxB of the first signal sub-channel SubTx is located outside the light-transmitting region AA1, thus the first signal sub-channel SubTx is kept continuous by deformation. In this way, on the basis of reducing the design difficulty of each first signal channel Tx and each second signal channel Rx, it is ensured that the first signal sub-channel SubTx is kept continuous, so that the display panel PNL has more flexibility in the design process.

In an example, referring to FIG. 18 and FIG. 19, at least one bridging portion TxB in the heterogeneous touch-control positioning region MTSA may be offset along the second direction DH. In this way, in the first signal sub-channel SubTx involved by the offset bridging portion TxB, the distribution trajectory of various bridging portions TxB is not parallel to the first direction DV. As such, in the display panel PNL of this example, referring to FIG. 19, at least one first signal channel Tx is provided with a first signal sub-channel SubTx in two heterogeneous touch-control positioning regions MTSA adjacent along the first direction DV, the first signal sub-channel SubTx is provided with at least two bridging portions TxB, and the distribution trajectory of the bridging portions TxB of the first signal sub-channel SubTx is not parallel to the first direction DV. This manner of offset may reduce effects of the first signal channel Tx on each electrode, and facilitate enabling the area of the electrode of the first signal sub-channel SubTx to be kept as large as possible.

In another example, referring to FIGS. 21 and 22, at least one bridging portion TxB in the heterogeneous touch-control positioning region MTSA may be offset along the first direction DV. In this way, in two heterogeneous touch-control positioning regions MTSA adjacent along the second direction DH, the distribution trajectory of various bridging portions TxB is not parallel to the second direction DH. Specifically, referring to FIG. 22, at least one second signal channel Rx includes a second signal sub-channel SubRx located in two heterogeneous touch-control positioning regions MTSA adjacent along the second direction DH, and the distribution trajectory of the connecting portions RxB in the second signal sub-channel SubRx (i.e., a distribution trajectory of various bridging portions TxB overlapped with the second signal sub-channel SubRx) is not parallel to the second direction DH.

Of course, in other examples of the embodiments of the present disclosure, at least one bridging portion TxB in the heterogeneous touch-control positioning region MTSA may be offset in the first direction DV and the second direction DH simultaneously.

In another embodiment of the present disclosure, the connecting portion RxB of the second signal channel Rx may also be moved to prevent each connecting portion RxB from being separated by the light transmitting region AA1. In other words, at least one second signal channel Rx includes a second signal sub-channel SubRX located in two heterogeneous touch-control positioning regions MTSA adjacent along the second direction DH; the second signal sub-channel SubRX includes connecting portions RxB located on the second touch-control metal layer TMB, and the relative position of the connecting portion RxB in the respectively located heterogeneous touch-control positioning regions MTSA is different. In an example, the distribution trajectory of various connecting portions RxB of at least one second signal sub-channel SubRx is not parallel to the second direction DH.

Figure 23:
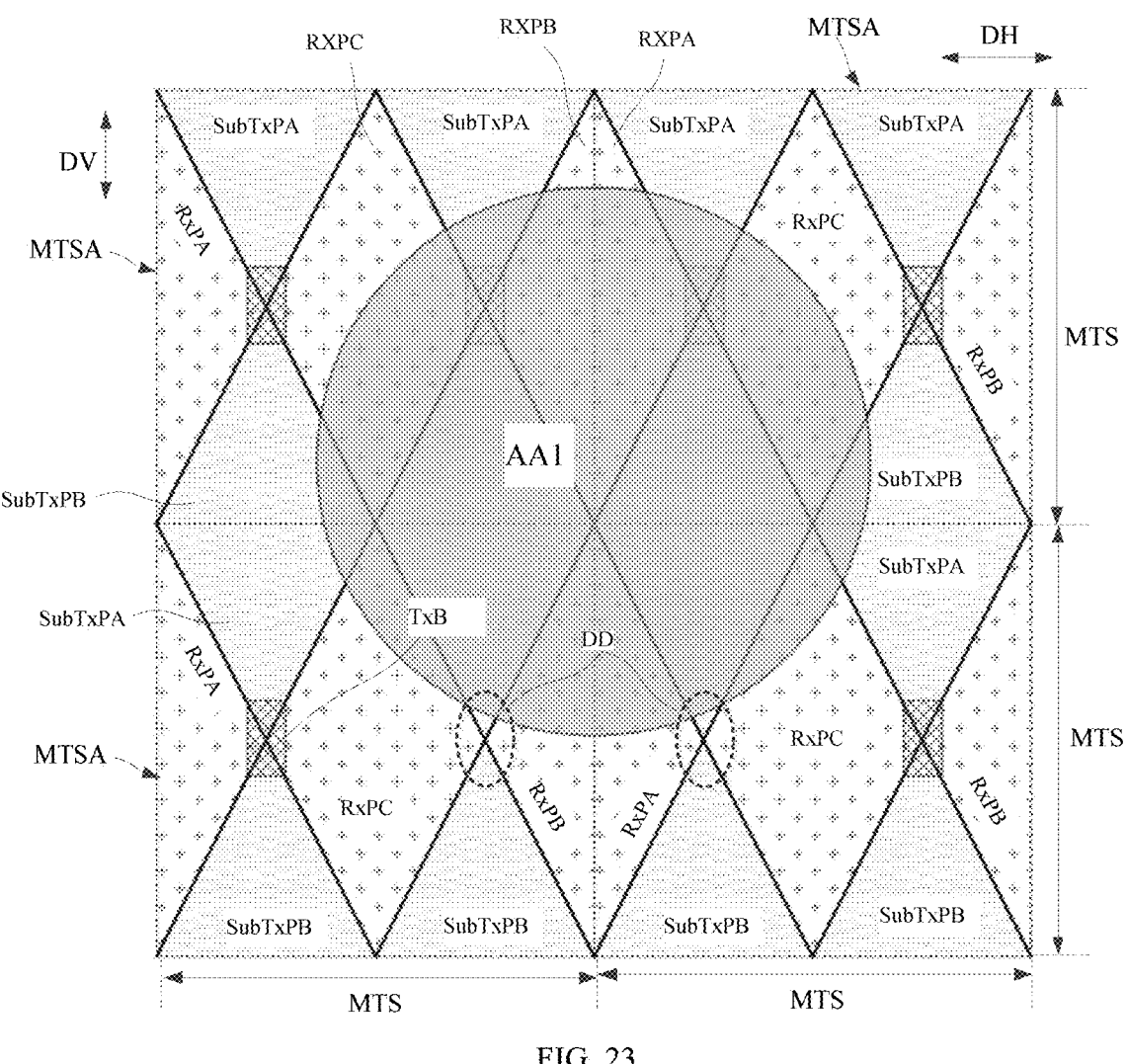
FIG. 23 is a schematic diagram of a structure of a bridging portion with an adjacent light-transmitting region being removed in a design stage according to some embodiments of the present disclosure.
Figure 24:
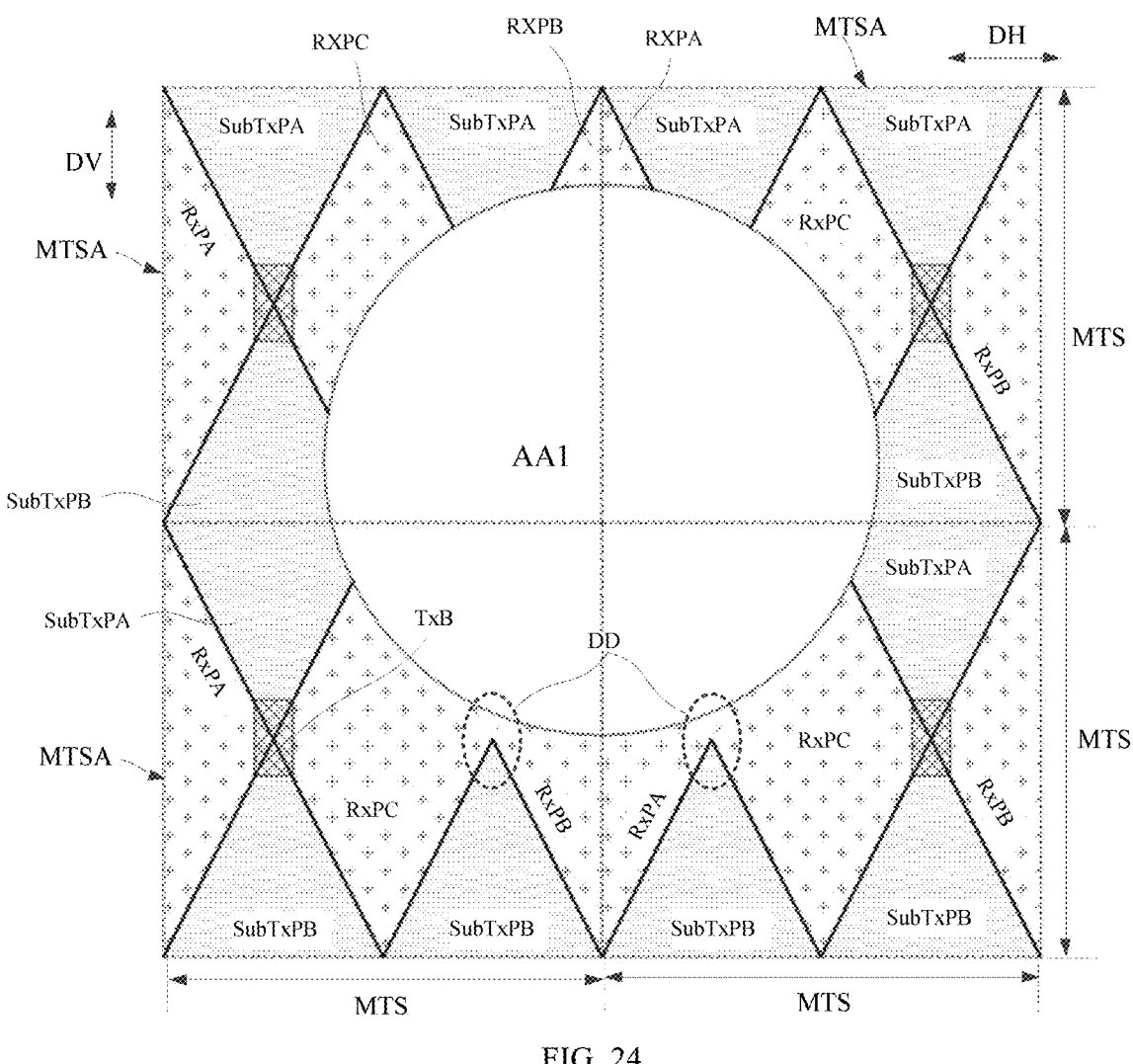
FIG. 24 is a schematic diagram of a local structure of a touch-control layer according to some embodiments of the present disclosure.
Figure 25:
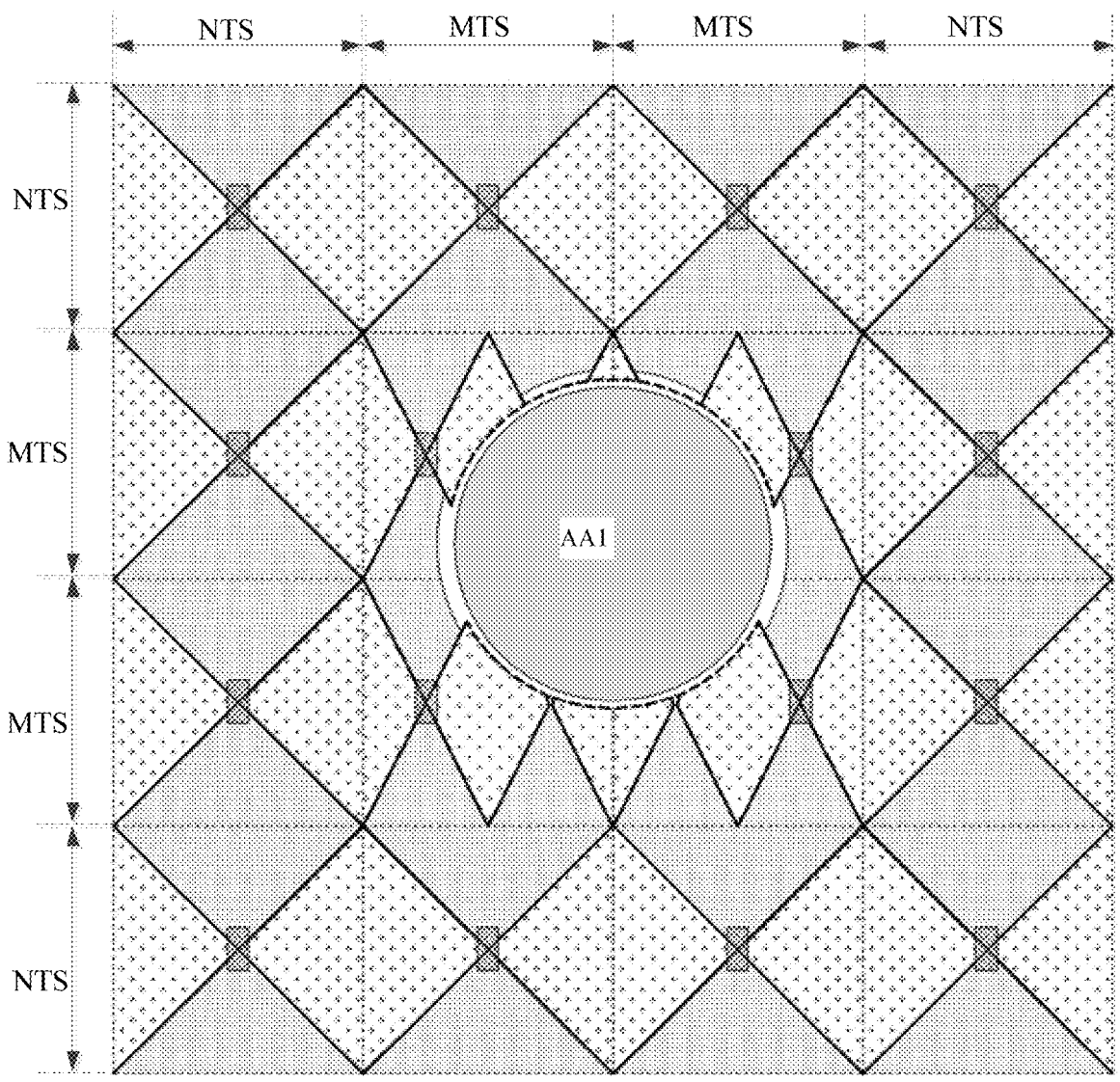
FIG. 25 is a schematic diagram of a structure that each normal touch-control positioning region is provided with no touch-control sub-channel according to some embodiments of the present disclosure.

FIG. 23 is a schematic diagram of a design principle of a local design according to some embodiments of the present disclosure. FIG. 24 is a schematic diagram of a local structure of a touch-control layer TT according to some embodiments of the present disclosure. Referring to FIG. 24, in some embodiments of the present disclosure, in at least one heterogeneous touch-control positioning region MTSA, the first signal channel Tx includes a plurality of first signal sub-channels SubTx; and along the first direction DV, there is a second signal channel Rx spaced apart between the light-transmitting region AA1 and the end portion of at least one first signal sub-channel SubTx close to the light-transmitting region AA1.

Referring to FIG. 23, in the adjacent position DD adjacent to the light-transmitting region AA1 in the heterogeneous touch-control positioning region MTSA, the bridging portion TxB cannot be reliably provided due to the fact that it is close to the light-transmitting region AA1, and then the bridging portion TxB may not be provided at the adjacent position DD. In this way, the electrodes, which originally should serve as a part of the first signal sub-channel SubTx, cannot serve as a part of the first signal sub-channel SubTx through the bridging portion TxB, and these electrodes can be connected to the second signal channel Rx and serve as a part of the second signal channel Rx. In this way, as shown in FIG. 24, this enables that there is a second signal channel Rx spaced apart between at least part of the first signal sub-channel SubTx and the light-transmitting region AA1. By this manner of setting, the electrode with too small size due to avoidance of the light-transmitting region AA1 does not need to be connected to the bridging portion TxB through a via hole, thus avoiding the process difficulty caused by providing the via hole at the position very close to the light-transmitting region AA1. Moreover, this part of electrodes is merged into the second signal channel Rx, so that the stability of the second signal channel Rx can be improved, thus ensuring that the second signal channel Rx is unblocked.

As an example, referring to FIG. 23, in an auxiliary design state in which the light-transmitting region AA1 is not considered, the first signal channel Tx in the heterogeneous touch-control positioning region MTSA includes two first signal sub-channels SubTx, where the first signal sub-channel SubTx may include a sub-electrode SubTxPA of a first portion of a first signal electrode, a bridging portion TxB, and a sub-electrode SubTxPB of a second portion of a first signal electrode connected in sequence. The second signal channel Rx in the heterogeneous touch-control positioning region MTSA includes a first portion RxPA of a second signal electrode, a connecting portion RxB, a third portion RxPC of a second signal electrode, a connecting portion RxB, and a second portion RxPB of a second signal electrode connected in sequence. Among them, the third portion RxPC of the second signal electrode is located between two first signal sub-channels SubTx. In the display panel PNL of this example, the portions of the first signal channel Tx and the second signal channel Rx of the heterogeneous touch-control positioning region MTSA intersected with the light-transmitting region AA1 is removed. In the heterogeneous touch-control positioning region MTSA shown at the lower left corner of FIG. 23, the sub-electrode SubTxPA of the first portion of the first signal electrode of the first signal sub-channel Sub Tx separated by the light-transmitting region AA1 is provided with a notch for avoiding the light-transmitting region AA1, and only a small part is reserved for itself. Theoretically, the sub-electrode Sub-TxPA of the first portion of the first signal electrode may be kept in electrical connection to the sub-electrode SubTxPB of the second portion of the first signal electrode through a bridging portion TxB, so that the end portion of the separated first signal sub-channel SubTx is close to the light-transmitting region AA1. However, when the sub-electrode SubTxPA of the first portion of the first signal electrode is connected to the bridging portion TxB, it is not convenient to set a via hole due to very close to the light-transmitting region AA1. Therefore, in the display panel PNL of the present example, a bridging portion TxB may not be provided at the sub-electrode which should originally serve as a sub-electrode SubTxPA of the first portion of the first signal electrode in the heterogeneous touch-control positioning region MTSA; and this sub-electrode may not be kept in connection to the sub-electrode SubTxPB of the second portion of the first signal electrode, but be connected to the first portion RxPA of the second signal electrode and the third portion RxPC of the second signal electrode, which are provided on the same layer as and adjacent to this sub-electrode, so as to serve as a part of the second signal channel Rx. As such, in the heterogeneous touch-control positioning region MTSA shown at the lower left corner of FIG. 24, there is a second signal channel Rx spaced apart between the light-transmitting region AA1 and the end portion of the separated first signal sub-channel SubTx close to the light-transmitting region AA1. In this way, it is not only avoided to set a via hole, but also to ensure that the second signal channel Rx is unblocked.

In some embodiments of the present disclosure, referring to FIG. 9, in the normal touch-control positioning region NTSA, the first touch-control metal layer TMA is provided with a bridging portion TxB, and the first portion TxPA and the second portion TxPB of the first signal electrode are electrically connected to each other through the bridging portion TxB. In the normal touch-control positioning region NTSA, the second touch-control metal layer TMB is provided with a connecting portion RxB, and the first portion RxPA and the second portion RxPB of the second signal electrode are electrically connected to each other through the connecting portion RxB.

In the normal touch-control positioning region NTSA, the number of the first portion TxPA of the first signal electrode, the second portion TxPB of the first signal electrode or the bridging portion TxB is one; the number of the first portion RxPA of the second signal electrode, the second portion RxPB of the second signal electrode or the connecting portion RxB is one. In other words, in the normal touch-control positioning region NTSA, the second signal channel Rx may only include one path, and the second signal channel Rx may also be only kept with one path. In the heterogeneous touch-control positioning region MTSA, the first signal sub-channel SubTx of the first signal channel Tx is re-merged in the normal touch-control positioning region NTSA, and the second signal sub-channel SubRx of the second signal channel Rx is re-merged in the normal touch-control positioning region NTSA. In other words, each heterogeneous touch-control positioning region MTSA may be provided with a touch-control sub-channel (for example, a first signal sub-channel SubTx or a second signal sub-channel SubRx) to avoid the light-transmitting region AA1, and each touch-control channel TS in each normal touch-control positioning region NTSA is not provided with a touch-control sub-channel.

In another embodiment of the present disclosure, in at least part of the normal touch-control positioning region NTSA, a touch-control channel TS may also be provided with a plurality of touch-control sub-channels. For example, each touch-control positioning region TSA covered by the at least one heterogeneous touch-control channel MTS is provided with a touch-control sub-channel.

Figure 26:
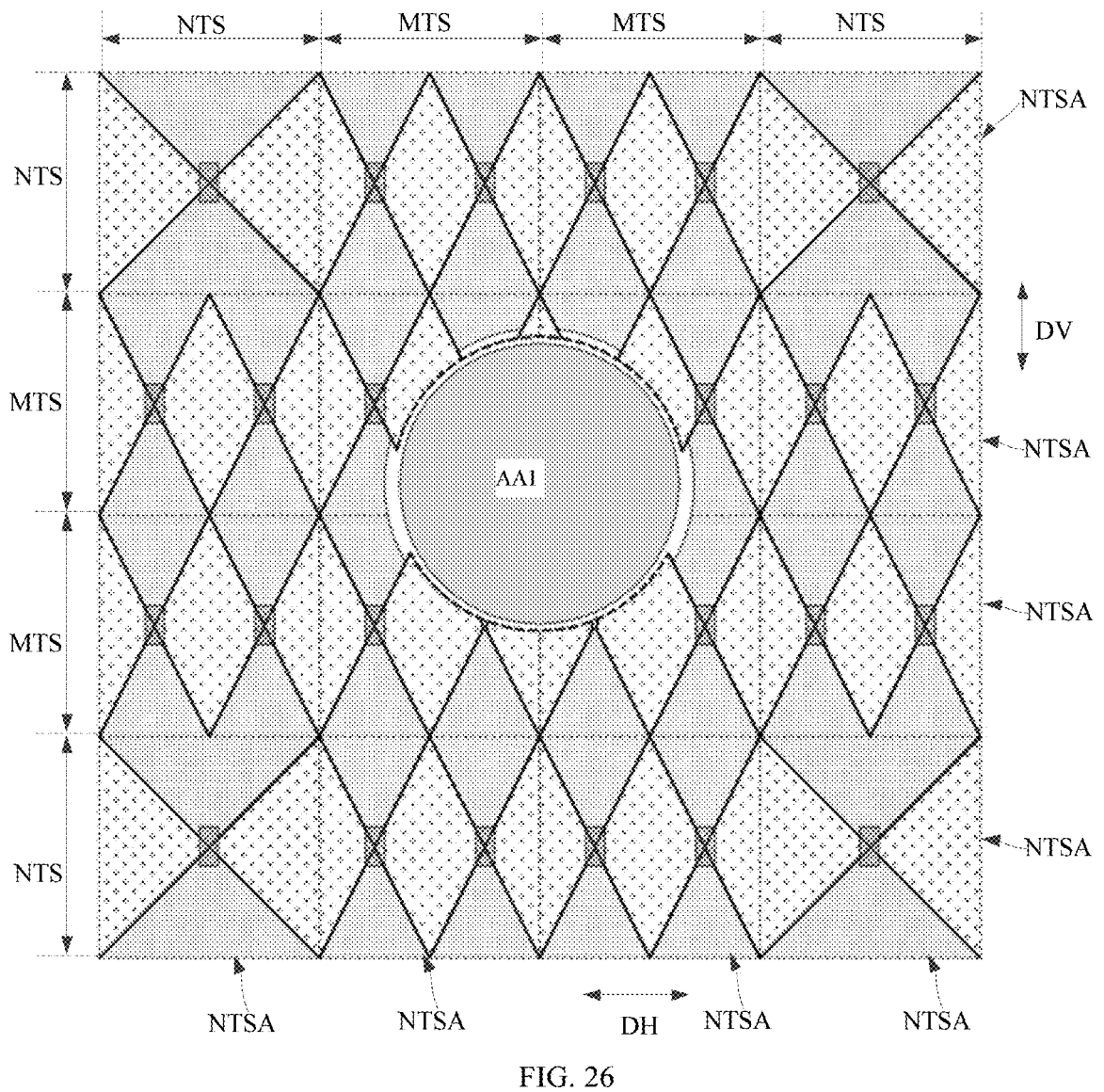
FIG. 26 is a schematic diagram of a structure that at least part of the normal touch-control positioning region is provided with a touch-control sub-channel according to some embodiments of the present disclosure.

In an example, referring to FIG. 26, in at least part of the normal touch-control positioning region NTSA, the number of the bridging portion TxB is more than one, the first portion TxPA of the first signal electrode includes sub-electrodes SubTxPA in one-to-one correspondence with more than one bridging portion TxB, and the second portion TxPB of the first signal electrode includes sub-electrodes SubTxPB in one-to-one correspondence with more than one bridging portion TxB. The bridging portion TxB is electrically connected to the corresponding sub-electrode Sub-TxPA of the first portion of the first signal electrode and the corresponding sub-electrode SubTxPB of the second portion of the first signal electrode. In at least part of the normal touch-control positioning region NTSA, the second touch-control metal layer TMB further includes a third portion RxPC of the second signal electrode; along the second direction DH, the third portion RxPC of the second signal electrode is located between adjacent sub-electrodes Sub-TxPA of the first portion of the first signal electrode, and the third portion RxPC of the second signal electrode is connected to the first portion RxPA of the second signal electrode and the second portion RxPB of the second signal electrode through different connecting portions RxB. In other words, in at least part of the normal touch-control positioning region NTSA, the first signal channel Tx may be provided with a plurality of first signal sub-channels SubTx, and the second signal channel Rx is kept with one channel. Furthermore, in each normal touch-control positioning region NTSA, each first signal channel Tx is provided with a plurality of first signal sub-channels SubTx, and each first signal sub-channel SubTx includes a sub-electrode Sub-TxPA of the first portion of the first signal electrode, a bridging portion TxB, and a sub-electrode SubTxPB of the second portion of the first signal electrode connected in sequence.

In another example, in at least part of the normal touch-control positioning region NTSA, the number of the connecting portion RxB is more than one, a first portion RxPA of a second signal electrode includes sub-electrodes SuRxPA in one-to-one correspondence with more than one connecting portion RxB, and a second portion RxPB of the second signal electrode includes sub-electrodes SubRxPB in one-to-one correspondence with more than one connecting portion RxB. The connecting portion RxB is electrically connected to the corresponding sub-electrode SubRxPA of the first portion of the second signal electrode and the corresponding sub-electrode SubRxPB of the second portion of the second signal electrode. In at least part of the normal touch-control positioning region NTSA, the second touch-control metal layer TMB further includes a third portion TxPC of a first signal electrode; along the first direction DV, the third portion TxPC of the first signal electrode is located between adjacent sub-electrodes SubRxPA of the first portion of the second signal electrode, and the third portion TxPC of the first signal electrode is connected to the first portion TxPA of the first signal electrode and the second portion TxPB of the first signal electrode through different bridging portions TxB. In other words, in at least part of the normal touch-control positioning region NTSA, the second signal channel Rx may be provided with a plurality of second signal sub-channels SubRx, and the first signal channel Tx is kept with one channel. Furthermore, in each normal touch-control positioning region NTSA, each second signal channel is provided with a plurality of second signal sub-channels SubRx, and each second signal sub-channel SubRx includes a sub-electrode SubRxPA of a first portion of a second signal electrode, a connecting portion RxB, and a sub-electrode SubRxPB of a second portion of a second signal electrode connected in sequence.

According to the embodiments of the present disclosure, there is further provided a display apparatus including any one of the display panels described in the foregoing embodiments of the display panel. The display apparatus may be a smart phone screen, a smart watch screen, or other types of display apparatuses. Since the display apparatus has any one of the display panels described in the foregoing embodiment of the display panel, the display apparatus has the same beneficial effects, and details are not described here again.

Other embodiments of the present disclosure will be apparent to those skilled in the art from consideration of the specification and practice of the present disclosure. The present application is intended to cover any variations, uses, or adaptations of the present disclosure following the general principles of the present disclosure and including common general knowledge or conventional technical means in the art not disclosed in the present disclosure. It is intended that the specification and embodiments be considered as examples only, with a true scope and spirit of the disclosure being indicated by the appended claims.

What is claimed is:

1. A display panel, comprising a base substrate, a display layer, and a touch-control layer that are sequentially stacked; wherein a display region of the display panel is provided with a light-transmitting region;

the touch-control layer is provided with a touch-control channel, the touch-control channel comprises a first signal channel extending along a first direction and a second signal channel extending along second direction, and the second direction is intersected with the first direction;

wherein the touch-control layer comprises a first touch-control metal layer, a touch-control insulating layer and a second touch-control metal layer that are sequentially stacked on a side of the display layer away from the base substrate;

the first signal channel is provided with a plurality of first signal electrodes sequentially arranged along the first direction on the second touch-control metal layer; and two adjacent first signal electrodes are electrically connected to each other through a conductive structure located on the first touch-control metal layer or the second touch-control metal layer; and the second signal channel is provided with a plurality of second signal electrodes sequentially arranged along the second direction on the second touch-control metal layer; and two adjacent second signal electrodes are electrically connected to each other through a conductive structure located on the first touch-control metal layer or the second touch-control metal layer;

wherein various first signal channels and various second signal channels define more than one touch-control positioning region distributed in an array; a mutual capacitive capacitor is formed between the first signal channel and the second signal channel passing though the touch-control positioning region; and in a same touch-control positioning region, the display panel comprises a first portion of a first signal electrode and a second portion of a first signal electrode respectively belonging to two adjacent first signal electrodes, and a first portion of a second signal electrode and a second portion of a second signal electrode respectively belonging to two adjacent second signal electrodes; the first portion of the first signal electrode and the second portion of the first signal electrode are electrically connected to each other, and the first portion of the second signal electrode and the second portion of the second signal electrode are electrically connected to each other;

wherein the touch-control positioning region intersected with the light-transmitting region is a heterogeneous touch-control positioning region;

in at least one heterogeneous touch-control positioning region, the first touch-control metal layer is provided with a bridging portion, the first portion of the first signal electrode comprises at least two sub-electrodes, and at least one sub-electrode of the first portion of the first signal electrode is electrically connected to the second portion of the first signal electrode through the bridging portion;

wherein in at least one heterogeneous touch-control positioning region, the second touch-control metal layer is provided with a connecting portion and a third portion of a second signal electrode; along the second direction, the third portion of the second signal electrode is sandwiched between two adjacent sub-electrodes of the first portion of the first signal electrode or between two adjacent sub-electrodes of the second portion of the first signal electrode; and one of the first portion of the second signal electrode and the second portion of the second signal electrode is electrically connected to an adjacent third portion of the second signal electrode through the connecting portion; the other one of the first portion of the second signal electrode and the second portion of the second signal electrode is electrically connected to an adjacent third portion of the second signal electrode through a conductive structure located on the first touch-control metal layer or the second touch-control metal layer.

2. The display panel according to claim 1, wherein in at least one heterogeneous touch-control positioning region, the first touch-control metal layer is provided with a bridging portion, the second portion of the first signal electrode comprises at least two sub-electrodes, and at least one sub-electrode of the second portion of the first signal electrode is electrically connected to the first portion of the first signal electrode through the bridging portion.

3. The display panel according to claim 1, wherein in at least one heterogeneous touch-control positioning region, the second touch-control metal layer is provided with a connecting portion, the first portion of the second signal electrode comprises at least two sub-electrodes, and at least one sub-electrode of the first portion of the second signal electrode is electrically connected to the second portion of the second signal electrode through the connecting portion; and in at least one heterogeneous touch-control positioning region, the second touch-control metal layer is provided with a connecting portion, the second portion of the second signal electrode comprises at least two sub-electrodes, and at least one sub-electrode of the second portion of the second signal electrode is electrically connected to the first portion of the second signal electrode through the connecting portion.

4. The display panel according to claim 3, wherein in at least one heterogeneous touch-control positioning region, the second touch-control metal layer is further provided with a third portion of a first signal electrode, and the first touch-control metal layer is provided with a bridging portion; along the first direction, the third portion of the first signal electrode is sandwiched between two adjacent sub-electrodes of the first portion of the second signal electrode or between two adjacent sub-electrodes of the second portion of the second signal electrode; and one of the second portion and the first portion of the first signal electrode is electrically connected to an adjacent third portion of the first signal electrode through the bridging portion; the other one of the second portion and the first portion of the first signal electrode is electrically connected to an adjacent third portion of the second signal electrode through a conductive structure located on the first touch-control metal layer or the second touch-control metal layer.

5. The display panel according to claim 1, wherein in at least one heterogeneous touch-control positioning region, the first portion of the second signal electrode comprises a plurality of sub-electrodes, or the second portion of the second signal electrode comprises a plurality of sub-electrodes; the first portion of the first signal electrode comprises a plurality of sub-electrodes, or the second portion of the first signal electrode comprises a plurality of sub-electrodes; the second touch-control metal layer is provided with a third portion of a second signal electrode and a third portion of a first signal electrode, and the first touch-control metal layer is provided with a plurality of bridging portions; and the third portion of the first signal electrode is connected to the first portion of the first signal electrode and the second portion of the first signal electrode through different bridging portions; and the second portion of the second signal electrode and the first portion of the second signal electrode are connected to each other through the third portion of the second signal electrode.

6. The display panel according to claim 1, wherein in at least one heterogeneous touch-control positioning region, the first portion of the second signal electrode comprises a plurality of sub-electrodes, or the second portion of the second signal electrode comprises a plurality of sub-electrodes; the first portion of the first signal electrode comprises a plurality of sub-electrodes, or the second portion of the first signal electrode comprises a plurality of sub-electrodes; and the second touch-control metal layer is provided with a third portion of a second signal electrode, a third portion of a first signal electrode and a plurality of connecting portions; and the third portion of the second signal electrode is connected to the first portion of the second signal electrode and the second portion of the second signal electrode through different connecting portions; and the first portion of the first signal electrode and the second portion of the first signal electrode are connected to each other through the third portion of the first signal electrode.

7. The display panel according to claim 1, wherein at least one first signal channel comprises a first signal sub-channel located in two heterogeneous touch-control positioning regions adjacent along the first direction; the first signal sub-channel comprises a bridging portion located on the first touch-control metal layer, and a relative position of the bridging portion in respectively located heterogeneous touch-control positioning region is different.

8. The display panel according to claim 7, wherein a distribution trajectory of various bridging portions of at least one first signal sub-channel is not parallel to the first direction.

9. The display panel according to claim 1, wherein at least one second signal channel comprises a second signal sub-channel located in two heterogeneous touch-control positioning regions adjacent along the second direction; and the second signal sub-channel comprises a connecting portion located on the second touch-control metal layer, and a relative position of the connecting portion in respectively located heterogeneous touch-control positioning region is different.

10. The display panel according to claim 9, wherein a distribution trajectory of various connecting portions of at least one second signal sub-channel is not parallel to the second direction.

11. The display panel according to claim 1, wherein in at least one heterogeneous touch-control positioning region, the first signal channel comprises a plurality of first signal sub-channels; and along the first direction, there is a second signal channel spaced apart between the light-transmitting region and an end portion of at least one of the first signal sub-channels close to the light-transmitting region.

12. The display panel according to claim 1, wherein the touch-control positioning region not intersected with the light-transmitting region is a normal touch-control positioning region;

in the normal touch-control positioning region, the first touch-control metal layer is provided with a bridging portion, and the first portion of the first signal electrode and the second portion of the first signal electrode are electrically connected to each other through the bridging portion; and in the normal touch-control positioning region, the second touch-control metal layer is provided with a connecting portion, and the first portion of the second signal electrode and the second portion of the second signal electrode are electrically connected to each other through the connecting portion.

13. The display panel according to claim 12, wherein in the normal touch-control positioning region, a number of the first portion of the first signal electrode, a number of the second portion of the first signal electrode, and a number of the bridging portions are one; and a number of the first portion of the second signal electrode, a number of the second portion of the second signal electrode, and a number of the connecting portion are one.

14. The display panel according to claim 12, wherein in at least part of the normal touch-control positioning region, a number of the bridging portion is more than one, the first portion of the first signal electrode comprises sub-electrodes in one-to-one correspondence with more than one bridging portion, and the second portion of the first signal electrode comprises sub-electrodes in one-to-one correspondence with more than one bridging portion; and the bridging portion is electrically connected to a corresponding sub-electrode of the first portion of the first signal electrode and a corresponding sub-electrode of the second portion of the first signal electrode; and in at least part of the normal touch-control positioning region, the second touch-control metal layer further comprises a third portion of a second signal electrode;

and along the second direction, the third portion of the second signal electrode is located between adjacent sub-electrodes of the first portion of the first signal electrode, the third portion of the second signal electrode is connected to the first portion of the second signal electrode and the second portion of the second signal electrode through different connecting portions.

15. The display panel according to claim 12, wherein in at least part of the normal touch-control positioning region, a number of the connecting portion is more than one, the first portion of the second signal electrode comprises sub-electrodes in one-to-one correspondence with more than one connecting portion, and the second portion of the second signal electrode comprises sub-electrodes in one-to-one correspondence with more than one connecting portion; the connecting portion is electrically connected to a corresponding sub-electrode of the first portion of the second signal electrode and a corresponding sub-electrode of the second portion of the second signal electrode; and in at least part of the normal touch-control positioning region, the second touch-control metal layer further comprises a third portion of a first signal electrode; along the second direction, the third portion of the first signal electrode is located between adjacent sub-electrodes of the first portion of the second signal electrode, and the third portion of the first signal electrode is connected to the first portion of the first signal electrode and the second portion of the first signal electrode through different bridging portions.

16. The display panel according to claim 1, wherein the light-transmitting region is intersected with four touch-control positioning regions, and the four touch-control positioning regions are distributed in two rows and two columns.

17. A display apparatus, comprising a display panel, wherein the display panel comprises a base substrate, a display layer, and a touch-control layer that are sequentially stacked; and a display region of the display panel is provided with a light-transmitting region;

the touch-control layer is provided with a touch-control channel, the touch-control channel comprises a first signal channel extending along a first direction and a second signal channel extending along second direction, and the second direction is intersected with the first direction;

wherein the touch-control layer comprises a first touch-control metal layer, a touch-control insulating layer and a second touch-control metal layer that are sequentially stacked on a side of the display layer away from the base substrate;

the first signal channel is provided with a plurality of first signal electrodes sequentially arranged along the first direction on the second touch-control metal layer; and two adjacent first signal electrodes are electrically connected to each other through a conductive structure located on the first touch-control metal layer or the second touch-control metal layer; and the second signal channel is provided with a plurality of second signal electrodes sequentially arranged along the second direction on the second touch-control metal layer; and two adjacent second signal electrodes are electrically connected to each other through a conductive structure located on the first touch-control metal layer or the second touch-control metal layer;

wherein various first signal channels and various second signal channels define more than one touch-control positioning region distributed in an array; a mutual capacitive capacitor is formed between the first signal channel and the second signal channel passing though the touch-control positioning region; and in a same touch-control positioning region, the display panel comprises a first portion of a first signal electrode and a second portion of a first signal electrode respectively belonging to two adjacent first signal electrodes, and a first portion of a second signal electrode and a second portion of a second signal electrode respectively belonging to two adjacent second signal electrodes; the first portion of the first signal electrode and the second portion of the first signal electrode are electrically connected to each other, and the first portion of the second signal electrode and the second portion of the second signal electrode are electrically connected to each other;

wherein the touch-control positioning region intersected with the light-transmitting region is a heterogeneous touch-control positioning region;

in at least one heterogeneous touch-control positioning region, the first touch-control metal layer is provided with a bridging portion, the first portion of the first signal electrode comprises at least two sub-electrodes, and at least one sub-electrode of the first portion of the first signal electrode is electrically connected to the second portion of the first signal electrode through the bridging portion;

wherein in at least one heterogeneous touch-control positioning region, the second touch-control metal layer is provided with a connecting portion and a third portion of a second signal electrode; along the second direction, the third portion of the second signal electrode is sandwiched between two adjacent sub-electrodes of the first portion of the first signal electrode or between two adjacent sub-electrodes of the second portion of the first signal electrode; and one of the first portion of the second signal electrode and the second portion of the second signal electrode is electrically connected to an adjacent third portion of the second signal electrode through the connecting portion; the other one of the first portion of the second signal electrode and the second portion of the second signal electrode is electrically connected to an adjacent third portion of the second signal electrode through a conductive structure located on the first touch-control metal layer or the second touch-control metal layer.

* * * * *